(12) United States Patent
Shoeb et al.

(10) Patent No.: US 11,049,693 B2
(45) Date of Patent: Jun. 29, 2021

(54) SYSTEMS AND METHODS FOR ACHIEVING PEAK ION ENERGY ENHANCEMENT WITH A LOW ANGULAR SPREAD

(71) Applicant: Lam Research Corporation, Fremont, CA (US)

(72) Inventors: Juline Shoeb, Fremont, CA (US); Ying Wu, Livermore, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/533,150

(22) Filed: Aug. 6, 2019

(65) Prior Publication Data
US 2019/0362942 A1    Nov. 28, 2019

Related U.S. Application Data

(63) Continuation of application No. 15/693,134, filed on Aug. 31, 2017, now Pat. No. 10,395,894.

(51) Int. Cl.
| | |
|---|---|
| *H01L 21/3065* | (2006.01) |
| *H01J 37/32* | (2006.01) |
| *H01L 21/683* | (2006.01) |
| *H01L 21/67* | (2006.01) |

(52) U.S. Cl.
CPC ...... *H01J 37/32146* (2013.01); *H01J 37/321* (2013.01); *H01J 37/32183* (2013.01); *H01J 37/32568* (2013.01); *H01L 21/6833* (2013.01); *H01J 2237/334* (2013.01); *H01L 21/3065* (2013.01); *H01L 21/67069* (2013.01)

(58) Field of Classification Search
CPC .............. H01J 37/32146; H01J 37/321; H01J 37/32183; H01J 37/32568; H01J 2237/334; H01L 21/6833; H01L 21/3065; H01L 21/67069
See application file for complete search history.

(56) References Cited

U.S. PATENT DOCUMENTS

| | | | |
|---|---|---|---|
| 2008/0128087 A1* | 6/2008 | Hayano | H05H 1/46 156/345.28 |
| 2011/0031216 A1* | 2/2011 | Liao | H01J 37/32165 216/67 |
| 2013/0214683 A1* | 8/2013 | Valcore, Jr. | H01J 37/32146 315/111.21 |
| 2016/0276134 A1* | 9/2016 | Collins | H01J 37/3233 |

* cited by examiner

*Primary Examiner* — Henry Luong
(74) *Attorney, Agent, or Firm* — Penilla IP, APC

(57) ABSTRACT

Systems and methods for increasing peak ion energy with a low angular spread of ions are described. In one of the systems, multiple radio frequency (RF) generators that are coupled to an upper electrode associated with a plasma chamber are operated in two different states, such as two different frequency levels, for pulsing of the RF generators. The pulsing of the RF generators facilitates a transfer of ion energy during one of the states to another one of the states for increasing ion energy during the other state to further increase a rate of processing a substrate.

18 Claims, 18 Drawing Sheets

SYSTEMS AND METHODS FOR ACHIEVING PEAK ION ENERGY ENHANCEMENT WITH A LOW ANGULAR SPREAD

CLAIM OF PRIORITY

This application is a continuation of and claims the benefit of and priority, under 35 U.S.C. § 120, to U.S. patent application Ser. No. 15/693,134, filed on Aug. 31, 2017, and titled "SYSTEMS AND METHODS FOR ACHIEVING PEAK ION ENERGY ENHANCEMENT WITH A LOW ANGULAR SPREAD", which is hereby incorporated by reference in its entirety.

FIELD

The present embodiments relate to systems and methods for achieving peak ion energy enhancement with a low angular spread.

BACKGROUND

In some plasma processing systems, a radio frequency (RF) signal is provided to an electrode within a plasma chamber. The RF signal is used to generate plasma within the plasma chamber. The plasma is used for a variety of operations, e.g., clean substrate placed on a lower electrode, etch a substrate, etc. During processing of the substrate using the plasma, the RF signal is continuous.

It is in this context that embodiments described in the present disclosure arise.

SUMMARY

Embodiments of the disclosure provide systems, apparatus, methods and computer programs for achieving peak ion energy enhancement with a low angular spread. It should be appreciated that the present embodiments can be implemented in numerous ways, e.g., a process, an apparatus, a system, a device, or a method on a computer readable medium. Several embodiments are described below.

In some embodiments, the systems and methods described herein enhances ion energy without increasing or substantially increasing radio frequency (RF) bias voltage or RF bias power that is supplied and produces a narrow angular spread at peak energy. The narrow angular spread at the peak energy is used for achieving high aspect ratio etching.

The systems and methods described herein apply a high frequency level and a low frequency level during a pulsing time period. The high frequency level is applied by a high frequency RF generator, such as a 27 megahertz RF generator or a 60 megahertz RF generator, and the low frequency level is applied by another low frequency RF generator, such as a 2 megahertz RF generator or a 13.56 megahertz RF generator or a 400 kilohertz RF generator. The systems and methods has an advantage of facilitating a tight, such as a narrow, ion angle with an increase in peak ion energy, such as by greater than 35%, compared to a peak ion energy achieved with nonpulsing of an RF signal, such as a continuous wave RF signal. The tight ion angle and the increase in the peak ion energy are achieved as a result of low frequency and high frequency synchronized RF voltage pulses. During an onset of the high frequency level, plasma ions receive a voltage boost from a previous, such as a preceding, low frequency level. For example, an amount of voltage from the low frequency level is added to an amount of voltage to the high frequency level that is consecutive to the low frequency level. This causes higher peak energy in an ion energy and angular distribution function (IEADF) for the systems and methods described herein compared to continuous wave technology for the same RF bias voltage. A sheath voltage of a plasma sheath charges and discharges based an equation (1), which is provided below.

$$V_{High\_Peak} = V_{High} + V_{Low} \exp\left(\frac{-t}{RC}\right) \quad \text{equation (1)}$$

where $V_{Low}$ is a voltage level of an RF signal having the low frequency level, $V_{High}$ is the voltage level of a RF signal having the high frequency level, $V_{High\_peak}$ is a final voltage level after time t of the transition between low to high frequency level where contribution of previous low frequency level is added to the current high frequency voltage level Moreover, in the equation (1), exp is an exponential function, R is a resistance at an output of the plasma sheath that acts as a capacitor, RC is the time constant of the capacitor, and C is a capacitance of the capacitor. During the onset of the high frequency level, plasma ions travel through the plasma sheath and strike a substrate with a higher voltage compared to the continuous wave technology because of a voltage level from the previous low frequency level. The voltage level from the previous low frequency level is added to a voltage level of the high frequency level. This increase in the plasma sheath voltage level increases a denominator in an equation (2), which is provided below.

$$\sigma_\theta = \tan^{-1}\left(\sqrt{\frac{T_i}{eV_s}}\right) \quad \text{equation (2)}$$

where $V_s$ is a voltage of the plasma sheath, $T_i$ is the ion temperature at sheath edge, e is the amount of charge carried by a single electron, and tan is a tangent function. The increase in the denominator of equation (2) provides the narrower ion angle $\sigma_\theta$. Also, the low frequency level increases the resistance R and the increase in the resistance R increases the time constant RC. When the time constant RC increases during the low frequency level, a bias voltage at the substrate is enhanced even more compared to when a single frequency is used without pulsing, e.g., in a continuous wave mode. The pulsing between the high and low frequency levels together produce a pre-determined amount, such as 35-50%, of enhancement in an etch rate and a pre-determined amount, such as 10%, improvement in a critical dimension of the channel compared to a system in which the bias voltage at the substrate is increased by increasing a bias voltage that is supplied by a bias RF generator system. The improvement in the critical dimension is achieved when there is straighter etched feature.

In addition, the systems and methods described herein enhances ion energy without substantially increasing the bias voltage or bias power and generates a narrow angular spread at peak energy by contributing an amount of power or voltage from a low power parameter level to an amount of power of a high power parameter level. The systems and methods described herein employ a high power parameter level during a high state and a low power parameter level during a low state of a pulsing period. The low power parameter level is a percentage of a level of the power parameter during the high state. The high power parameter level and the low power parameter level are supplied by the same RF generator, such as the high frequency RF generator or the low frequency RF generator. As such, during the onset of the high state, the plasma sheath that acts as the capacitor holds a previous low voltage or power of the low power parameter level, which is then added to a high voltage or high power of the high power parameter level to cause a higher peak energy in IEADF. The peak energy is higher during the high state and the low state compared to the continuous wave technology for the same bias voltage. A voltage of the plasma sheath charges and discharges based on the equation (1).

During the onset of the high power parameter level, the plasma ions travel through the plasma sheath and strikes the substrate with a higher voltage compared to the continuous wave technology. An amount of voltage or power from a previous, such as a preceding, low power parameter level adds a contribution to the voltage of the high power parameter level. The addition to the voltage of the high power parameter level increases a voltage of the plasma sheath to further increase the denominator of the equation (2). The increase in the denominator of the equation (2) results in a narrow ion angle. Also, unlike the continuous wave technology, since during a transition from the low power parameter level to the high power parameter level, the plasma sheath is initially thinner, the plasma ions go through less collisions and less scattering to preserve both ion energy and tighter ion angle. The collisions and scattering are less compared to a thicker sheath of in the continuous wave mode. This energy enhanced ions at peak energy during the high power parameter level maintain a tighter ion angle used for high aspect ratio etching compared to that for the continuous wave mode. Also, since during the low power parameter level ion temperature Ti at sheath edge is low, during the transition from the low power parameter level to the high power parameter level the ion angular spread is narrower compared to CW technology. All these factors together enhance peak energy in the IEDF and tightens ion angle at this peak energy. Moreover, due to the pulsing between the low power parameter level and the high power parameter level, a mask is eroded less aggressively compared to that in the continuous wave technology.

In some embodiments, a method for operating a plasma chamber to increase ion energy and decrease angular spread of ions directed towards a surface of a substrate during an etch operation is described. The method includes receiving a pulsed signal to drive operation of the plasma chamber. The pulsed signal has two states including a first state and a second state. The method further includes operating a primary RF generator at a primary frequency level during the first state and maintaining the primary RF generator in an off state during the second state. The operation of the primary RF generator during the first state produces an increased charge for a plasma sheath formed over the substrate. The increased charge adds to a thickness of the plasma sheath. The method also includes operating a secondary RF generator at a secondary frequency level during the second state and maintaining the secondary RF generator in the off state during the first state. The operation of the secondary RF generator during the second state uses at least part of the increased charge of the plasma sheath produced during the first state as additive power to enhance the ion energy generated during the second state. The additive power reduces the angular spread of the ions when directed towards the surface of the substrate. The primary and secondary RF generators are coupled via an impedance matching circuit to a top electrode associated with the plasma chamber. The method includes continuing to operate the primary and secondary RF generators in the first and second states according to the pulsed signal to enhance the etch operation over multiple cycles of the first and second states.

In various embodiments, a method for operating a plasma chamber to increase ion energy and decrease angular spread of ions directed towards a surface of a substrate during an etch operation is described. The method includes receiving a pulsed signal to drive operation of the plasma chamber. The method further includes operating a primary RF generator at a first primary frequency level during the first state and a second primary frequency level during the second state. The operation of the primary RF generator during the first state produces an increased charge for a plasma sheath formed over the substrate. The method further includes operating a secondary RF generator at a first secondary frequency level during the first state and a second secondary frequency level during the second state. The operation of the secondary RF generator during the second state uses at least part of the increased charge of the plasma sheath produced during the first state as additive power to enhance the ion energy generated during the second state. Each of the first primary frequency level, the second primary frequency level, the first secondary frequency level, and the second secondary frequency level is non-zeo. For example, none of the primary and secondary RF generators are off during the first and second states. The method includes continuing to operate the primary and secondary RF generators in the first and second states according to the pulsed signal to enhance the etch operation over multiple cycles of the first and second states.

In several embodiments, a system for operating a plasma chamber to increase ion energy and decrease angular spread of ions directed towards a surface of a substrate during an etch operation is described. The system includes a primary RF generator having a primary power supply that generates a primary RF signal. The system further includes a secondary RF generator having a secondary power supply that generates a secondary RF signal. The system also includes an impedance matching network coupled to the primary power supply and the secondary power supply. The impedance matching network receives the primary RF signal and the secondary RF signal to generate a modified RF signal. The system includes a plasma chamber having a top electrode coupled to the impedance matching network. The plasma chamber receives the modified RF signal. The primary RF generator includes one or more processors. The one or more processors of the primary RF generator receive a pulsed signal to drive operation of the plasma chamber. The one or more processors operate the primary RF generator at a primary frequency level during the first state and maintain the primary RF generator in an off state during the second state. The operation of the primary RF generator during the first state produces an increased charge for a plasma sheath formed over the substrate. The increased charge adds to a thickness of the plasma sheath. The secondary RF generator includes one or more processors configured to receive the pulsed signal. The one or more processors of the secondary RF generator operate the secondary RF generator at a secondary frequency level during the second state and maintain the secondary RF generator in the off state during the first state. The operation of the secondary RF generator during the second state uses at least part of the increased charge of the plasma sheath produced during the first state as additive power to enhance the ion energy generated during the second state. The additive power reduces the angular spread of the ions when directed towards the surface of the substrate. The primary and secondary RF generators continue operation in the first and second states according to the pulsed signal to enhance the etch operation over multiple cycles of the first and second states.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe systems and methods for achieving peak ion energy enhancement with a low angular spread. It will be apparent that the present embodiments may be practiced without some or all of these specific details. In other instances, well known process operations have not been described in detail in order not to unnecessarily obscure the present embodiments.

Figure 1A:
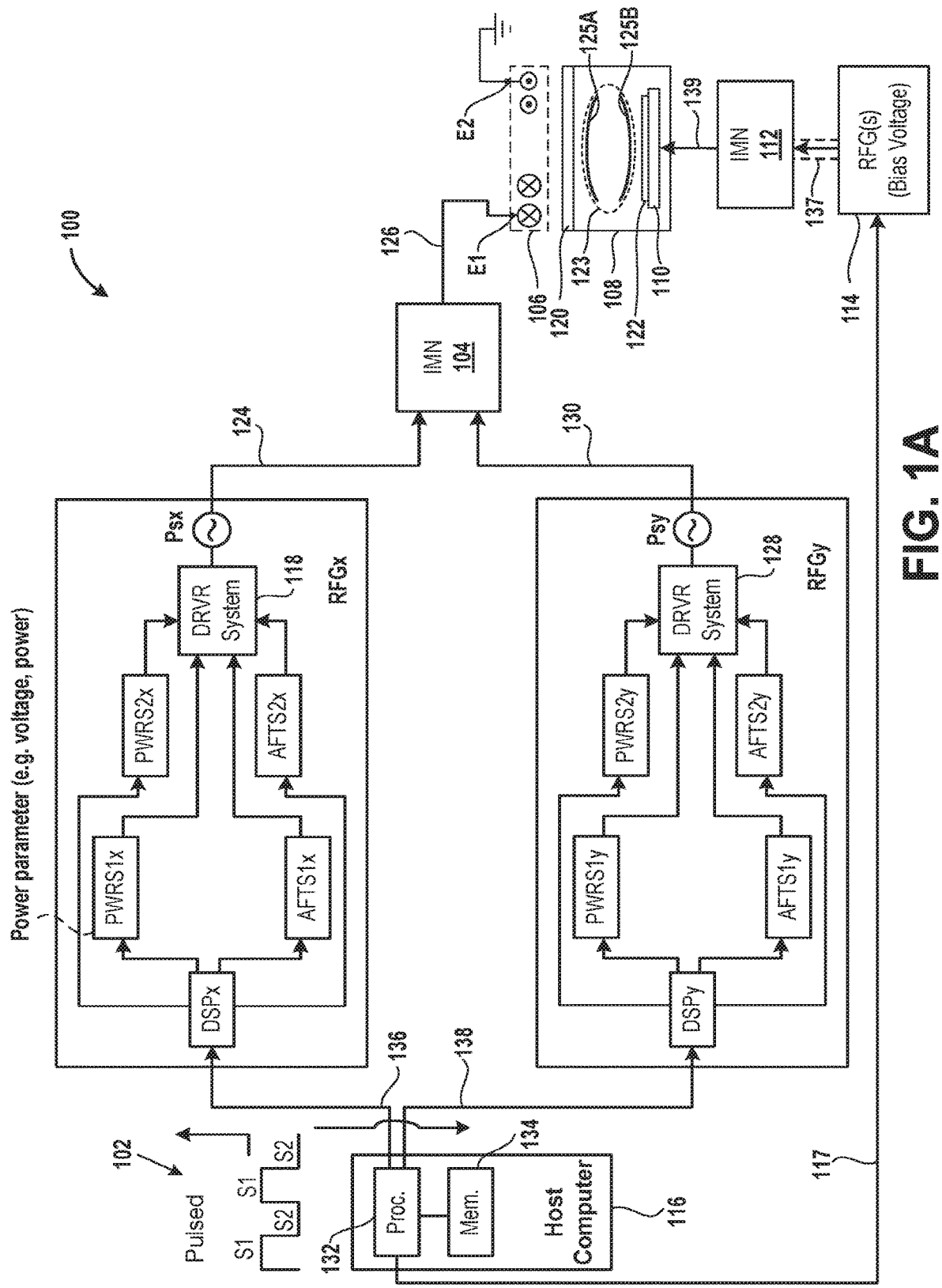
FIG. 1A is a block diagram of an embodiment of a plasma tool to illustrate frequency level two-state pulsing for achieving peak ion energy enhancement with a low angular spread.

FIG. 1A is a block diagram of an embodiment of a plasma tool 100 for achieving peak ion energy enhancement with a low angular spread. The plasma tool 100 includes a radio frequency (RF) generator RFGx, another RF generator RFGy, a host computer 116, an impedance matching network (IMN) 104, a plasma chamber 108, another IMN 112, and a bias RF generator system 114, which includes one or more bias RF generators. The plasma tool 100 further includes an RF cable system 137 that couples the RF generator system 114 to the IMN 112 and an RF transmission line 139 that couples the IMN 112 to a chuck 110 of the plasma chamber 108. The RF transmission line 139 includes a metal rod that is surrounded by an insulator that is further surrounded by a sheath. The metal rod is coupled to a cylinder via an RF strap and the cylinder is coupled to the chuck 110. Examples of the RF generator RFGx include a low frequency RF generator, such as a 400 kilohertz (kHz) RF generator, or a 2 megahertz (MHz) RF generator, or a 13.56 MHz RF generator. Examples of the RF generator RFGy include a high frequency RF generator, such as a 13.56 MHz, or a 27 MHz, or a 60 MHz RF generator. The RF generator RFGy operates at a higher frequency than the RF generator RFGx. Examples of the host computer 116 include a desktop computer, or a laptop computer, or a smartphone, or a tablet, etc.

The RF cable system 137 includes one or more RF cables that couple the bias RF generator system 114 with the IMN 112. In case multiple RF cables are included within the RF cable system 137, the RF cables are coupled to different inputs of the IMN 112. For example, one RF cable couples an output of an RF generator of the bias RF generator system 114 with an input of the IMN 112 and another RF cable couples an output of another RF generator of the bias RF generator system 114 with another input of the IMN 112.

The IMN 112 includes electric circuit components, e.g., inductors, capacitors, resistors, or a combination of two or more thereof, etc. to match an impedance of a load coupled to an output of the IMN 112 with an impedance of a source coupled to one or more inputs of the IMN 112. For example, the IMN 112 matches an impedance of the plasma chamber 108 and the RF transmission line 139 coupled to the output of the IMN 112 with an impedance of the bias RF generator system 114 and the RF cable system 137 coupled to the one or more inputs of the IMN 112. In one embodiment, one or more of the electrical circuit components of the IMN 112 are tuned to facilitate a match between an impedance of the load coupled to the output of the IMN 112 with that of the source coupled to the one or more inputs of the IMN 112. The IMN 112 reduces a probability of RF power being reflected in a direction towards the source, such as, from the load towards the source.

The RF generator RFGx includes a digital signal processor DSPx, a power parameter controller PWRS1x, another power parameter controller PWRS2x, an auto frequency tuner (AFT) AFTS1x, another auto frequency tuner AFTS2x, an RF power supply Psx, and a driver system 118. Examples of an RF power supply, as used herein, include an RF oscillator. To illustrate, an RF power supply is an electronic circuit that produces an oscillating signal, such as a sine wave, at a radio frequency. As another illustration, an RF power supply is a crystal oscillator having a quartz crystal that is distorted at a pre-determined frequency when a voltage is applied to an electrode near or on the quartz crystal. As used herein, a processor is an application specific integrated circuit (ASIC), or a programmable logic device (PLD), or a central processing unit (CPU), or a microprocessor, or a microcontroller. As used herein, a controller is application specific integrated circuit (ASIC), or a programmable logic device (PLD), or a central processing unit (CPU), or a microprocessor, or a microcontroller, or a processor. Examples of a driver system, as used herein, include one or more transistors.

The plasma chamber 108 includes a dielectric window 120, which forms a part of an upper wall of the plasma chamber 108. The dielectric window 120 separates an upper electrode 106 from an inside volume of the plasma chamber 108. The dielectric window 120 controls, such as reduces, an effect of an electric field that is induced by the upper electrode 106 within the inside of the volume of the plasma chamber 108. An example of the upper electrode 106 includes a transformer coupled plasma (TCP) coil, which includes one or more coil turns. For example, each coil turn lies in the same horizontal plane. As another example, each coil turn lies in a different horizontal plane. The upper electrode 106 is inductively coupled to the inside volume of the plasma chamber 108 via the dielectric window 120. Examples of materials used to fabricate the dielectric window 120 include quartz, or ceramic, etc. In some embodiments, the plasma chamber 108 also includes other components (not shown), e.g., a lower dielectric ring surrounding the chuck 110, a lower electrode extension surrounding the lower dielectric ring, a lower plasma exclusion zone (PEZ) ring, etc. The upper electrode 106 is located opposite to and facing the chuck 110, which includes a lower electrode. For example, the chuck 110 includes a ceramic layer that is attached to top of the lower electrode and a facility plate that is attached to bottom of the lower electrode. The lower electrode is made of a metal, e.g., anodized aluminum, alloy of aluminum, etc. Also, the upper electrode 106 is made of a metal.

A substrate 122, e.g., a semiconductor wafer, is supported on an upper surface of the chuck 110. Integrated circuits, e.g., an ASIC, a PLD, etc., are developed on the substrate 122 and the integrated circuits are used in a variety of devices, e.g., cell phones, tablets, smart phones, computers, laptops, networking equipment, etc.

One or more inlet ports, such as formed within a side wall of the plasma chamber 108, are coupled to a central gas feed (not shown). The central gas feed receives one or more process gases from a gas supply (not shown). Examples of the one or more process gases include an oxygen-containing gas, such as $O_2$. Other examples of the one or more process gases include a fluorine-containing gas, e.g., tetrafluoromethane ($CF_4$), sulfur hexafluoride ($SF_6$), hexafluoroethane ($C_2F_6$), etc.

The DSPx is coupled to the power parameter controllers PWRS1x and PWRS2x, and to the auto-frequency tuners AFTS1x and AFTS2x. Moreover, the power parameter controllers PWRS1x and PWRS2x and the auto-frequency tuners AFTS1x and AFTS2x are coupled to the driver system 118. The driver system 118 is coupled to the RF power supply Psx. The RF power supply Psx is coupled via an output of the RF generator RFGx to an RF cable 124, which is coupled to an input of the IMN 104.

An output of the IMN 104 is coupled via an RF transmission cable 126 to an end E1 of the upper electrode 106. The upper electrode 106 is coupled to a ground potential at its opposite end, such as an end E2. An example RF transmission cable 126 is an RF cable.

The RF generator RFGy includes a DSPy, a power parameter controller PWRS1y, another power parameter controller PWRS2y, an auto frequency tuner AFTS1y, and another auto frequency tuner AFTS2y. The RF generator RFGy further includes an RF power supply Psy and a driver system 128. The DSPy is coupled to the power parameter controllers PWRS1y and PWRS2y, and to the auto-frequency tuners AFTS1y and AFTS2y. Moreover, the power parameter controllers PWRS1y and PWRS2y and the auto-frequency tuners AFTS1y and AFTS2y are coupled to the driver system 128. The driver system 128 is coupled to the RF power supply Psy. The RF power supply Psy is coupled via an output of the RF generator RFGy to an RF cable 130, which is coupled to another input of the IMN 104. The other input of the IMN 104 to which the RF cable 130 is coupled is different from the input to which the RF cable 124 is coupled.

The IMN 104 includes electric circuit components, e.g., inductors, capacitors, resistors, or a combination of two or more thereof, etc. to match an impedance of a load coupled to the output of the IMN 104 with an impedance of a source coupled to the inputs of the IMN 104. For example, the IMN 104 matches an impedance of the plasma chamber 108 and the RF transmission cable 126 coupled to the output of the IMN 104 with an impedance of the RF generator RFGx, the RF cable 124, the RF generator RFGy, and the RF cable 130. In one embodiment, one or more of the electrical circuit components of the IMN 104 are tuned to facilitate a match between an impedance of the load coupled to the output of the IMN 104 with that of the source coupled to the inputs of the IMN 104. The IMN 104 reduces a probability of RF power being reflected a direction towards the source, e.g., from the load towards the source.

The host computer 116 includes a processor 132 and a memory device 134. The processor 132 is coupled to the memory device 134. Examples of a memory device include a random access memory (RAM) and a read-only memory (ROM). To illustrate, a memory device is a flash memory, a hard disk, or a storage device, etc. A memory device is an example of a computer-readable medium. The processor 132 is coupled to the DSPx via a cable 136 and is coupled to the DSPy via a cable 138. Examples of the cable 136 or the cable 138 include a cable that is used to transfer data in a serial manner, a cable that is used to transfer data in a parallel manner, and a cable that is used to transfer data by applying a universal serial bus (USB) protocol.

A control circuit of the processor 132 is used to generate a pulsed signal 102, e.g., a transistor-transistor logic (TTL) signal, a digital pulsing signal, a clock signal, a signal with a duty cycle, etc. Examples of the control circuit of the processor 132 used to generate the pulsed signal 102 includes a TTL circuit.

The pulsed signal 102 includes multiple states S1 and S2. For example, the state S1 of the pulsed signal 102 has a logic level of one during a portion of a cycle of the pulsed signal 102 and a logic level of zero during another portion of the cycle. In various embodiments, the states S1 and S2 execute once during the cycle of the pulsed signal 102 and repeat with multiple cycles of the pulsed signal 102. For example, the cycle of the pulsed signal 102 includes the states S1 and S2 and another cycle of the pulsed signal 102 includes the states S1 and S2. To illustrate, during a portion of a period of the cycle of the pulsed signal 102, the state S1 is executed and during the remaining period of the cycle, the state S2 is executed. As another example, the duty cycle of the state S1 is the same as the duty cycle of the state S2. To illustrate, each state S1 and S2 of the pulsed signal 102 has a duty cycle of 50%. As yet another example, the duty cycle of the state S1 is different from the duty cycle of the state S2. To illustrate, the state S1 of the pulsed signal 102 has the duty cycle of a % and the state S2 of the pulsed signal 102 has the duty cycle of (100–a) %, where a is an integer greater than zero. An example of a % ranges between 10% and 50%. Another example of a % ranges between 20% and 40%. Yet another example of a % is 25%.

In various embodiments, instead of the control circuit of the processor 132, a clock source, e.g., a crystal oscillator, etc., is used to generate an analog clock signal, which is converted by an analog-to-digital converter into a digital signal similar to the pulsed signal 102. For example, the crystal oscillator is made to oscillate in an electric field by applying a voltage to an electrode near the crystal oscillator. In various embodiments, instead of the processor 132, a digital clock source generates the pulsed signal 102.

The processor 132 accesses a recipe from the memory device 134. Examples of the recipe include a power parameter set point to be applied to the RF generator RFGx for the state S1, a power parameter set point to be applied to the RF generator RFGx for the state S2, a frequency set point to be applied to the RF generator RFGx for the state S1, a frequency set point to be applied to the RF generator RFGx for the state S2, a power parameter set point to be applied to the RF generator RFGy for the state S1, a power parameter set point to be applied to the RF generator RFGy for the state S2, a frequency set point to be applied to the RF generator RFGy for the state S1, a frequency set point to be applied to the RF generator RFGy for the state S2, a chemistry of the one or more process gases, or a combination thereof. Examples of a power parameter set point, as used herein, include a voltage set point and a power set point.

The processor 132 sends an instruction with the pulsed signal 102 to the DSPx via the cable 136. The instruction sent to the DSPx via the cable 136 has information regarding the pulsed signal 102, the power parameter set point to be applied to the RF generator RFGx for the state S1, the power parameter set point to be applied to the RF generator RFGx for the state S2, the frequency set point to be applied to the RF generator RFGx for the state S1, and the frequency set point to be applied to the RF generator RFGx for the state S2. The information regarding the pulsed signal 102 indicates to the DSPx that the RF signal to be generated by the RF generator RFGx is to transition from the state S1 to the state S2 at a transition time tst1 of the pulsed signal 102 and that the RF signal is to transition from the state S2 to the state S1 at a transition time tst2 of the pulsed signal 102. The DSPx determines from the instruction that the power parameter set point for the state S1 is to be applied during the state S1 of the pulsed signal 102, the power parameter set point for the state S2 is to be applied during the state S2 of the pulsed signal 102, the frequency set point for the state S1 is to be applied during the state S1 of the pulsed signal 102, and the frequency set point for the state S2 is to be applied during the state S2 of the pulsed signal 102. Moreover, the DSPx determines from the instruction and the pulsed signal 102, that the RF signal to be generated by the RF generator RFGx is to transition from the state S1 to the state S2 at the transition time tst1 of the pulsed signal 102 and that the RF signal is to transition from the state S2 to the state S1 at the transition time tst2 of the pulsed signal 102. The transition times tst1 and tst2 repeat for each cycle of the pulsed signal 102.

At the transition time tst2 of the cycle of the pulsed signal 102, the DSPx sends the power parameter set point for the state S1 to the power parameter controller PWRS1x. Similarly, at the transition time tst1 of the cycle of the pulsed signal 102, the DSPx sends the power parameter set point for the state S2 to the power parameter controller PWRS2x. Moreover, at the transition time tst2 of the cycle of the pulsed signal 102, the DSPx sends the frequency set point for the state S1 to the auto-frequency tuner AFTS1x. Also, at the transition time tst1 of the cycle of the pulsed signal 102, the DSPx sends the frequency set point for the state S2 to the auto-frequency tuner AFTS2x.

Upon receiving the power parameter set point for the state S1, the power parameter controller PWRS1x determines an amount of current corresponding to, e.g., having a one-to-one relationship with, mapped to, linked to, etc., the power parameter set point for the state S1. Based on the amount of current that is to be generated by the driver system 118 during the state S1, the power parameter controller PWRS1x generates a command signal and sends the command signal to the driver system 118. For the state S1, in response to receiving the command signal, the driver system 118 generates and sends a current signal having the amount of current to the RF power supply Psx. The RF power supply Psx, upon receiving the current signal generates the RF signal having the power parameter set point for the state S1 and supplies the RF signal via the output of the RF generator RFGx and the RF cable 124 to the input of the IMN 104. The power parameter set point for the state S1 is maintained during the state S1 by the RF power supply Psx of the RF generator RFGx.

Similarly, upon receiving the power parameter set point for the state S2, the power parameter controller PWRS2x determines an amount of current corresponding to the power parameter set point for the state S2. Based on the amount of current that is to be generated by the driver system 118 during the state S2, the power parameter controller PWRS2x generates a command signal and sends the command signal to the driver system 118. For the state S2, in response to receiving the command signal, the driver system 118 generates and sends a current signal having the amount of current to the RF power supply Psx. The RF power supply Psx, upon receiving the current signal generates the RF signal having the power parameter set point for the state S2 and supplies the RF signal via the output of the RF generator RFGx and the RF cable 124 to the input of the IMN 104. The power parameter set point for the state S2 is maintained during the state S2 by the RF power supply Psx of the RF generator RFGx.

Moreover, upon receiving the frequency set point for the state S1, the auto-frequency tuner AFTS1x determines an amount of current corresponding to the frequency set point for the state S1. Based on the amount of current that is to be generated by the driver system 118 during the state S1, the auto-frequency tuner AFTS1$x$ generates a command signal and sends the command signal to the driver system 118. For the state S1, in response to receiving the command signal, the driver system 118 generates and sends a current signal having the amount of current to the RF power supply Psx. The RF power supply Psx, upon receiving the current signal generates the RF signal having the frequency set point for the state S1 and supplies the RF signal via the output of the RF generator RFGx and the RF cable 124 to the input of the IMN 104. The frequency set point for the state S1 is maintained during the state S1 by the RF power supply Psx. The RF signal having the power parameter set point for the state S1 and the frequency set point for the state S1 is the RF signal generated by the RF generator RFGx during the state S1.

Similarly, upon receiving the frequency set point for the state S2, the auto-frequency tuner AFTS2$x$ determines an amount of current corresponding to the frequency set point for the state S2. Based on the amount of current that is to be generated by the driver system 118 during the state S2, the auto-frequency tuner AFTS2$x$ generates a command signal and sends the command signal to the driver system 118. For the state S2, in response to receiving the command signal, the driver system 118 generates and sends a current signal having the amount of current to the RF power supply Psx. The RF power supply Psx, upon receiving the current signal generates the RF signal having the frequency set point for the state S2 and supplies the RF signal via the output of the RF generator RFGx and the RF cable 124 to the input of the IMN 104. The frequency set point for the state S2 is maintained during the state S2 by the RF power supply Psx. The RF signal having the power parameter set point for the state S2 and the frequency set point for the state S2 is the RF signal generated by the RF generator RFGx during the state S2.

The processor 132 sends an instruction with the pulsed signal 102 to the DSPy via the cable 138. The instruction sent to the DSPy via the cable 138 has information regarding the pulsed signal 102, the power parameter set point to be applied to the RF generator RFGy for the state S1, the power parameter set point to be applied to the RF generator RFGy for the state S2, the frequency set point to be applied to the RF generator RFGy for the state S1, and the frequency set point to be applied to the RF generator RFGy for the state S2. The information regarding the pulsed signal 102 indicates to the DSPy that the RF signal to be generated by the RF generator RFGy is to transition from the state S1 to the state S2 at the transition time tst1 of the cycle of the pulsed signal 102 and that the RF signal is to transition from the state S2 to the state S1 at the transition time tst2 of the cycle of the pulsed signal 102. The DSPy parses the instruction and determines from the instruction that the power parameter set point for the state S1 is to be applied during the state S1 of the pulsed signal 102, the power parameter set point for the state S2 is to be applied during the state S2 of the pulsed signal 102, the frequency set point for the state S1 is to be applied during the state S1 of the pulsed signal 102, and the frequency set point for the state S2 is to be applied during the state S2 of the pulsed signal 102. Moreover, the DSPy determines from the instruction that the RF signal to be generated by the RF generator RFGy is to transition from the state S1 to the state S2 at the transition time tst1 of the cycle of the pulsed signal 102 and that the RF signal is to transition from the state S2 to the state S1 at the transition time tst2 of the cycle of the pulsed signal 102.

At the transition time tst2 of the cycle of the pulsed signal 102, the DSPy sends the power parameter set point for the state S1 to the power parameter controller PWRS1$y$. Similarly, at the transition time tst1 of the cycle of the pulsed signal 102, the DSPy sends the power parameter set point for the state S2 to the power parameter controller PWRS2$y$. Moreover, at the transition time tst2 of the cycle of the pulsed signal 102, the DSPy sends the frequency set point for the state S1 to the auto-frequency tuner AFTS1$y$. Also, at the transition time tst1 of the cycle of the pulsed signal 102, the DSPy sends the frequency set point for the state S2 to the auto-frequency tuner AFTS2$y$.

Upon receiving the power parameter set point for the state S1, the power parameter controller PWRS1$y$ determines an amount of current corresponding to the power parameter set point for the state S1. Based on the amount of current that is to be generated by the driver system 128 during the state S1, the power parameter controller PWRS1$y$ generates a command signal and sends the command signal to the driver system 128. For the state S1, in response to receiving the command signal, the driver system 128 generates and sends a current signal having the amount of current to the RF power supply Psy. The RF power supply Psy, upon receiving the current signal generates the RF signal having the power parameter set point for the state S1 and supplies the RF signal via the output of the RF generator RFGy and the RF cable 130 to the other input of the IMN 104. The power parameter set point for the state S1 is maintained during the state S1 by the RF power supply Psy.

Similarly, upon receiving the power parameter set point for the state S2, the power parameter controller PWRS2$y$ determines an amount of current corresponding to the power parameter set point for the state S2. Based on the amount of current that is to be generated by the driver system 128 during the state S2, the power parameter controller PWRS2$y$ generates a command signal and sends the command signal to the driver system 128. For the state S2, in response to receiving the command signal, the driver system 128 generates and sends a current signal having the amount of current to the RF power supply Psy. The RF power supply Psy, upon receiving the current signal generates the RF signal having the power parameter set point for the state S2 and supplies the RF signal via the output of the RF generator RFGy and the RF cable 130 to the other input of the IMN 104. The power parameter set point for the state S2 is maintained during the state S2 by the RF power supply Psy.

Moreover, upon receiving the frequency set point for the state S1, the auto-frequency tuner AFTS1$y$ determines an amount of current corresponding to the frequency set point for the state S1. Based on the amount of current that is to be generated by the driver system 128 during the state S1, the auto-frequency tuner AFTS1$y$ generates a command signal and sends the command signal to the driver system 128. For the state S1, in response to receiving the command signal, the driver system 128 generates and sends a current signal having the amount of current to the RF power supply Psy. The RF power supply Psy, upon receiving the current signal generates the RF signal having the frequency set point for the state S1 and supplies the RF signal via the output of the RF generator RFGy and the RF cable 130 to the other input of the IMN 104. The frequency set point for the state S1 is maintained during the state S1 by the RF power supply Psy. The RF signal having the power parameter set point for the state S1 and the frequency set point for the state S1 is the RF signal generated by the RF generator RFGy during the state S1.

Similarly, upon receiving the frequency set point for the state S2, the auto-frequency tuner AFTS2y determines an amount of current corresponding to the frequency set point for the state S2. Based on the amount of current that is to be generated by the driver system 128 during the state S2, the auto-frequency tuner AFTS2y generates a command signal and sends the command signal to the driver system 128. For the state S2, in response to receiving the command signal, the driver system 128 generates and sends a current signal having the amount of current to the RF power supply Psy. The RF power supply Psy, upon receiving the current signal generates the RF signal having the frequency set point for the state S2 and supplies the RF signal via the output of the RF generator RFGy and the RF cable 130 to the other input of the IMN 104. The frequency set point for the state S2 is maintained during the state S2 by the RF power supply Psy. The RF signal having the power parameter set point for the state S2 and the frequency set point for the state S2 is the RF signal generated by the RF generator RFGy during the state S2.

The input of the IMN 104 receives the RF signal generated by the RF power supply Psx via the RF cable 124 from the output of the RF generator RFGx, receives, at the other input, the RF signal generated by the RF power supply Psy via the RF cable 130 from the output of the RF generator RFGy, and matches an impedance of the load coupled to the output of the IMN 104 with an impedance of the source coupled to the inputs of the IMN 104 to generate a modified RF signal at the output of the IMN 104. The modified RF signal is sent via the RF transmission cable 126 to the upper electrode 106, such as to the end E1 of the TCP coil.

Moreover, the RF generator system 114 generates one or more RF signals. For example, an RF generator of the RF generator system 114 generates an RF signal. As another example, an RF generator of the RF generator system 114 generates an RF signal and another RF generator of the RF generator system 114 generates another RF signal. It should be noted that an amount of bias voltage or bias power of the one or more RF signals that are supplied by the RF generator system 114 is within a pre-determined range during multiple states, such as the states S1 and S2, or the states S1, S2, and a state S3. To illustrate, the processor 132 sends a level of the bias voltage or a level of bias power to the RF generator system 114 via a cable 117 that couples the RF generator system 114 to the processor 132. The RF generator system 114 generates the one or more RF signals having the level of bias voltage or the level of bias power during the multiple states. The one or more RF signals are generated by the RF generator system 114 in a manner similar to that described herein for generating the RF signal generated by the RF generator RFGx or RFGy. The bias voltage or the bias power of the one or more RF signals is constant, such as the same as, or within the pre-determined range from the level of bias voltage or the level of bias power that is received from the processor 132. The bias RF generator system 114 operates in a continuous wave mode during the states S1 and S2 or the states S1 through S3.

The one or more RF signals are received by the IMN 112 via the RF cable system 137 to match an impedance of the load coupled to the output of the IMN 112 with that of the source coupled to the one or more inputs of the IMN 112 to generate an output RF signal. The output RF signal is sent via the RF transmission line 139 to the chuck 110.

When the one or more process gases are supplied between the upper electrode 106 and the chuck 110, the modified RF signal is supplied to the upper electrode 106, and the output RF signal is supplied to the chuck 110, the one or more process gases are ignited to generate or maintain plasma within the plasma chamber 108. The plasma has a plasma sheath 123 and is used to process, e.g., etch, deposit materials on, clean, sputter, etc., the substrate 122. The plasma sheath 123 is a boundary of the plasma formed within the plasma chamber 108. For example, the plasma sheath 123 includes a top boundary 125A of the plasma formed within the plasma chamber 108 and a bottom boundary 125B of the plasma formed within the plasma chamber 108. The top boundary 125A is closer to the upper electrode 106 than to the chuck 110 and the bottom boundary 125B is closer to the chuck 110 than to the upper electrode 106.

In some embodiments, the terms tuner and controller are used interchangeably herein.

In various embodiments, the power parameter controllers PWRS1x and PWRS2x, and the auto-frequency tuners AFTS1x and AFTS2x are modules, e.g., portions, etc., of a computer program that is executed by the DSPx. Similarly, in some embodiments, the power parameter controllers PWRS1y and PWRS2y, and the auto-frequency tuners AFTS1y and AFTS2y are modules, e.g., portions, etc., of a computer program that is executed by the DSPy.

In several embodiments, the power parameter controllers PWRS1x and PWRS2x, and the auto-frequency tuners AFTS1x and AFTS2x are separate integrated circuits that are coupled to an integrated circuit of the DSPx. For example, the power parameter controller PWRS1x is a first integrated circuit of the RF generator RFGx, the power parameter controller PWRS2x is a second integrated circuit of the RF generator RFGx, the auto-frequency tuner AFTS1x is a third integrated circuit of the RF generator RFGx, the auto-frequency tuner AFTS2x is a fourth integrated circuit of the RF generator RFGx, and the DSPx is a fifth integrated circuit of the RF generator RFGx. Each of the first through fourth integrated circuit of the RF generator RFGx is coupled to the fifth integrated circuit of the RF generator RFGx.

Similarly, in various embodiments, the power parameter controllers PWRS1y and PWRS2y, and the auto-frequency tuners AFTS1y and AFTS2y are separate integrated circuits that are coupled to an integrated circuit of the DSPy. For example, the power parameter controller PWRS1y is a first integrated circuit of the RF generator RFGy, the power parameter controller PWRS2y is a second integrated circuit of the RF generator RFGy, the auto-frequency tuner AFTS1y is a third integrated circuit of the RF generator RFGy, the auto-frequency tuner AFTS2y is a fourth integrated circuit of the RF generator RFGy, and the DSPy is a seventh integrated circuit of the RF generator RFGy. Each of the first through fourth integrated circuit of the RF generator RFGy is coupled to the fifth integrated circuit of the RF generator RFGy.

In various embodiments, an example of the state S1 of an RF signal, described herein, includes the power parameter set point for the state S1 and the frequency set point for the state S1. The power parameter set point for the state S1 is an operational power parameter set point, which is a power parameter level, such as an envelope or a zero-to-peak magnitude, of power amounts or voltage amounts of the RF signal during the state S1. The frequency set point for the state S1 is an operational frequency set point, which is a frequency level, such as an envelope or a zero-to-peak magnitude, of frequency values of the RF signal during the state S1. Similarly, an example of the state S2 of the RF signal, described herein, includes the power parameter set point for the state S2 and the frequency set point for the state S2. The power parameter set point for the state S2 is an operational power parameter set point, which is a power parameter level, such as an envelope or a zero-to-peak magnitude, of power amounts or voltage amounts of the RF signal during the state S2. The frequency set point for the state S2 is an operational frequency set point, which is a frequency level, such as an envelope or a zero-to-peak magnitude, of frequency values of the RF signal during the state S2. It should be noted that in an embodiment, a power parameter level of zero is an example of a power parameter set point, described herein. Similarly, in one embodiment, a frequency level of zero is an example of a frequency set point, described herein.

In various embodiments, three RF generators are coupled to the IMN 104. For example, an additional RF generator is coupled to the IMN 104 via another RF cable (not shown) to yet another input of the IMN 104. The additional RF generator is in addition to the RF generator RFGx and the RF generator RFGy. The yet another input is not the same as the input of the IMN 104 to which the RF cable 124 is coupled or the other input of the IMN 104 to which to the RF cable 130 is coupled. The additional RF generator has the same structure and function as that of the RF generator RFGy except that the additional RF generator has a different operating frequency, e.g., 2 MHz, 27 MHz, 60 MHz, etc., than that of the RF generator RFGy. For example, the RF generator RFGy has an operating frequency of 13.56 MHz and the additional RF generator has an operating frequency of 2 MHz, or 27 MHz, or 60 MHz. The IMN 104 combines the RF signals received from the RF generator RFGx, the RF generator RFGy, and the additional RF generator, and matches an impedance of the load coupled to the output of the IMN 104 with that of a source, e.g., the RF generator RFGx, the RF generator RFGy, the additional RF generator, the RF cable 124, the RF cable 130, and the other RF cable, etc., to generate the modified RF signal at the output of the IMN 104.

In one embodiment, terms impedance matching circuit and impedance matching network are used herein interchangeably.

In some embodiments, the chuck 110 is coupled to the ground potential instead of being coupled to the IMN 112 and the bias RF generator system 114.

In various embodiments, instead of the TCP coil being used as the upper electrode 106, a CCP plate is used at the upper electrode 106. For example, the CCP plate is a circular plate having a circular volume and lies in a horizontal plane inside the plasma chamber 108. The CCP plate is made of a metal, such as aluminum or an alloy of aluminum. In these embodiments, the plasma chamber 108 lacks the dielectric window 120 and has an upper wall instead. The plasma chamber 108 also includes other components, such as an upper dielectric ring surrounding the CCP plate, an upper electrode extension surrounding the upper dielectric ring, an upper PEZ ring, etc. The CCP plate is located opposite to and facing the chuck 110.

Figure 1B:
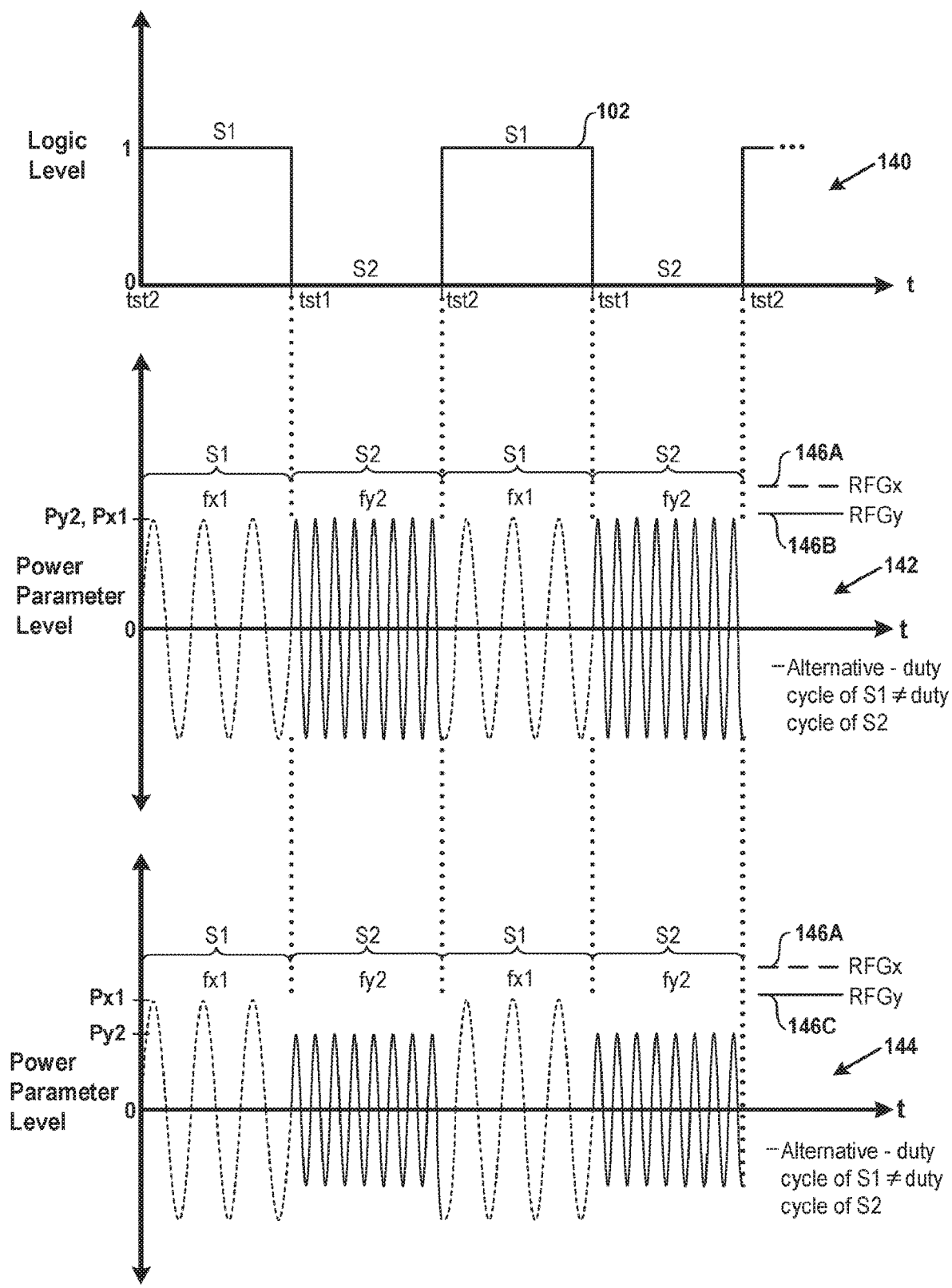
FIG. 1B is a diagram of embodiments of graphs to illustrate the frequency level two-state pulsing in which one state is an off state.

In some embodiments, instead of the pulsed signal 102 being sent from the processor 132 to the RF generators RFGx and RFGy, the pulsed signal 102 is sent from a master RF generator to a slave RF generator, such as the RF generator RFGy. An example of the master RF generator includes the RF generator RFGx. To illustrate, the digital signal processor DSPx of the RF generator RFGx receives the pulsed signal 102 from the processor 132 and sends the pulsed signal 102 via a cable, such as a parallel transfer cable, a serial transfer cable, or a USB cable, to the digital signal processor DSPy of the RF generator RFGy. FIG. 1B is a diagram of embodiments of graphs 140, 142, and 144.

The graph 140 plots a logic level of the pulsed signal 102 versus the time t. Examples of the logic level include a level of zero and a level of one. The level of zero is an example of a low logic level and the level of one is an example of a high logic level. Moreover, the graph 142 plots a power parameter level, such as a voltage level or a power level, of the RF signal, such as an RF signal 146A, that is generated and supplied by the RF generator RFGx versus the time t. The graph 142 further plots the power parameter level of the RF signal, such as an RF signal 146B, that is generated and supplied by the RF generator RFGy versus the time t. Also, the graph 144 plots the power parameter level of the RF signal 146A versus the time t. The graph 144 further plots the power parameter level of the RF signal, such as an RF signal 146C, generated and supplied by the RF generator RFGy versus the time t.

With reference to graphs 140 and 142, during each cycle of the pulsed signal 102, the pulsed signal 102 transitions from the state S1 to the state S2 at the transition time tst1 and transitions from the state S2 to the state S1 at the transition time tst1. Moreover, during the state S1, the RF signal 146A has a power parameter level of Px1 and the RF signal 146B has a power parameter level of zero. Also, during the state S1, the RF signal 146A has a frequency level of fx1 and the RF signal 146B has a frequency level of zero.

Furthermore, at the transition time tst1, each RF signal 146A and 146B transitions from the state S1 to the state S2. During the state S2, the RF signal 146A has a power parameter level of zero and the RF signal 146B has a power parameter level of Py2. Also, during the state S2, the RF signal 146A has a frequency level of zero and the RF signal 146B has a frequency level of fy2. When any RF generator, described herein, operates at a frequency level of zero and at a power parameter level of zero, the RF generator is turned off, e.g., is nonoperational, is switched off, etc. The power parameter level Py2 is the same as the power parameter level Px1. Moreover, the frequency level fy2 is greater than the frequency level fx1. At the transition time tst2, each RF signal 146A and 146B transitions from the state S2 back to the state S1.

It should further be noted that a duty cycle of the state S1 of the pulsed signal 102 or the RF signal 146A or the RF signal 146B is the same as a duty cycle of the state S2 of the pulsed signal 102 or the RF signal 146A or the RF signal 146B. For example, the duty cycle of the state S1 is 50% and the duty cycle of the state S2 is 50%. The state S1 of the RF signal 146A or the RF signal 146B occupies 50% of the cycle of the pulsed signal 102 and the state S2 of the RF signal 146A or the RF signal 146B occupies the remaining 50% of the cycle of the pulsed signal 102.

In various embodiments, a duty cycle of the state S1 of a signal, such as the pulsed signal 102 or the RF signal 146A or the RF signal 146B, is different from a duty cycle of the state S2 of the signal. For example, the duty cycle of the state S1 is 25% and the duty cycle of the state S2 is 75%. The state S1 of the RF signal 146A or the RF signal 146B occupies 25% of the cycle of the pulsed signal 102 and the state S2 of the RF signal 146A or the RF signal 146B occupies the remaining 75% of the cycle of the pulsed signal 102. As another example, the duty cycle of the state S1 is a % and the duty cycle of the state S2 is (100−a) %. The state S1 of the RF signal 146A or the RF signal 146B occupies a % of the cycle of the pulsed signal 102 and the state S2 of the RF signal 146A or the RF signal 146B occupies the remaining (100−a) % of the cycle of the pulsed signal 102. To illustrate, during a calibration operation, for a frequency level for the state S1, a frequency level for the state S2, a power parameter level for the state S1, and a power parameter level for the state S2, a type of the one or more process gases, and a type of a material of the substrate 122, a percentage of the cycle of the pulsed signal 102 for which the RF signal is generated by the RF generator RFGx is determined based on an etch rate to be achieved. The etch rate is measured by an etch rate measurement device (ERMD) during the calibration operation. Examples of the type of the material of the substrate 120 to include an oxide layer or a metal layer of the substrate 122. Moreover, the percentage of the cycle of the pulsed signal 102, for which the RF signal is generated by the RF generator RFGx, is associated with a threshold amount of charge to be stored on the plasma sheath 123 during the state S1. The association between the threshold amount of charge, the etch rate, and the percentage of the cycle of the pulsed signal 102 for which the RF signal is generated by the RF generator RFGx is stored in the memory device 134. During processing of the substrate 122, the percentage of the cycle of the pulsed signal 102, for which the RF signal is generated by the RF generator RFGx, is used as a part of a recipe or as a duty cycle of the pulsed signal 102.

The ERMD is coupled to the processor 132 via a cable and has a line of sight via a window of the plasma chamber 108. The line of sight is directed into a space in which plasma is generated within the plasma chamber 108. For example, the ERMD includes a spectrophotometer that monitors plasma within the plasma chamber 108 to measure intensity of radiation emitted by the plasma via the window. In some embodiments, the window is made of a transparent material that allows light emitted by the plasma to pass through, e.g., glass. In various embodiments, the window is a translucent window. The intensity is directly proportional to an etch rate of a layer of a dummy wafer that is etched by the plasma. As another example, for a known recipe, from intensities of radiation emitted by the plasma during the calibration operation, the ERMD measures a thickness of the dummy wafer at a time tm1 and measures a thickness of the dummy wafer at a time tm2, after time tm1 and after etching the dummy wafer. The ERMD determines an etch rate of the dummy wafer as a ratio of a difference between the thickness at the time tm2 and the thickness at the time tm1 over a difference between the times tm2 and tm1. In various embodiments, the dummy wafer has the same material as that of the substrate 122.

In some embodiments, the power parameter level Py2 of the RF signal 146B is different from, such as is lower than or greater than, the power parameter level Px1 of the RF signal 146A.

The graph 144 is similar to the graph 142 except that the RF signals 146B and 146C have different power parameter levels. For example, the RF signal 146B has the power parameter level of Py2 during the state S2 and the power parameter level Py2 of the RF signal 146B is greater than a power parameter level Py2 of the RF signal 146C.

With reference to graphs 140 and 144, the state S1 of the RF signal 146C is the same as the state S1 of the RF signal 146B. For example, during the state S1, the RF signal 146C has a power parameter level of zero. Also, during the state S1, the RF signal 146C has a frequency level of zero.

Furthermore, at the transition time tst1, the RF signal 146C transitions from the state S1 to the state S2. During the state S2, the RF signal 146C has the power parameter level of Py2. Also, during the state S2, the RF signal 146C has the frequency level of fy2. The power parameter level Py2 of the RF signal 146C is lower than the power parameter level Px1 of the RF signal 146A and the frequency level fy2 of the RF signal 146C is the same as the frequency level of the RF signal 146B. At the transition time tst2, the RF signal 146C transitions from the state S2 back to the state S1.

It should be noted that a duty cycle of the state S1 of the RF signal 146C is the same as a duty cycle of the state S2 of the RF signal 146C. For example, the duty cycle of the state S1 of the RF signal 146C is 50% and the duty cycle of the state S2 of the RF signal 146C is 50%. The state S1 of the RF signal 146C occupies 50% of the cycle of the pulsed signal 102 and the state S2 of the RF signal 146C occupies the remaining 50% of the cycle of the pulsed signal 102.

In various embodiments, a duty cycle of the state S1 of the RF signal 146C is different from a duty cycle of the state S2 of the RF signal 146C. For example, the duty cycle of the state S1 of the RF signal 146C is 25% and the duty cycle of the state S2 of the RF signal 146C is 75%. The state S1 of the RF signal 146C occupies 25% of the cycle of the pulsed signal 102 and the state S2 of the RF signal 146C occupies the remaining 75% of the cycle of the pulsed signal 102. As another example, the duty cycle of the state S1 of the RF signal 146C is a % and the duty cycle of the state S2 of the RF signal 146C is (100−a) %. The state S1 of the RF signal 146C occupies a % of the cycle of the pulsed signal 102 and the state S2 of the RF signal 146C occupies the remaining (100−a) % of the cycle of the pulsed signal 102.

In some embodiments, the power parameter level Py2 of the RF signal 146C is greater than the power parameter level Px1 of the RF signal 146A.

It should be noted that the power parameter levels Px1 and Py2 are non-zero as illustrated in the graph 142. Moreover, the frequency levels fx1 and fy2 are non-zero as illustrated in the graph 142. Also, the power parameter levels Px1 and Py2 are non-zero as illustrated in the graph 144. Moreover, the frequency levels fx1 and fy2 are non-zero as illustrated in the graph 144.

It should further be noted that the RF generator RFGx is controlled to operate at the frequency level fx1 during the state S1. Within the plasma chamber 108, the power parameter of the RF signal generated by the RF generator RFGx during the state S1 is added to the power parameter of the RF signal generated by the RF generator RFGy during the state S2. The plasma sheath 123 within the plasma chamber 108 acts as a capacitor. The capacitor charges during the state S1 from the power parameter level Px1 associated with the frequency level fx1 and discharges during the state S2. The power parameter level Px1 charges the plasma sheath 123 to increase an amount of charge of the plasma sheath 123 during the state S1. Moreover, the charging of the plasma sheath 123 during the state S1 increases a thickness of the plasma sheath 123 during the state S1. For example, as a number of plasma ions generated during the state S1 accumulate on the plasma sheath 123 during the state S1, there is an increase in a thickness of the plasma sheath 123 during the state S1. The charging occurs to add a portion of the power parameter level Px1 to the power parameter level Py2. The addition of the portion of the power parameter level Px1 to the power parameter level Py2 and the discharging of the capacitor during the state S2 increases ion energy of ions of plasma within the plasma chamber 108 during the state S2 and decreases an angular spread of the ion energy during the state S2. For example, a vertical directionality of plasma within the plasma chamber 108 increases during the state S2 with the addition of the portion of the power parameter level Px1 to the power parameter level Py2 during the state S2. Ion energy of plasma formed within the plasma chamber 108 is increased as a result of the addition of the portion of the power parameter level Px1 to the power parameter level Py2. A summed power parameter level, which includes the portion of the power parameter level Px1 and the power parameter level Px2, enhances the ion energy during the state S2. At least a portion of charge of the plasma sheath 123 that stores during the state S1 the enhanced ion energy is discharged during the state S2 from the top boundary 125A to the bottom boundary 125B of the plasma sheath 123 to decrease an angular spread of plasma ions incident on a top surface of the substrate 122 to further increase an etch rate of etching the substrate 122.

It should also be noted that during a time the RF generator RFGx operates at the frequency set point for the state S1, there is an increase in reactance of the plasma sheath 123 of plasma formed within the plasma chamber 108 during the state S1. The reactance of the plasma sheath 123 is inversely proportional to frequency of an RF generator that is operated to generate or maintain the plasma sheath 123. Because of high reactance of the plasma sheath 123 during the state S1 compared to the state S2, ion current through the plasma sheath 123 decreases during the state S1.

With the increase in the reactance of the plasma sheath 123, there is a decrease in the ion current of plasma ions at a surface of the substrate 122 during the state S1. A resistance R associated with the plasma sheath 123 is inversely proportional to square of the ion current for the same amount of power of plasma ions during the states S1 and S2. To deliver the same amount, such as a constant amount of power during the states S1 and S2, there is an increase in the resistance R associated with the plasma sheath 123 during the state S1 with the decrease in the ion current. The increased resistance R during the state S1 increases a time constant RC associated with the plasma sheath 123 during the state S1, prolonging an average time constant for the states S1 and S2 to enhance peak energy and reduce an angle, such as angular spread, in an ion energy and angular distribution function (IEADF), where C is a capacitance of the plasma sheath 123 and R is the resistance at an output of the plasma sheath 123. To illustrate, the output of the plasma sheath 123 is a portion of the plasma sheath 123 to which the ion current flows to. With the increase in the resistance R during the state S1, an average amount of resistance associated with the plasma sheath 123 during the states S1 and S2 increases. An average time constant for the states S1 and S2 increases with the increase in the average amount of resistance. With the increase in the average time constant, an amount of time taken for discharge of the plasma sheath 123 increases during any or both the states S1 and S2. The increase in the amount of time to discharge increases peak ion energy of plasma of plasma volume between the plasma sheath 123 during the states S1 and S2 and decreases an angular spread of ions of the plasma during the states S1 and S2.

Moreover, during the state S1, the plasma sheath 123 charges based on the power parameter level for the state S1. For example, during the state S1, the plasma sheath 123 acts as the capacitor and stores an amount of charge that is received from the modified RF signal generated based on the RF signal supplied by the RF generator RFGx. During the state S2, the charge generated within the plasma sheath 123 based on the power parameter level for the state S1, such as the portion of the power parameter level for the state S1, is added to a charge within the plasma sheath 123 based on the power parameter level for the state S2 to generate a total charge that corresponds to the summed power parameter level. The summed power parameter level is a total of the portion of the power parameter level for the state S1 and the power parameter level for the state S2. The total charge resides within the plasma sheath 123. The total charge discharges during the state S2 according to the time constant RC for discharging of the plasma sheath 123 that acts as the capacitor. For example, it takes time for the plasma sheath 123 to discharge but when continuous wave mode RF generator is used sheath does not have to discharge during plasma operation. As a result of the discharge, there is an increase in ion energy that is incident on a surface of the substrate 122 to increase a vertical directionality of plasma ions of plasma formed within the plasma chamber 108, to decrease an angular spread of the plasma ions, and to increase a rate of processing, such as an etch rate or a sputtering rate, the substrate 122.

In some embodiments, the portion of the power parameter level for the state S1 is referred to herein as additive power.

Figure 1C:
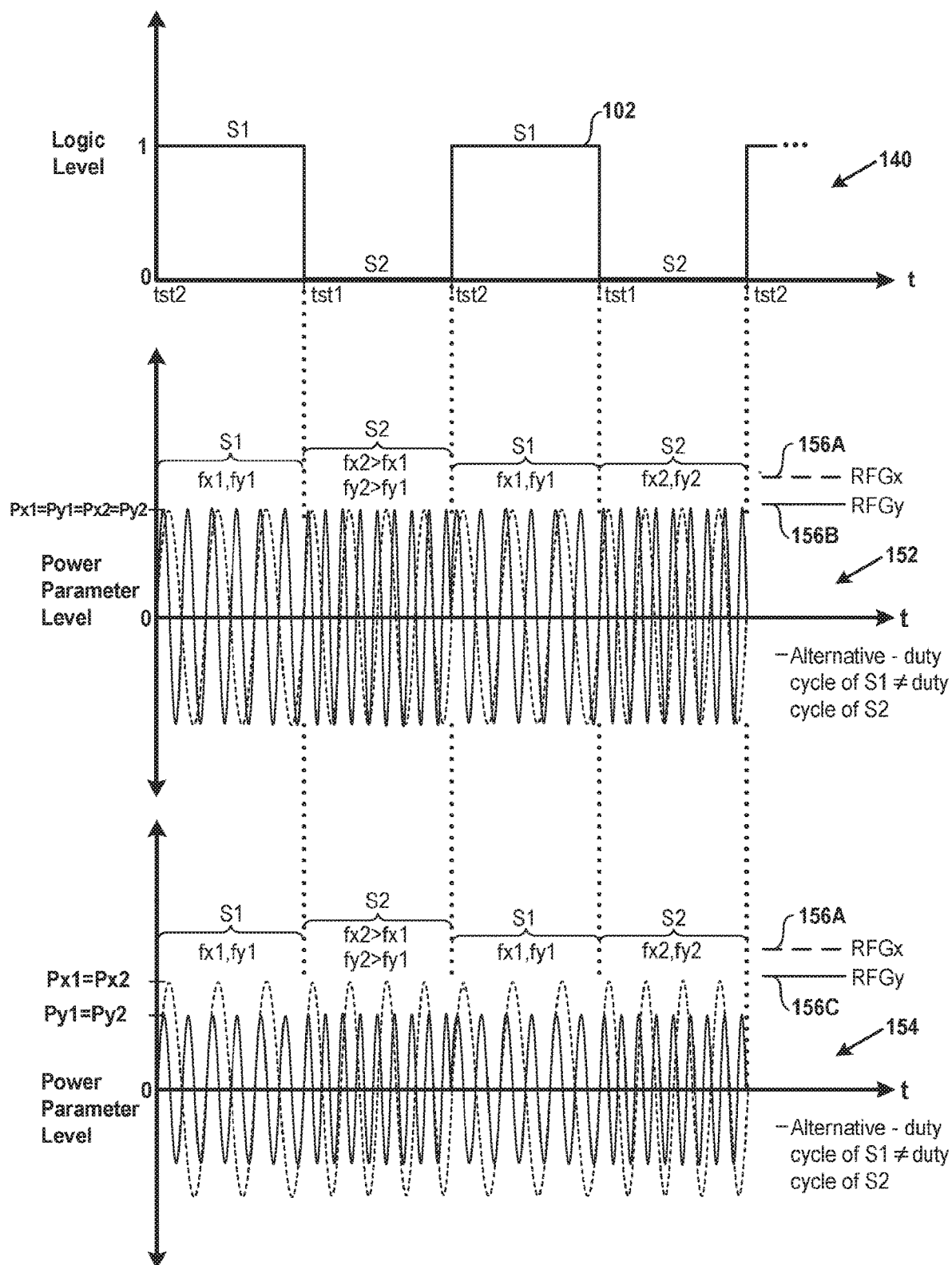
FIG. 1C is a diagram of embodiments of graphs to illustrate the frequency level two-state pulsing in which both states are non-zero states.

FIG. 1C is a diagram of embodiments of graphs 140, 152, and 154. The graph 152 plots a power parameter level, such as a voltage level or a power level, of the RF signal, such as an RF signal 156A, that is generated and supplied by the RF generator RFGx versus the time t. Moreover, the graph 152 plots the power parameter level of the RF signal, such as an RF signal 156B, generated and supplied by the RF generator RFGy versus the time t. Also, the graph 154 plots the power parameter level of the RF signal 156A versus the time t. The graph 154 furthermore plots the power parameter level of the RF signal, such as an RF signal 156C, generated and supplied by the RF generator RFGy versus the time t.

With reference to graphs 140 and 152, during the state S1, the RF signal 156A has the power parameter level of Px1 and the RF signal 156B has a power parameter level of Py1, which is non-zero. Also, during the state S1, the RF signal 156A has the frequency level of fx1 and the RF signal 156B has a frequency level of fy1, which is non-zero.

Furthermore, at the transition time tst1, each RF signal 156A and 156B transitions from the state S1 to the state S2. During the state S2, the RF signal 156A has a power parameter level of Px2 and the RF signal 156B has the power parameter level of Py2. Also, during the state S2, the RF signal 156A has a frequency level of fx2 and the RF signal 156B has the frequency level of fy2. The power parameter levels Px1, Px2, Py1, and Py2 are the same. Moreover, the frequency level fx2 is greater than the frequency level fx1 and the frequency level fy1 is lower than the frequency level fy2. At the transition time tst2, each RF signal 156A and 156B transitions from the state S2 back to the state S1.

In some embodiments, the frequency level fx2 of the RF signal 156A is lower than the frequency level fx1 of the RF signal 156A and the frequency level fy1 of the RF signal 156B is greater than the frequency level fy2 of the RF signal 156B. In several embodiments, the frequency level fx2 of the RF signal 156A is greater than the frequency level fx1 of the RF signal 156A and the frequency level fy1 of the RF signal 156B is greater than the frequency level fy2 of the RF signal 156B. In various embodiments, the frequency level fx2 of the RF signal 156A is lower than the frequency level fx1 of the RF signal 156A and the frequency level fy1 of the RF signal 156B is lower than the frequency level fy2 of the RF signal 156B.

It should be noted that a duty cycle of the state S1 of the pulsed signal 102 or the RF signal 156A or the RF signal 156B is the same as a duty cycle of the state S2 of the pulsed signal 102 or the RF signal 156A or the RF signal 156B. For example, the duty cycle of the state S1 is 50% and the duty cycle of the state S2 is 50%. The state S1 of the RF signal 156A or the RF signal 156B occupies 50% of the cycle of the pulsed signal 102 and the state S2 of the RF signal 156A or the RF signal 156B occupies the remaining 50% of the cycle of the pulsed signal 102.

In various embodiments, a duty cycle of the state S1 of a signal, such as the pulsed signal 102 or the RF signal 156A or the RF signal 156B, is different from a duty cycle of the state S2 of the signal. For example, the duty cycle of the state S1 is 25% and the duty cycle of the state S2 is 75%. The state S1 of the RF signal 156A or the RF signal 156B occupies 25% of the cycle of the pulsed signal 102 and the state S2 of the RF signal 156A or the RF signal 156B occupies the remaining 75% of the cycle of the pulsed signal 102. As another example, the duty cycle of the state S1 is a % and the duty cycle of the state S2 is (100–a) %. The state S1 of the RF signal 156A or the RF signal 156B occupies a % of the cycle of the pulsed signal 102 and the state S2 of the RF signal 156A or the RF signal 156B occupies the remaining (100–a) % of the cycle of the pulsed signal 102.

The graph 154 is similar to the graph 152 except that the RF signals 156A and 156C have different power parameter levels. For example, the RF signal 156A has the power parameter levels of Px1 and Px2 during the states S1 and S2 and the RF signal 156C has the power parameter levels of Py1 and Py2 during the states S1 and S2. The power parameter levels Py1 and Py2 of the RF signal 156C during the states S1 and S2 are lower than the power parameter levels Px1 and Px2 of the RF signal 156A during the states S1 and S2. The power parameter level Px1 of the RF signal 156A is the same as the power parameter level Px2 of the RF signal 156A. Similarly, the power parameter level Py1 of the RF signal 156C is the same as the power parameter level Py2 of the RF signal 156C.

With reference to the graphs 150 and 154, during the state S1 of the RF signal 156C, the RF signal 156C has the power parameter level of Py1 and has the frequency level of fy1. Furthermore, at the transition time tst1, the RF signal 156C transitions from the state S1 to the state S2. During the state S2, the RF signal 156C has the power parameter level of Py2. Also, during the state S2, the RF signal 156C has the frequency level of fy2. The frequency level of fy2 of the RF signal 156C is greater than the frequency level of fy1 of the RF signal 156C. At the transition time tst2, each RF signal 156A and 156C transitions from the state S2 back to the state S1.

In some embodiments, the frequency level fx2 of the RF signal 156A is lower than the frequency level fx1 of the RF signal 156A and the frequency level fy1 of the RF signal 156C is greater than the frequency level fy2 of the RF signal 156C. In several embodiments, the frequency level fx2 of the RF signal 156A is greater than the frequency level fx1 of the RF signal 156A and the frequency level fy1 of the RF signal 156C is greater than the frequency level fy2 of the RF signal 156C. In various embodiments, the frequency level fx2 of the RF signal 156A is lower than the frequency level fx1 of the RF signal 156A and the frequency level fy1 of the RF signal 156C is lower than the frequency level fy2 of the RF signal 156C.

It should be noted that a duty cycle of the state S1 of the RF signal 156C is the same as a duty cycle of the state S2 of the RF signal 156C. For example, the duty cycle of the state S1 of the RF signal 156C is 50% and the duty cycle of the state S2 of the RF signal 156C is 50%. The state S1 of the RF signal 156C occupies 50% of the cycle of the pulsed signal 102 and the state S2 of the RF signal 156C occupies the remaining 50% of the cycle of the pulsed signal 102.

In various embodiments, a duty cycle of the state S1 of the RF signal 156C is different from a duty cycle of the state S2 of the RF signal 156C. For example, the duty cycle of the state S1 of the RF signal 156C is 25% and the duty cycle of the state S2 of the RF signal 156C is 75%. The state S1 of the RF signal 156C occupies 25% of the cycle of the pulsed signal 102 and the state S2 of the RF signal 156C occupies the remaining 75% of the cycle of the pulsed signal 102. As another example, the duty cycle of the state S1 of the RF signal 156C is a % and the duty cycle of the state S2 of the RF signal 156C is (100–a) %. The state S1 of the RF signal 156C occupies a % of the cycle of the pulsed signal 102 and the state S2 of the RF signal 156C occupies the remaining (100–a) % of the cycle of the pulsed signal 102.

In some embodiments, the power parameter levels Py1 and Py2 of the RF signal 156C are greater than the power parameter levels Px1 and Px2 of the RF signal 156A.

In various embodiments, the power parameter level of the RF signal 156C is pulsed between the states S1 and S2 in additional to pulsing the frequency level of the RF signal 156C. For example, Py1 of the RF signal 156C during the state S1 is different from, such as greater than or less than, the power parameter level Py2 of the RF signal 156C during the state S2.

In some embodiments, the power parameter level of the RF signal 156A is pulsed between the states S1 and S2 in addition to pulsing the frequency level of the RF signal 156A. For example, the power parameter level Px1 of the RF signal 156A during the state S1 is different from, such as greater than or less than, the power parameter level Px2 of the RF signal 156A during the state S2.

It should be noted that the power parameter levels Px1, Px2, Py1, and Py2 are non-zero as illustrated in the graph 152. Moreover, the frequency levels fx1, fx2, fy1, and fy2 are non-zero as illustrated in the graph 152. Also, the power parameter levels Px1, Px2, Py1, and Py2 are non-zero as illustrated in the graph 154. Moreover, the frequency levels fx1, fx2, fy1, and fy2 are non-zero as illustrated in the graph 154.

Figure 2A:
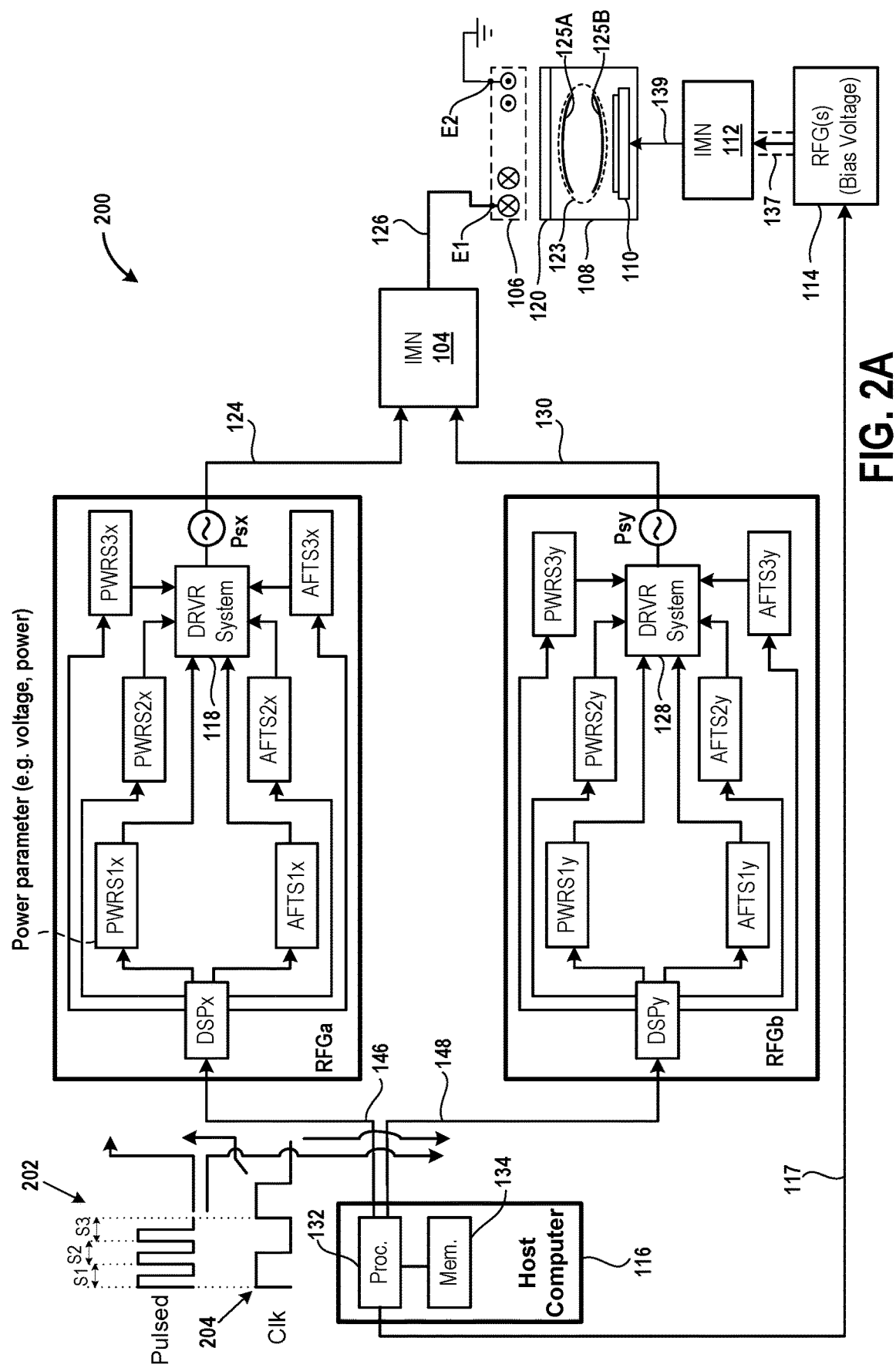
FIG. 2A is a block diagram of an embodiment of a plasma tool to illustrate frequency level three-state pulsing for achieving peak ion energy enhancement with a low angular spread.

FIG. 2A is a block diagram of an embodiment of a plasma tool 200 for achieving peak ion energy enhancement with a low angular spread. The plasma tool 200 is similar to the plasma tool 100 except that the plasma tool 200 is associated with three state operation of a pulsed signal 202 rather than two state operation of the pulsed signal 102 (FIG. 1A). The plasma tool 200 includes an RF generator RFGa, another RF generator RFGb, the host computer 116, the IMN 104, the plasma chamber 108, the IMN 112, and the bias RF generator system 114. The RF generator RFGa is a low frequency RF generator, such as a 400 kHz RF generator or a 2 MHz RF generator, or a 13.56 MHz RF generator. The RF generator RFGb is a high frequency RF generator. Examples of the RF generator RFGb include a 2 MHz, or a 13.56 MHz, or a 27 MHz, or a 60 MHz RF generator. The RF generator RFGb operates at a higher frequency than the RF generator RFGa.

The RF generator RFGa includes the DSPx, the power controller PWRS1x, the power controller PWRS2x, yet another power controller PWRS3x, the auto frequency tuner AFTS1x, the auto frequency tuner AFTS2x, still another auto frequency tuner AFTS3x, the RF power supply Psx, and the driver system 118.

The DSPx is coupled to the power controllers PWRS1x, PWRS2x, and PWRS3x, and to the auto-frequency tuners AFTS1x, AFTS2x, and AFTS3x. Moreover, the power controllers PWRS1x, PWRS2x, and PWRS3x and the auto-frequency tuners AFTS1x, AFTS2x, and AFTS3x are coupled to the driver system 118. The driver system 118 is coupled to the RF power supply Psx, which is coupled to the RF cable 124 via an output of the RF generator RFGa.

The RF generator RFGb includes the DSPy, the power controller PWRS1y, the power controller PWRS2y, yet another power controller PWRS3y, the auto frequency tuner AFTS1y, and the auto frequency tuner AFTS2y. The RF generator RFGb further includes another auto frequency tuner AFTS3y, the RF power supply Psy, and the driver system 128. The DSPy is coupled to the power controllers PWRS1y, PWRS2y, and PWRS3y, and to the auto-frequency tuners AFTS1y, AFTS2y, and AFTS3y. Moreover, the power controllers PWRS1y, PWRS2y, and PWRS3y and the auto-frequency tuners AFTS1y, AFTS2y, and AFTS3y are coupled to the driver system 132. The driver system 132 is coupled to the RF power supply Psy, which is coupled to the RF cable 130 via an output of the RF generator RFGb.

A control circuit of the processor 132 is used to generate a pulsed signal 202, e.g., a TTL signal, a digital pulsing signal, a square-shaped waveform, a pulsed signal having three duty cycles for the three states S1 through S3, etc. Examples of the control circuit of the processor 132 used to generate the pulsed signal 202 include a TTL circuit.

The pulsed signal 202 includes the states S1, S2, and S3. For example, the state S1 of the pulsed signal 202 has a logic level of one during a portion of a clock cycle of a clock signal 204 and a logic level of zero during another portion of the clock cycle, the state S2 of the pulsed signal 202 has a logic level of one during a portion of the clock cycle and a logic level of zero during another portion of the clock cycle, the state S3 of the pulsed signal 202 has a logic level of one during a portion of the clock cycle and a logic level of zero during another portion of the clock cycle. In various embodiments, the states S1, S2, and S3 execute once during a clock cycle of the pulsed signal 202 and repeat with multiple clock cycles. For example, the clock cycle includes the states S1 through S3 and another clock cycle of the clock signal 204 includes the states S1 through S3. To illustrate, during a portion of a period of a clock cycle, the state S1 is executed, during another period of the clock cycle, the state S2 is executed, and during remaining portion of the period of the clock cycle, the state S3 is executed.

In some embodiments, each of the states S1 through S3 has a one-third duty cycle. In several embodiments, each of the states S1 through S3 has a different duty cycle than a duty cycle of any of remaining of the states S1 through S3. For example, the state S1 has an a % duty cycle, the state S2 has a duty cycle of b %, and the state S3 has a duty cycle of (100−a−b) %, where a and b are positive integers and where a is a different number than b.

In various embodiments, instead of the control circuit of the processor 132 for generating the pulsed signal 202, a clock source, e.g., a crystal oscillator, etc., is used to generate an analog clock signal, which is converted by an analog-to-digital converter into a digital signal similar to the pulsed signal 202. For example, the crystal oscillator is made to oscillate in an electric field by applying a voltage to an electrode near the crystal oscillator. To illustrate, the crystal oscillator oscillates at a first frequency during a first portion of the clock cycle of the clock signal 204, at a second frequency during a second portion of the clock cycle of the clock signal 204, and at a third frequency during a remaining portion of the clock cycle of the clock signal 204. The third frequency is different from the second frequency, which is different from the first frequency. In some embodiments, the first frequency is the same as the second frequency but is different from the third frequency. In various embodiments, the first frequency is the same as the third frequency but is different from the second frequency. In various embodiments, instead of the processor 132, a digital clock source generates the pulsed signal 202.

The processor 132 accesses a recipe from the memory device 144. Examples of the recipe include a power parameter set point to be applied to the RF generator RFGa for the state S1, a power parameter set point to be applied to the RF generator RFGa for the state S2, a power parameter set point to be applied to the RF generator RFGa for the state S3, a frequency set point to be applied to the RF generator RFGa for the state S1, a frequency set point to be applied to the RF generator RFGa for the state S2, a frequency set point to be applied to the RF generator RFGa for the state S3, a power parameter set point to be applied to the RF generator RFGb for the state S1, a power parameter set point to be applied to the RF generator RFGb for the state S2, a power parameter set point to be applied to the RF generator RFGb for the state S3, a frequency set point to be applied to the RF generator RFGb for the state S1, a frequency set point to be applied to the RF generator RFGb for the state S2, a frequency set point to be applied to the RF generator RFGb for the state S3, a chemistry of the one or more process gases, or a combination thereof.

The processor 132 sends an instruction with the pulsed signal 202 to the DSPx via the cable 146. The instruction sent to the DSPx via the cable 146 has information regarding the pulsed signal 202, the power parameter set point to be applied to the RF generator RFGa for the state S1, the power parameter set point to be applied to the RF generator RFGa for the state S2, the power parameter set point to be applied to the RF generator RFGa for the state S3, the frequency set point to be applied to the RF generator RFGa for the state S1, the frequency set point to be applied to the RF generator RFGa for the state S2, and the frequency set point to be applied to the RF generator RFGa for the state S3. The information regarding the pulsed signal 202 indicates to the DSPx that the RF signal to be generated by the RF generator RFGa is to transition from the state S1 to the state S2 at a transition time ts1 of the clock cycle, that the RF signal is to transition from the state S2 to the state S3 at a transition time ts2 of the clock cycle, and that the RF signal is to transition from the state S3 to the state S1 at a transition time ts3 of the clock cycle. The DSPx determines from the instruction that the power parameter set point for the state S1 is to be applied during the state S1 of the pulsed signal 202, the power parameter set point for the state S2 is to be applied during the state S2 of the pulsed signal 202, the power parameter set point for the state S3 is to be applied during the state S3 of the pulsed signal 202, the frequency set point for the state S1 is to be applied during the state S1 of the pulsed signal 202, the frequency set point for the state S2 is to be applied during the state S2 of the pulsed signal 202, and the frequency set point for the state S3 is to be applied during the state S3 of the pulsed signal 202. Moreover, the DSPx determines from the instruction and the pulsed signal 202, that the RF signal to be generated by the RF generator RFGa is to transition from the state S1 to the state S2 at the transition time ts1 of the clock cycle, that the RF signal is to transition from the state S2 to the state S3 at the transition time ts2 of the clock cycle, and that the RF signal is to transition from the state S3 to the state S1 at the transition time ts3 of the clock cycle. The transition times ts1 through ts3 repeat for each clock cycle of the clock signal 204.

At the transition time ts3 of the clock cycle of the clock signal 204, the DSPx sends the power parameter set point for the state S1 to the power controller PWRS1x. Similarly, at the transition time ts1 of the clock cycle of the clock signal

204, the DSPx sends the power parameter set point for the state S2 to the power controller PWRS2x. Also, at the transition time ts2 of the clock cycle of the clock signal 204, the DSPx sends the power parameter set point for the state S3 to the power controller PWRS3x. Moreover, at the transition time ts3 of the clock cycle, the DSPx sends the frequency set point for the state S1 to the auto-frequency tuner AFTS1x. Also, at the transition time ts1 of the clock cycle, the DSPx sends the frequency set point for the state S2 to the auto-frequency tuner AFTS2x. Moreover, at the transition time ts2 of the clock cycle, the DSPx sends the frequency set point for the state S3 to the auto-frequency tuner AFTS3x.

Upon receiving the power parameter set point for the state S1, the power controller PWRS1x determines an amount of current corresponding to the power parameter set point for the state S1. Based on the amount of current that is to be generated by the driver system 118 during the state S1, the power controller PWRS1x generates a command signal and sends the command signal to the driver system 118. For the state S1, in response to receiving the command signal, the driver system 118 generates and sends a current signal having the amount of current to the RF power supply Psx. The RF power supply Psx, upon receiving the current signal generates the RF signal having the power parameter set point for the state S1 and supplies the RF signal via the output of the RF generator RFGa and the RF cable 124 to the input of the IMN 104. The power parameter set point for the state S1 is maintained during the state S1 by the RF power supply Psx of the RF generator RFGa.

Similarly, upon receiving the power parameter set point for the state S2, the power controller PWRS2x determines an amount of current corresponding to the power parameter set point for the state S2. Based on the amount of current that is to be generated by the driver system 118 during the state S2, the power controller PWRS2x generates a command signal and sends the command signal to the driver system 118. For the state S2, in response to receiving the command signal, the driver system 118 generates and sends a current signal having the amount of current to the RF power supply Psx. The RF power supply Psx, upon receiving the current signal generates the RF signal having the power parameter set point for the state S2 and supplies the RF signal via the output of the RF generator RFGa and the RF cable 124 to the input of the IMN 104. The power parameter set point for the state S2 is maintained during the state S2 by the RF power supply Psx of the RF generator RFGa.

Moreover, upon receiving the power parameter set point for the state S3, the power controller PWRS3x determines an amount of current corresponding to the power parameter set point for the state S3. Based on the amount of current that is to be generated by the driver system 118 during the state S3, the power controller PWRS3x generates a command signal and sends the command signal to the driver system 118. For the state S3, in response to receiving the command signal, the driver system 118 generates and sends a current signal having the amount of current to the RF power supply Psx. The RF power supply Psx, upon receiving the current signal generates the RF signal having the power parameter set point for the state S3 and supplies the RF signal via the output of the RF generator RFGa and the RF cable 124 to the input of the IMN 104. The power parameter set point for the state S3 is maintained during the state S3 by the RF power supply Psx of the RF generator RFGa.

Moreover, upon receiving the frequency set point for the state S1, the auto-frequency tuner AFTS1x determines an amount of current corresponding to the frequency set point for the state S1. Based on the amount of current that is to be generated by the driver system 118 during the state S1, the auto-frequency tuner AFTS1x generates a command signal and sends the command signal to the driver system 118. For the state S1, in response to receiving the command signal, the driver system 118 generates and sends a current signal having the amount of current to the RF power supply Psx. The RF power supply Psx, upon receiving the current signal generates the RF signal having the frequency set point for the state S1 and supplies the RF signal via the output of the RF generator RFGa and the RF cable 124 to the input of the IMN 104. The frequency set point for the state S1 is maintained during the state S1 by the RF power supply Psx of the RF generator RFGa. The RF signal having the power parameter set point for the state S1 and the frequency set point for the state S1 is the RF signal generated by the RF generator RFGa during the state S1.

Similarly, upon receiving the frequency set point for the state S2, the auto-frequency tuner AFTS2x determines an amount of current corresponding to the frequency set point for the state S2. Based on the amount of current that is to be generated by the driver system 118 during the state S2, the auto-frequency tuner AFTS2x generates a command signal and sends the command signal to the driver system 118. For the state S2, in response to receiving the command signal, the driver system 118 generates and sends a current signal having the amount of current to the RF power supply Psx. The RF power supply Psx, upon receiving the current signal generates the RF signal having the frequency set point for the state S2 and supplies the RF signal via the output of the RF generator RFGa and the RF cable 124 to the input of the IMN 104. The frequency set point for the state S2 is maintained during the state S2 by the RF power supply Psx of the RF generator RFGa. The RF signal having the power parameter set point for the state S2 and the frequency set point for the state S2 is the RF signal generated by the RF generator RFGa during the state S2.

Moreover, upon receiving the frequency set point for the state S3, the auto-frequency tuner AFTS3x determines an amount of current corresponding to the frequency set point for the state S3. Based on the amount of current that is to be generated by the driver system 118 during the state S3, the auto-frequency tuner AFTS3x generates a command signal and sends the command signal to the driver system 118. For the state S3, in response to receiving the command signal, the driver system 118 generates and sends a current signal having the amount of current to the RF power supply Psx. The RF power supply Psx, upon receiving the current signal generates the RF signal having the frequency set point for the state S3 and supplies the RF signal via the output of the RF generator RFGa and the RF cable 124 to the input of the IMN 104. The frequency set point for the state S3 is maintained during the state S3 by the RF power supply Psx of the RF generator RFGa. The RF signal having the power parameter set point for the state S3 and the frequency set point for the state S3 is the RF signal generated by the RF generator RFGa during the state S3.

The processor 132 sends an instruction with the pulsed signal 202 to the DSPy via the cable 148. The instruction sent to the DSPy via the cable 148 has information regarding the pulsed signal 202, the power parameter set point to be applied to the RF generator RFGb for the state S1, the power parameter set point to be applied to the RF generator RFGb for the state S2, the power parameter set point to be applied to the RF generator RFGb for the state S3, the frequency set point to be applied to the RF generator RFGb for the state S1, the frequency set point to be applied to the RF generator RFGb for the state S2, and the frequency set point to be applied to the RF generator RFGb for the state S3. The information regarding the pulsed signal 202 indicates to the DSPy that the RF signal to be generated by the RF generator RFGb is to transition from the state S1 to the state S2 at the transition time ts1 of the clock cycle of the clock signal 204, that the RF signal is to transition from the state S2 to the state S3 at the transition time ts2 of the clock cycle, and that the RF signal is to transition from the state S3 to the state S1 at the transition time ts3 of the clock cycle. The DSPy parses the instruction and determines from the instruction that the power parameter set point for the state S1 is to be applied during the state S1 of the pulsed signal 202, the power parameter set point for the state S2 is to be applied during the state S2 of the pulsed signal 202, the power parameter set point for the state S3 is to be applied during the state S3 of the pulsed signal 202, the frequency set point for the state S1 is to be applied during the state S1 of the pulsed signal 202, the frequency set point for the state S2 is to be applied during the state S2 of the pulsed signal 202, and the frequency set point for the state S3 is to be applied during the state S3 of the pulsed signal 202. Moreover, the DSPy determines from the instruction that the RF signal to be generated by the RF generator RFGb is to transition from the state S1 to the state S2 at the transition time is 1 of the clock cycle, that the RF signal is to transition from the state S2 to the state S3 at the transition time ts2 of the clock cycle, and that the RF signal is to transition from the state S3 to the state S1 at the transition time ts3 of the clock cycle.

At the transition time ts3 of the clock cycle of the clock signal 204, the DSPy sends the power parameter set point for the state S1 to the power controller PWRS1y. Similarly, at the transition time ts1 of the clock cycle of the clock signal 204, the DSPy sends the power parameter set point for the state S2 to the power controller PWRS2y. Also, at the transition time ts2 of the clock cycle of the clock signal 204, the DSPy sends the power parameter set point for the state S3 to the power controller PWRS3y. Moreover, at the transition time ts3 of the clock cycle, the DSPy sends the frequency set point for the state S1 to the auto-frequency tuner AFTS1y. Also, at the transition time ts1 of the clock cycle, the DSPy sends the frequency set point for the state S2 to the auto-frequency tuner AFTS2y. Moreover, at the transition time ts2 of the clock cycle, the DSPy sends the frequency set point for the state S3 to the auto-frequency tuner AFTS3y.

Upon receiving the power parameter set point for the state S1, the power controller PWRS1y determines an amount of current corresponding to the power parameter set point for the state S1. Based on the amount of current that is to be generated by the driver system 128 during the state S1, the power controller PWRS1y generates a command signal and sends the command signal to the driver system 128. For the state S1, in response to receiving the command signal, the driver system 128 generates and sends a current signal having the amount of current to the RF power supply Psy. The RF power supply Psy, upon receiving the current signal generates the RF signal having the power parameter set point for the state S1 and supplies the RF signal via the output of the RF generator RFGb and the RF cable 130 to the other input of the IMN 104. The power parameter set point for the state S1 is maintained during the state S1 by the RF power supply Psy.

Similarly, upon receiving the power parameter set point for the state S2, the power controller PWRS2y determines an amount of current corresponding to the power parameter set point for the state S2. Based on the amount of current that is to be generated by the driver system 128 during the state S2, the power controller PWRS2y generates a command signal and sends the command signal to the driver system 128. For the state S2, in response to receiving the command signal, the driver system 128 generates and sends a current signal having the amount of current to the RF power supply Psy. The RF power supply Psy, upon receiving the current signal generates the RF signal having the power parameter set point for the state S2 and supplies the RF signal via the output of the RF generator RFGb and the RF cable 130 to the other input of the IMN 104. The power parameter set point for the state S2 is maintained during the state S2 by the RF power supply Psy.

Moreover, upon receiving the power parameter set point for the state S3, the power controller PWRS3y determines an amount of current corresponding to the power parameter set point for the state S3. Based on the amount of current that is to be generated by the driver system 128 during the state S3, the power controller PWRS3y generates a command signal and sends the command signal to the driver system 128. For the state S3, in response to receiving the command signal, the driver system 128 generates and sends a current signal having the amount of current to the RF power supply Psy. The RF power supply Psy, upon receiving the current signal generates the RF signal having the power parameter set point for the state S3 and supplies the RF signal via the output of the RF generator RFGb and the RF cable 130 to the other input of the IMN 104. The power parameter set point for the state S3 is maintained during the state S3 by the RF power supply Psy.

Moreover, upon receiving the frequency set point for the state S1, the auto-frequency tuner AFTS1y determines an amount of current corresponding to the frequency set point for the state S1. Based on the amount of current that is to be generated by the driver system 128 during the state S1, the auto-frequency tuner AFTS1y generates a command signal and sends the command signal to the driver system 128. For the state S1, in response to receiving the command signal, the driver system 128 generates and sends a current signal having the amount of current to the RF power supply Psy. The RF power supply Psy, upon receiving the current signal generates the RF signal having the frequency set point for the state S1 and supplies the RF signal via the output of the RF generator RFGb and the RF cable 130 to the other input of the IMN 104. The frequency set point for the state S1 is maintained during the state S1 by the RF power supply Psy. The RF signal having the power parameter set point for the state S1 and the frequency set point for the state S1 is the RF signal generated by the RF generator RFGb during the state S1.

Similarly, upon receiving the frequency set point for the state S2, the auto-frequency tuner AFTS2y determines an amount of current corresponding to the frequency set point for the state S2. Based on the amount of current that is to be generated by the driver system 128 during the state S2, the auto-frequency tuner AFTS2y generates a command signal and sends the command signal to the driver system 132. For the state S2, in response to receiving the command signal, the driver system 132 generates and sends a current signal having the amount of current to the RF power supply Psy. The RF power supply Psy, upon receiving the current signal generates the RF signal having the frequency set point for the state S2 and supplies the RF signal via the output of the RF generator RFGb and the RF cable 130 to the other input of the IMN 104. The frequency set point for the state S2 is maintained during the state S2 by the RF power supply Psy. The RF signal having the power parameter set point for the state S2 and the frequency set point for the state S2 is the RF signal generated by the RF generator RFGb during the state S2.

Moreover, upon receiving the frequency set point for the state S3, the auto-frequency tuner AFTS3$y$ determines an amount of current corresponding to the frequency set point for the state S3. Based on the amount of current that is to be generated by the driver system 128 during the state S3, the auto-frequency tuner AFTS3$y$ generates a command signal and sends the command signal to the driver system 128. For the state S3, in response to receiving the command signal, the driver system 128 generates and sends a current signal having the amount of current to the RF power supply Psy. The RF power supply Psy, upon receiving the current signal generates the RF signal having the frequency set point for the state S3 and supplies the RF signal via the output of the RF generator RFGb and the RF cable 130 to the other input of the IMN 104. The frequency set point for the state S3 is maintained during the state S3 by the RF power supply Psy. The RF signal having the power parameter set point for the state S3 and the frequency set point for the state S3 is the RF signal generated by the RF generator RFGb during the state S3.

The IMN 104 receives, at the input, the RF signal generated by the RF generator RFGa via the RF cable 124 from the output of the RF generator RFGa, receives, at the other input, the RF signal generated by the RF generator RFGb via the RF cable 130 from the output of the RF generator RFGb, and matches an impedance of the load coupled to the output of the IMN 104 with an impedance of the source coupled to the inputs of the IMN 104 to generate a modified RF signal at the output of the IMN 104. The modified RF signal is sent via the RF transmission line 126 to the upper electrode 106. When the one or more process gases are supplied between the upper electrode 108 and the chuck 110, the modified RF signal is supplied to the upper electrode 108, and the output RF signal is supplied to the chuck 110, the one or more process gases are ignited to generate plasma within the plasma chamber 108 or the plasma is maintained within the plasma chamber 108.

In various embodiments, the power controllers PWRS1$x$, PWRS2$x$, and PWRS3$x$, and the auto-frequency tuners AFTS1$x$, AFTS2$x$, and AFTS3$x$ are modules, e.g., portions, etc., of a computer program that is executed by the DSPx of the RF generator RFGa.

In several embodiments, the power controllers PWRS1$x$, PWRS2$x$, and PWRS3$x$, and the auto-frequency tuners AFTS1$x$, AFTS2$x$, and AFTS3$x$ are separate integrated circuits that are coupled to an integrated circuit of the DSPx of the RF generator RFGa. For example, the power controller PWRS1$x$ is a first integrated circuit of the RF generator RFGa, the power controller PWRS2$x$ is a second integrated circuit of the RF generator RFGa, the power controller PWRS3$x$ is a third integrated circuit of the RF generator RFGa, the auto-frequency tuner AFTS1$x$ is a fourth integrated circuit of the RF generator RFGa, the auto-frequency tuner AFTS2$x$ is a fifth integrated circuit of the RF generator RFGa, the auto-frequency tuner AFTS3$x$ is a sixth integrated circuit of the RF generator RFGa, and the DSPx is a seventh integrated circuit of the RF generator RFGa. Each of the first through sixth integrated circuit of the RF generator RFGa is coupled to the seventh integrated circuit of the RF generator RFGa.

In some embodiments, the power controllers PWRS1$y$, PWRS2$y$, and PWRS3$y$, and the auto-frequency tuners AFTS1$y$, AFTS2$y$, and AFTS3$y$ are modules, e.g., portions, etc., of a computer program that is executed by the DSPy of the RF generator RFGb.

In various embodiments, the power controllers PWRS1$y$, PWRS2$y$, and PWRS3$y$, and the auto-frequency tuners AFTS1$y$, AFTS2$y$, and AFTS3$y$ are separate integrated circuits that are coupled to an integrated circuit of the DSPy of the RF generator RFGb. For example, the power controller PWRS1$y$ is a first integrated circuit of the RF generator RFGb, the power controller PWRS2$y$ is a second integrated circuit of the RF generator RFGb, the power controller PWRS3$y$ is a third integrated circuit of the RF generator RFGb, the auto-frequency tuner AFTS1$y$ is a fourth integrated circuit of the RF generator RFGb, the auto-frequency tuner AFTS2$y$ is a fifth integrated circuit of the RF generator RFGb, the auto-frequency tuner AFTS3$y$ is a sixth integrated circuit of the RF generator RFGb, and the DSPy is a seventh integrated circuit of the RF generator RFGb. Each of the first through sixth integrated circuit of the RF generator RFGb is coupled to the seventh integrated circuit of the RF generator RFGb.

In some embodiments, an example of the state S3 of the RF signal includes the power parameter set point for the state S3 and the frequency set point for the state S3. The power parameter set point for the state S3 is an operational power parameter set point, which is a power parameter level, such as an envelope or a zero-to-peak magnitude, of power amounts or voltage amounts of the RF signal during the state S3. The frequency set point for the state S3 is an operational frequency set point, which is a frequency level, such as an envelope or a zero-to-peak magnitude, of frequency values of the RF signal during the state S3.

In various embodiments, the clock signal 204 is generated by the processor 132 or by a clock source, examples of which are provided above. In some embodiments, the clock signal 204 is sent from the processor 132 via the cable 146 to the DSPx of the RF generator RFGa and via the cable 148 to the DSPy of the RF generator RFGb.

In some embodiments, instead of the pulsed signal 202 being sent from the processor 132 to the RF generators RFGa and RFGb, the pulsed signal 202 is sent from a master RF generator to a slave RF generator, such as the RF generator RFGb. An example of the master RF generator includes the RF generator RFGa. To illustrate, the digital signal processor DSPx of the RF generator RFGa receives the pulsed signal 202 from the processor 132 and sends the pulsed signal 202 via a cable, such as a parallel transfer cable, a serial transfer cable, or a USB cable, to the digital signal processor DSPy of the RF generator RFGb.

Figure 2B:
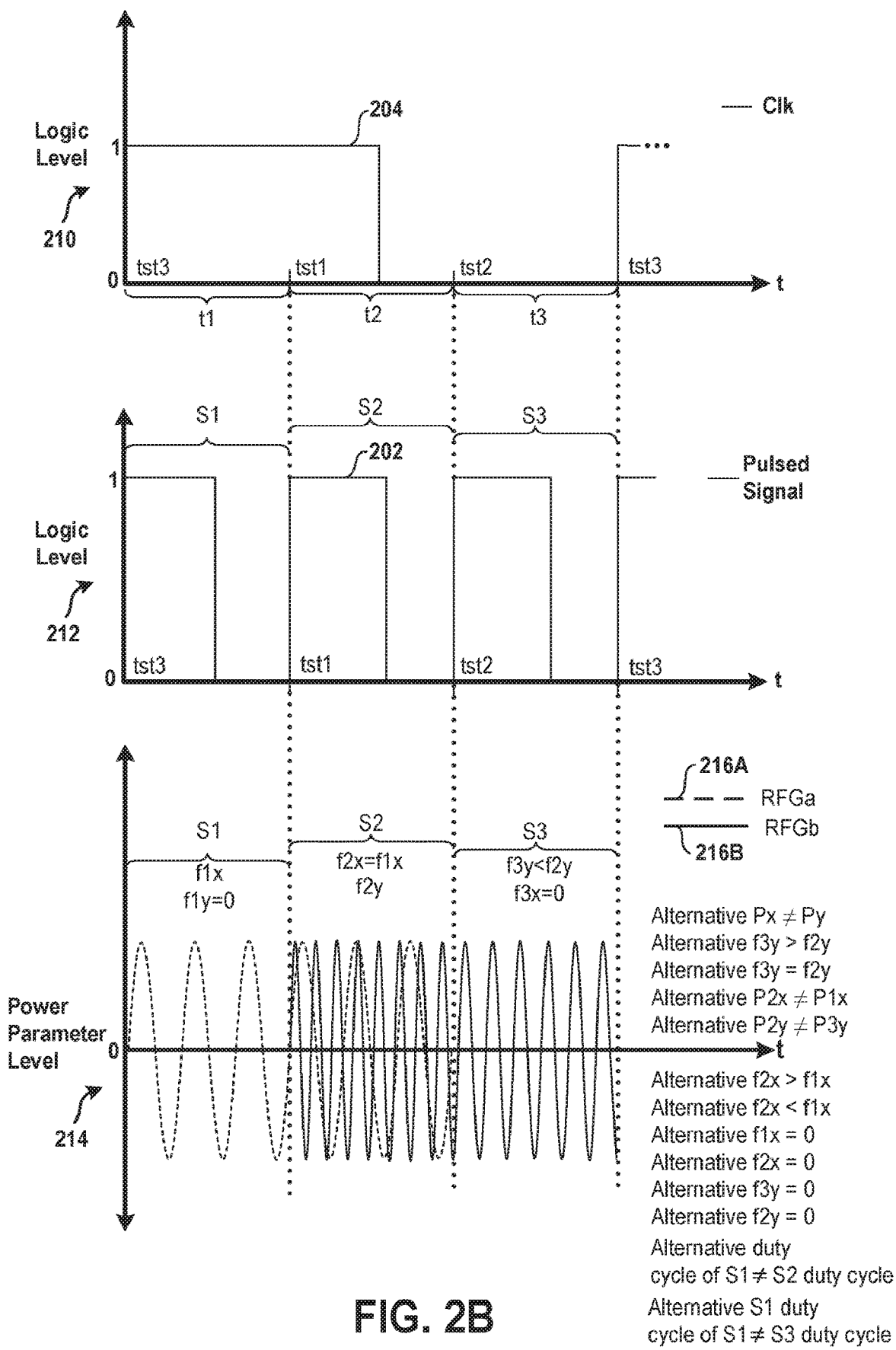
FIG. 2B is a diagram of embodiments of graphs to illustrate the frequency level three-state pulsing.

FIG. 2B is a diagram of embodiments of graphs 210, 212, and 214 to illustrate the states S1, S2, and S2 of the RF signal, such as an RF signal 216A, generated and supplied by the RF generator RFGa and of the RF signal, such as an RF signal 216B, generated and supplied by the RF generator RFGb. The graph 210 plots a logic level of the clock signal 204 versus the time t. Similarly, the graph 212 plots a logic level of the pulsed signal 202 versus the time t.

A time period t1 is a period of time during the clock cycle of the clock signal 204 for which the state S1 of the RF signals generated by the RF generators RFGa and RFGb is maintained. Similarly, a time period t2 is a period of time during the clock cycle of the clock signal 204 for which the state S2 of the RF signals generated by the RF generators RFGa and RFGb is maintained. Also, a time period t3 is a period of time during the clock cycle of the clock signal 204 for which the state S3 of the RF signals generated by the RF generators RFGa and RFGb is maintained. For example, the time period t1 occupies a portion of the clock cycle, the time period t2 occupies another portion of the clock cycle, and the time period t3 occupies the remaining portion of the clock cycle. The clock cycle of the clock signal 204 is made of the time periods t1 through t3 and repeats to create multiple clock cycles of the clock signal 204.

During the time period t1, the pulsed signal 202 pulses from a logic level 1 to a logic level 0. The logic level is an example of a high logic level and the logic level 0 is an example of a low logic level. During the time period t1, the RF signals generated by the RF generators RFGa and RFGb are controlled to maintain the state S1.

At the transition time ts1 of the clock cycle at which the pulsed signal 202 transitions from the logic level 0 to the logic level 1, the RF signals generated by the RF generators RFGa and RFGb are controlled to transition from the state S1 to the state S2. The transition time ts1 occurs after the time period t1.

The time period t2 occurs after the transition time is 1. During the time period t2, the pulsed signal 202 pulses from the logic level 1 to the logic level 0. Moreover, during the time period t2, the RF signals generated by the RF generators RFGa and RFGb are controlled to maintain the state S2.

At the transition time ts2 of the clock cycle at which the pulsed signal 202 transitions from the logic level 0 to the logic level 1, the RF signals generated by the RF generators RFGa and RFGb are controlled to transition from the state S2 to the state S3. The transition time ts2 occurs after the time period t2.

The time period t3 occurs after the transition time ts2. During the time period t3, the pulsed signal 202 pulses from the logic level 1 to the logic level 0. Moreover, during the time period t3, the RF signals generated by the RF generators RFGa and RFGb are controlled to maintain the state S3.

At the transition time ts3 of the clock cycle at which the pulsed signal 102 transitions from the logic level 0 to the logic level 1, the RF signals generated by the RF generators RFGa and RFGb are controlled to transition from the state S3 to the state S1. The transition time ts3 occurs after the time period t3. The time period t1 repeats after the transition time ts3 during a consecutive clock cycle of the clock signal 204. The time period t1 during the consecutive clock cycle of the clock signal 204 is again followed by the time periods t2 and t3 of the consecutive clock cycle of the clock signal 204. The consecutive clock cycle of the clock signal 204 is consecutive, such as continuously follows or sequentially follows, the clock cycle of the clock signal 204. The transition times ts1 through ts3 and the time periods t1 through t3 repeat for the consecutive clock cycle. Moreover, the transition times ts1 through ts3 and the time periods t1 through t3 repeat for following cycles of the clock signal 204 that repeat after the consecutive cycle.

The states S1 through S3 of the RF signals 216A and 216B repeat in synchronization with each cycle of the clock signal 204. For example, the states S1 through S3 of the RF signal 216A occur during the clock cycle of the clock signal 204 and the states S1 through S3 of the RF signal 216A repeat during the consecutive clock cycle of the clock signal 204. As another example, the states S1 through S3 of the RF signal 216B occur during the clock cycle of the clock signal 204 and the states S1 through S3 of the RF signal 216B repeat during the consecutive clock cycle of the clock signal 204.

The RF signal 216A has a frequency level of f1$x$ during the state S1 and has a power parameter level of P1$x$ during the state S1. Moreover, the RF signal 216B has a frequency level f1y of zero during the state S1 and has a power parameter level of P1y of zero during the state S1.

Similarly, the RF signal 216A has a frequency level of f2$x$ during the state S2 and has a power parameter level of P2$x$ during the state S2. The frequency level f2$x$ is the same as that of the frequency level f1$x$ and the power parameter level P2$x$ is the same as that of the power parameter level P1$x$. Moreover, the RF signal 216B has a frequency level of f2$y$ during the state S2 and has a power parameter level of P2$y$ during the state S2. The power parameter level P2$y$ is the same as the power parameter level P2$x$. The frequency level f2$y$ is greater than the frequency level f2$x$.

Similarly, the RF signal 216A has a frequency level of f3$x$ of zero during the state S3 and has a power parameter level P3$x$ of zero during the state S3. Moreover, the RF signal 216B has a frequency level of f3$y$ during the state S3 and has a power parameter level of P3$y$ during the state S3. The frequency level f3$y$ is lower than the frequency level f2$y$ and is greater than the frequency level f2$x$. Moreover, the power parameter level P3$y$ is the same as the power parameter level P2$y$.

It should be noted that the power parameter levels P1$x$, P2$x$, P2$y$, and P3$y$ are non-zero as illustrated in the graph 214. Similarly, the frequency levels f1$x$, f2$x$, f2$y$, and f3$y$ are non-zero as illustrated in the graph 214.

In some embodiments, the power parameter levels P2$y$ and P3$y$ are not the same as, such as lower than or greater than, the power parameter levels P1$x$ and P2$x$.

In various embodiments, the frequency level f3$y$ is greater than the frequency level f2$y$. In several embodiments, the frequency level f3$y$ is the same as the frequency level f2$y$. In some embodiments, the power parameter level P2$x$ is not the same as, such as is greater than or lower than, the power parameter level P1$x$. In various embodiments, the power parameter level P2$y$ is not the same as, such as is greater than or lower than, the power parameter level P3$y$.

In some embodiments, the frequency level f2$x$ is not the same as, such as is greater than or lower than, the frequency level f1$x$. In various embodiments, the frequency level f1$x$ and the power parameter level P1$x$ are zero. In some embodiments, the frequency level f2$x$ and the power parameter level P2$x$ are zero. In several embodiments, the frequency level f3$y$ and the power parameter level P3$y$ are zero. In some embodiments, the frequency level f2$y$ and the power parameter level P2$y$ are zero.

In some embodiments, each of the states S1 through S3 of the RF signal 216A or the RF signal 216B has a one-third duty cycle. In several embodiments, each of the states S1 through S3 of an RF signal, such as the RF signal 216A or the RF signal 216B, has a different duty cycle than a duty cycle of any of remaining of the states S1 through S3 of the RF signal. For example, the state S1 has of the RF signal an a % duty cycle, the state S2 of the RF signal has a duty cycle of b %, and the state S3 of the RF signal as a duty cycle of (100−a−b) %. To illustrate, a duty cycle of the state S1 of the RF signal is different from a duty cycle of the state S2 of the RF signal. As another illustration, a duty cycle of the state S1 of the RF signal is different from a duty cycle of the state S2 of the RF signal and the duty cycle of the states S1 of the RF signal is the same as a duty cycle of the state S3 of the RF signal. As another illustration, a duty cycle of the state S1 of the RF signal is different from a duty cycle of the state S3 of the RF signal. As yet another illustration, a duty cycle of the state S1 of the RF signal is different from a duty cycle of the state S3 of the RF signal and the duty cycle of the state S1 of the RF signal is the same as a duty cycle of the state S2 of the RF signal. As yet another illustration, a duty cycle of the state S2 of the RF signal is different from a duty cycle of the state S3 of the RF signal. As another illustration, a duty cycle of the state S2 of the RF signal is different from a duty cycle of the state S3 of the RF signal and the duty cycle of the state S2 of the RF signal is the same as a duty cycle of the state S1 of the RF signal.

It should be noted that the RF generator RFGa is controlled to operate at the frequency level f2x during the state S2. The power parameter of the RF signal generated by the RF generator RFGa during the state S2 is added to the power parameter of the RF signal generated by the RF generator RFGb during the state S3. The plasma sheath 123 of plasma formed within the plasma chamber 108 acts as the capacitor, which charges during the state S2 from the power parameter level P2x associated with the frequency level f2x and discharges during the state S3. The addition of the power parameters and the discharging of the capacitor increases ion energy of ions of plasma within the plasma chamber 108 during the state S3 and decreases an angular spread of the ion energy during the state S3. For example, a vertical directionality of plasma within the plasma chamber 108 increases during the state S3 with the addition of the power parameters during the state S3.

Figure 2C:
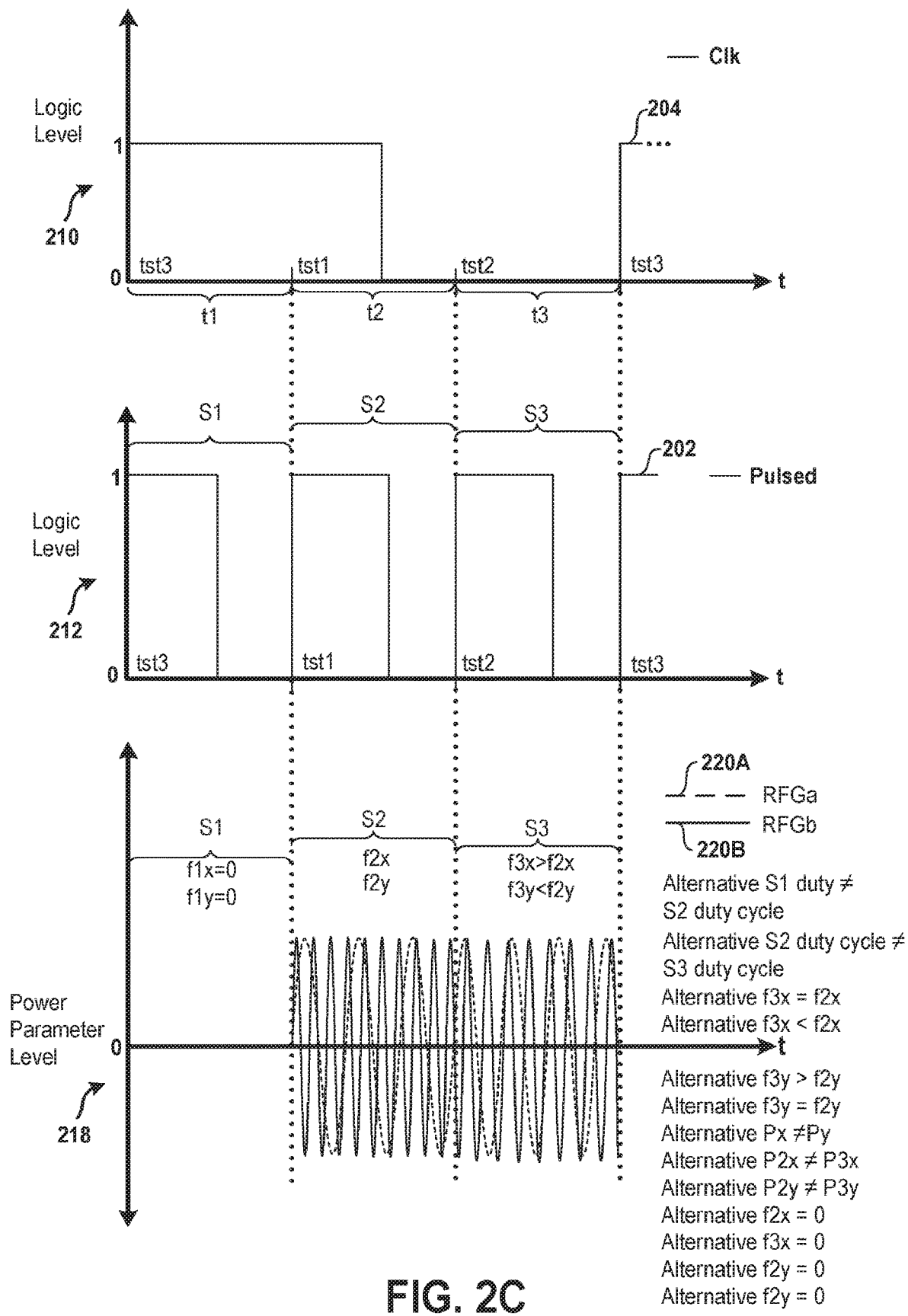
FIG. 2C is a diagram of embodiments of graphs to illustrate the frequency level three-state pulsing.

FIG. 2C is a diagram of embodiments of the graphs 210, 212, and a graph 218 to illustrate the states S1, S2, and S2 of the RF signal, such as an RF signal 220A, generated and supplied by the RF generator RFGa and of the RF signal, such as an RF signal 220B, generated and supplied by the RF generator RFGb.

The states S1 through S3 of the RF signals 220A and 220B repeat in synchronization with each cycle of the clock signal 204. For example, the states S1 through S3 of the RF signal 220A occur during the clock cycle of the clock signal 204 and the states S1 through S3 of the RF signal 220A repeat during the consecutive clock cycle of the clock signal 204. As another example, the states S1 through S3 of the RF signal 220B occur during the clock cycle of the clock signal 204 and the states S1 through S3 of the RF signal 220B repeat during the consecutive clock cycle of the clock signal 204.

The RF signal 220A has a frequency level f1x of zero during the state S1 and has a power parameter level P1x of zero during the state S1. Moreover, the RF signal 220B has a frequency level fly of zero during the state S1 and has a power parameter level of Ply of zero during the state S1.

Similarly, the RF signal 220A has a frequency level of f2x during the state S2 and has a power parameter level of P2x during the state S2. Moreover, the RF signal 220B has a frequency level of f2y during the state S2 and has a power parameter level of P2y during the state S2. The power parameter level P2y is the same as the power parameter level P2x and the frequency level f2y is greater than the frequency level f2x.

Similarly, the RF signal 220A has a frequency level of f3x during the state S3 and has a power parameter level P3x during the state S3. The frequency level f3x is greater than the frequency level f2x and the power parameter level P3x is the same as the power parameter level P2x. Moreover, the RF signal 220B has a frequency level of f3y during the state S3 and has a power parameter level of P3y during the state S3. The frequency level f3y is lower than the frequency level f2y. Moreover, the power parameter level P3y is the same as the power parameter level P2y. Also, the frequency level f3x is greater than the frequency level f2x.

In some embodiments, the power parameter levels P2y and P3y are not the same, such as lower than or greater than, the power parameter levels P2x and P3x.

In various embodiments, the frequency level f3x is the same as the frequency level f2x. In several embodiments, the frequency level f3x is lower than the frequency level f2x. In various embodiments, the frequency level f3y is greater than the frequency level f2y. In several embodiments, the frequency level f3y is the same as the frequency level f2y.

In some embodiments, the power parameter level P2x is not the same as, such as is greater than or lower than, the power parameter level P3x. In various embodiments, the power parameter level P2y is not the same as, such as is greater than or lower than, the power parameter level P3y.

In some embodiments, the frequency level f2x and the power parameter level P2x are zero. In various embodiments, the frequency level f3x and the power parameter level P3x are zero. In some embodiments, the frequency level f2y and the power parameter level P2y are zero. In several embodiments, the frequency level f3y and the power parameter level P3y are zero.

In some embodiments, each of the states S1 through S3 of the RF signal 220A or the RF signal 220B has a one-third duty cycle. In several embodiments, each of the states S1 through S3 of an RF signal, such as the RF signal 220A or the RF signal 220B, has a different duty cycle than a duty cycle of any of remaining of the states S1 through S3 of the RF signal. For example, the state S1 has of the RF signal an a % duty cycle, the state S2 of the RF signal has a duty cycle of b %, and the state S3 of the RF signal as a duty cycle of (100−a−b) %.

It should be noted that the RF generator RFGa is controlled to operate at the frequency level f2x during the state S2. The power parameter of the RF signal generated by the RF generator RFGa during the state S2 is added to the power parameter of the RF signal generated by the RF generator RFGb during the state S3. The plasma sheath 123 of plasma formed within the plasma chamber 108 acts as the capacitor, which charges during the state S2 from the power parameter level P2x associated with the frequency level f2x and discharges during the state S3. The addition of the power parameters and the discharging of the capacitor increases ion energy of ions of plasma within the plasma chamber 108 during the state S3 and decreases an angular spread of the ion energy during the state S3. For example, a vertical directionality of plasma within the plasma chamber 108 increases during the state S3 with the addition of the power parameters during the state S3.

It should be noted that the power parameter levels P2x, P3x, P2y, and P3y are non-zero as illustrated in the graph 218. Moreover, the frequency levels f2x, f3x, f2y, and f3y are non-zero as illustrated in the graph 218.

Figure 2D:
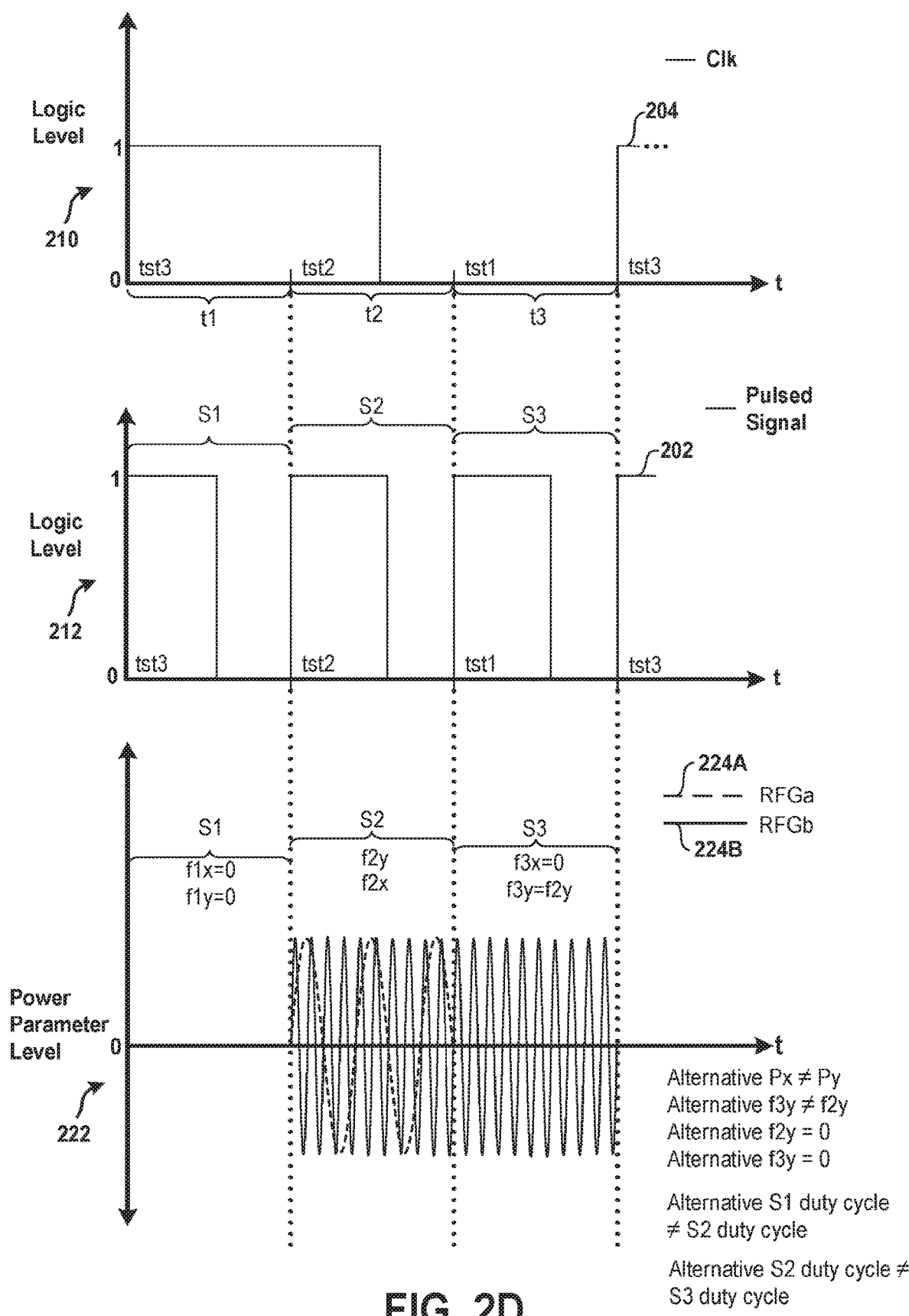
FIG. 2D is a diagram of embodiments of graphs to illustrate the frequency level three-state pulsing.

FIG. 2D is a diagram of embodiments of the graphs 210, 212, and a graph 222 to illustrate the states S1, S2, and S2 of the RF signal, such as an RF signal 224A, generated and supplied by the RF generator RFGa and of the RF signal, such as an RF signal 224B, generated and supplied by the RF generator RFGb.

The states S1 through S3 of the RF signals 224A and 224B repeat in synchronization with each cycle of the clock signal 204. For example, the states S1 through S3 of the RF signal 224A occur during the clock cycle of the clock signal 204 and the states S1 through S3 of the RF signal 224A repeat during the consecutive clock cycle of the clock signal 204. As another example, the states S1 through S3 of the RF signal 224B occur during the clock cycle of the clock signal 204 and the states S1 through S3 of the RF signal 224B repeat during the consecutive clock cycle of the clock signal 204.

The RF signal 224A has a frequency level f1x of zero during the state S1 and has a power parameter level P1x of zero during the state S1. Moreover, the RF signal 224B has a frequency level f1y of zero during the state S1 and has a power parameter level P1y of zero during the state S1.

Similarly, the RF signal 224A has a frequency level f2x during the state S2 and has a power parameter level P2x of zero during the state S2. Moreover, the RF signal 224B has a frequency level of f2y during the state S2 and has a power parameter level of P2y during the state S2. The frequency level f2y of the RF signal 224B is greater than the frequency level f2x of the RF signal 224A during the state S2 and the power parameter level P2y of the RF signal 224B is the same as the power parameter level P2x of the RF signal 224A during the state S2.

Similarly, the RF signal 224A has a frequency level f3x of zero during the state S3 and has a power parameter level P3x of zero during the state S3. Moreover, the RF signal 224B has a frequency level of f3y during the state S3 and has a power parameter level of P3y during the state S3. The frequency level f3y of the RF signal 224B during the state S3 is the same as the frequency level f2y of the RF signal 224B during the state S2. Moreover, the power parameter level P3y of the RF signal 224B during the state S3 is the same as the power parameter level P2y of the RF signal 224B during the state S2.

In some embodiments, the power parameter levels P2y and P3y are not the same as, such as lower than or greater than, the power parameter level P2x.

In various embodiments, the frequency level f3y is not the same as, such as is greater than or lower than, the frequency level f2y. In several embodiments, the frequency level f2y and the power parameter level P2y are zero. In various embodiments, the frequency level f3y and the power parameter level P3y are zero.

In some embodiments, each of the states S1 through S3 of the RF signal 224A or the RF signal 224B has a one-third duty cycle. In several embodiments, each of the states S1 through S3 of an RF signal, such as the RF signal 224A or the RF signal 224B, has a different duty cycle than a duty cycle of any of remaining of the states S1 through S3 of the RF signal. For example, the state S1 has of the RF signal an a % duty cycle, the state S2 of the RF signal has a duty cycle of b %, and the state S3 of the RF signal as a duty cycle of (100−a−b) %, where a is a different integer than b.

It should be noted that the RF generator RFGa is controlled to operate at the frequency level f2x during the state S2. The power parameter of the RF signal generated by the RF generator RFGa during the state S2 is added to the power parameter of the RF signal generated by the RF generator RFGb during the state S3. The plasma sheath 223 of plasma formed within the plasma chamber 108 acts as the capacitor, which charges during the state S2 from the power parameter level P2x associated with the frequency level f2x and discharges during the state S3. The addition of the power parameters and the discharging of the capacitor increases ion energy of ions of plasma within the plasma chamber 108 during the state S3 and decreases an angular spread of the ion energy during the state S3. For example, a vertical directionality of plasma within the plasma chamber 108 increases during the state S3 with the addition of the power parameters during the state S3.

It should be noted that the power parameter levels P2x, P2y, and P3y are non-zero as illustrated in the graph 222. Moreover, the frequency levels f2x, f2y, and f3y are non-zero as illustrated in the graph 222.

Figure 3:
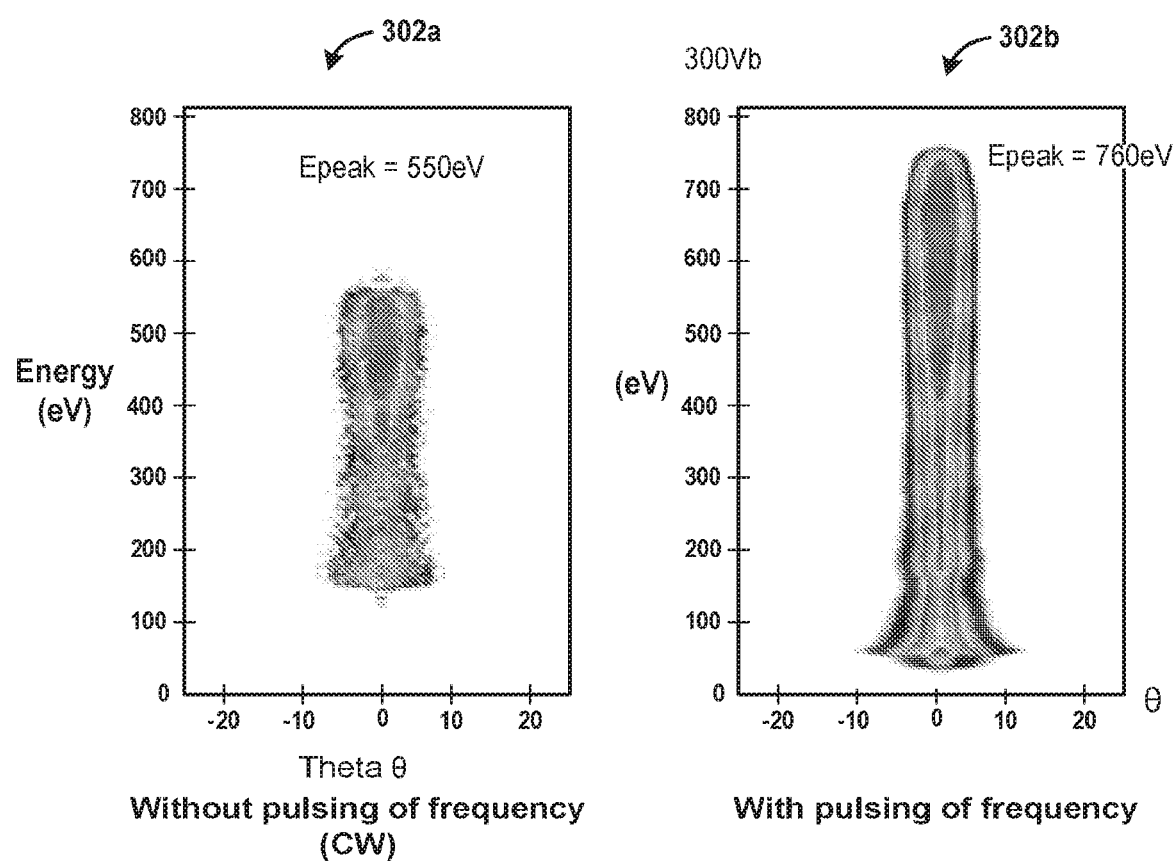
FIG. 3 is a diagram of embodiments of multiple graphs to illustrate that with pulsing of frequency level of an RF signal generated by a frequency pulsed RF generator, there is an increase in peak energy of plasma ions that are incident on a surface of a substrate.

FIG. 3 is a diagram of embodiments of multiple graphs 302A and 302B to illustrate that with pulsing of frequency level of the RF signal generated by a frequency pulsed RF generator, such as the RF generator RFGx or the RF generator RFGa, there is an increase in peak energy of plasma ions that are incident on a surface of the substrate 122, such as a surface of a channel of the substrate 122. Each graph 302a and 302b plots an IEAD, which is a plot of an energy, measured in electron volts (eV), of plasma ions versus an angle theta measured in degrees across the channel formed within the substrate 122. The graph 302a plots the energy when a frequency level of an RF generator is not pulsed, e.g., operates in a continuous wave (CW) mode. The graph 302b plots the energy when the frequency pulsed RF generator is used. It should be noted that when a frequency level of the RF generator RFGx or RFGa is pulsed between multiple states, there is an increase in peak ion energy of plasma ions of plasma within the plasma chamber 108 compared to peak ion energy of the plasma ions when the CW mode RF generator is used. Moreover, when a frequency level of the RF generator RFGx or RFGa is pulsed between multiple states, there is a decrease in angular spread of the plasma ions across the channel compared to an angular spread of the plasma ions when the CW mode RF generator is used. It should further be noted that as illustrated in the graphs 302a and 302b, an amount of bias voltage that is supplied by the bias RF generator system 114 is the same, such as 300 volts, independent of whether the frequency pulsed RF generator or the CW mode RF generator is used. The increase in the peak ion energy and the decrease in the angular spread increases an etch rate of etching the substrate 122 and the bias voltage need not be increased to increase the etch rate. For example, the bias voltage of the one or more RF signals that are generated and supplied by the bias RF generator system 114 is constant when a frequency level of the RF generator RFGx or RFGa is pulsed. As another example, the bias voltage of the one or more RF signals that are generated and supplied by the bias RF generator system 114 is substantially constant, e.g., is within a pre-determined threshold, is within 5-10% of a pre-determined value, when a frequency level of the RF generator RFGx or RFGa is pulsed.

Figure 4:
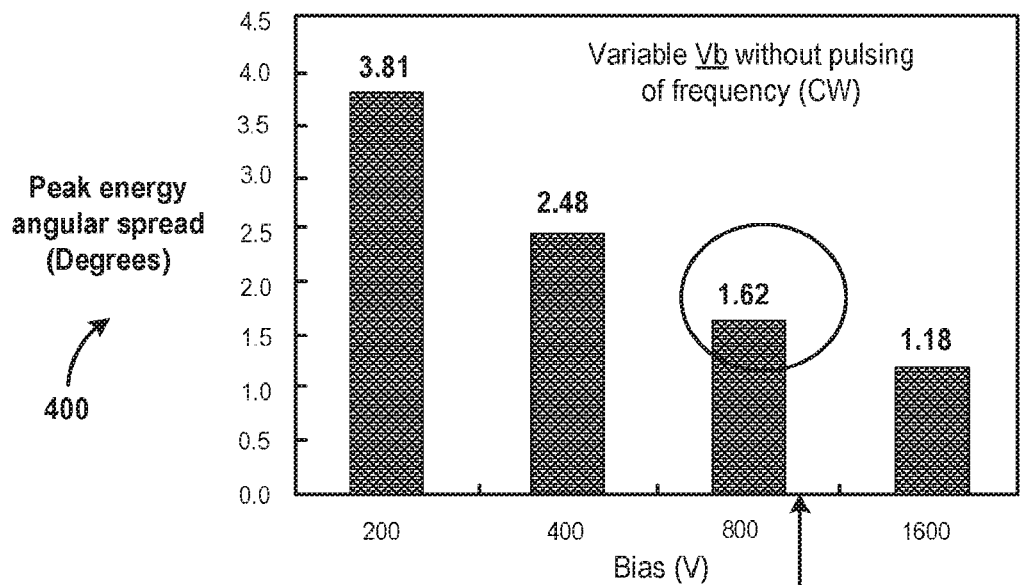
FIG. 4 is a diagram of an embodiment of a graph to illustrate that with an increase in a bias voltage that is supplied by a bias RF generator, there is a decrease in an angular distribution of plasma ions.

FIG. 4 is a diagram of an embodiment of a graph 400 to illustrate that with an increase in the bias voltage that is supplied by the bias RF generator system 114, there is a decrease in the angular distribution of plasma ions. The graph 400 plots the angular distribution, measured in degrees, versus the bias voltage. As evident, when the bias voltage increases from 200 volts to 1600 volts, there is a decrease in the angular spread distribution and an increase in an etch rate. The angular distribution is sometimes referred to herein as an angular spread.

During etching, the bias voltage is increased for a faster etch rate. Since peak ion energy increases and the angular spread of plasma ions decreases with an increase in the bias voltage, the increased bias voltage etches a high aspect ratio feature in the substrate 122 faster while maintaining a near vertical profile, such as a decent critical dimension. However, the increased bias voltage narrows the angular spread, which increases an erosion of a mask layer, which is a top part of the substrate 122. Moreover, the increase in the bias voltage creates a complication in hardware implementation. Furthermore, beyond a pre-determined amount of bias voltage, such as greater than 5 kilovolts, the angular spread does not become tighter due to a high thickness of the plasma sheath 123.

It should be noted that in one embodiment, an amount of bias voltage that is supplied by the RF generator system 114 is less than 5 kilovolts.

Figure 5:
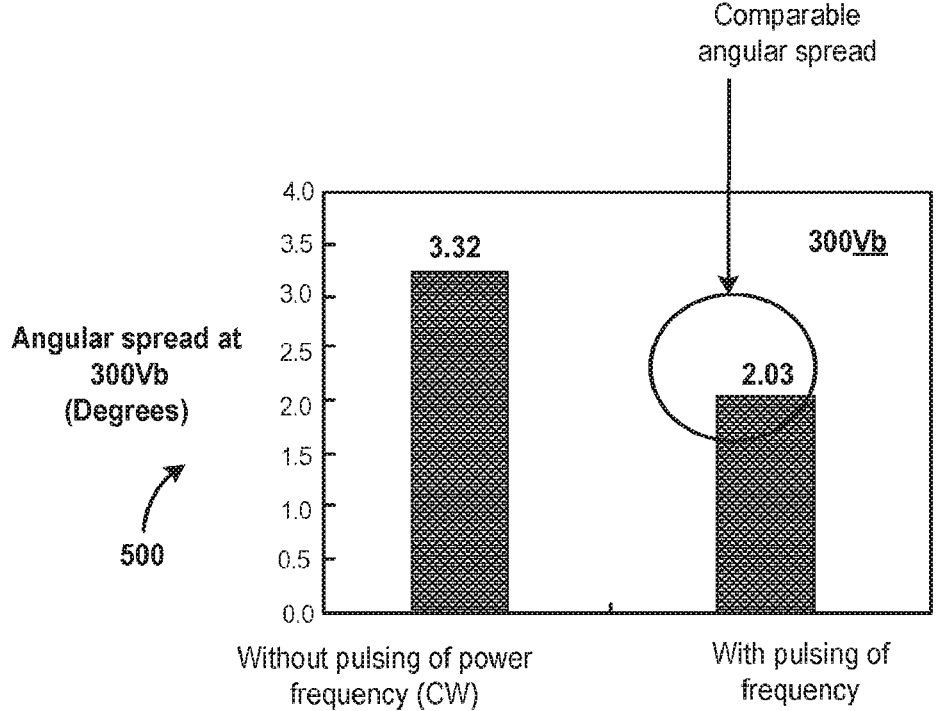
FIG. 5 is a diagram of an embodiment of a graph to illustrate that an angular spread that is comparable to that achieved with the increase in the bias voltage is achieved by pulsing a frequency level of an RF generator.

FIG. 5 is a diagram of an embodiment of a graph 500 to illustrate that an angular spread that is comparable to that achieved with the increase in the bias voltage is achieved by pulsing one or more frequency levels of the RF generator RFGx or RFGy or RFGa or RFGb or a combination thereof. For the same bias voltage, when one or more frequency levels of the RF generator RF generator RFGx or RFGy or RFGa or RFGb or a combination thereof coupled to the upper electrode 106 is pulsed, there is a decrease in the angular spread compared to when an RF generator operates in the CW mode. The decrease in the angular spread increases an etch rate of etching the substrate 122. There is no need to increase the bias voltage when one or more frequency levels of the RF generator RFGx or RFGy or RFGa or RFGb or a combination thereof is pulsed.

Figure 6:
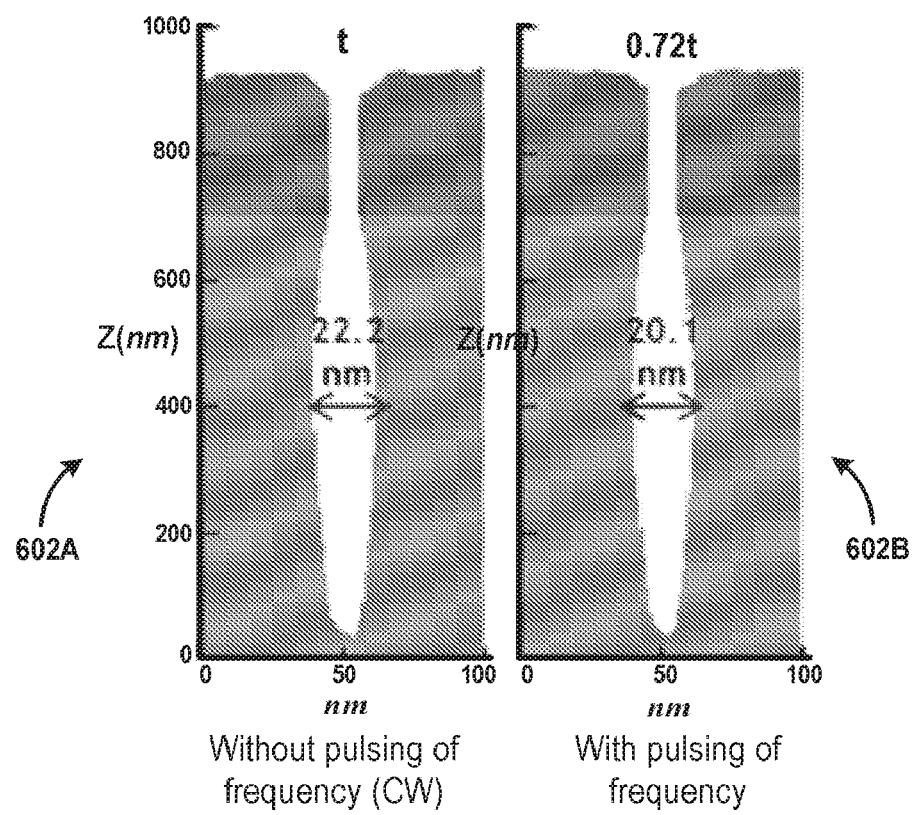
FIG. 6 is a diagram of embodiments of graphs to illustrate a difference in a critical dimension (CD) of a channel formed within the substrate.

FIG. 6 is a diagram of embodiments of a graph 602A and a graph 602B to illustrate a difference in a critical dimension (CD) of a channel formed within the substrate 122. The graph 602A plots a height of a channel in nanometers (nm) compared to a width of the channel in nanometers. The critical dimension of the channel is shown as 22.2 nm in the graph 602A. The critical dimension of the graph 602A is achieved when the CW mode RF generator is used instead of the RFGx or RFGy or RFGa or RFGb or a combination thereof. The graph 602B plots a height of the channel of the substrate 122 in nanometers compared to a width of the channel of the substrate 122 in nanometers. The critical dimension is shown as 20.1 nm in the graph 602B. The lower critical dimension in the graph 602B compared to that in the graph 602A is achieved when one or more frequency levels of the RFGx or RFGy or RFGa or RFGb or a combination thereof is pulsed. The low critical dimension is achieved when a vertical directionality of plasma ions of plasma within the plasma chamber 108 is increased due to a decrease in the angular spread of the plasma ions. The plasma ions focus more on a bottom surface of the channel of the substrate 122 when the vertical directionality is increased to increase the etch rate.

Figure 7A:
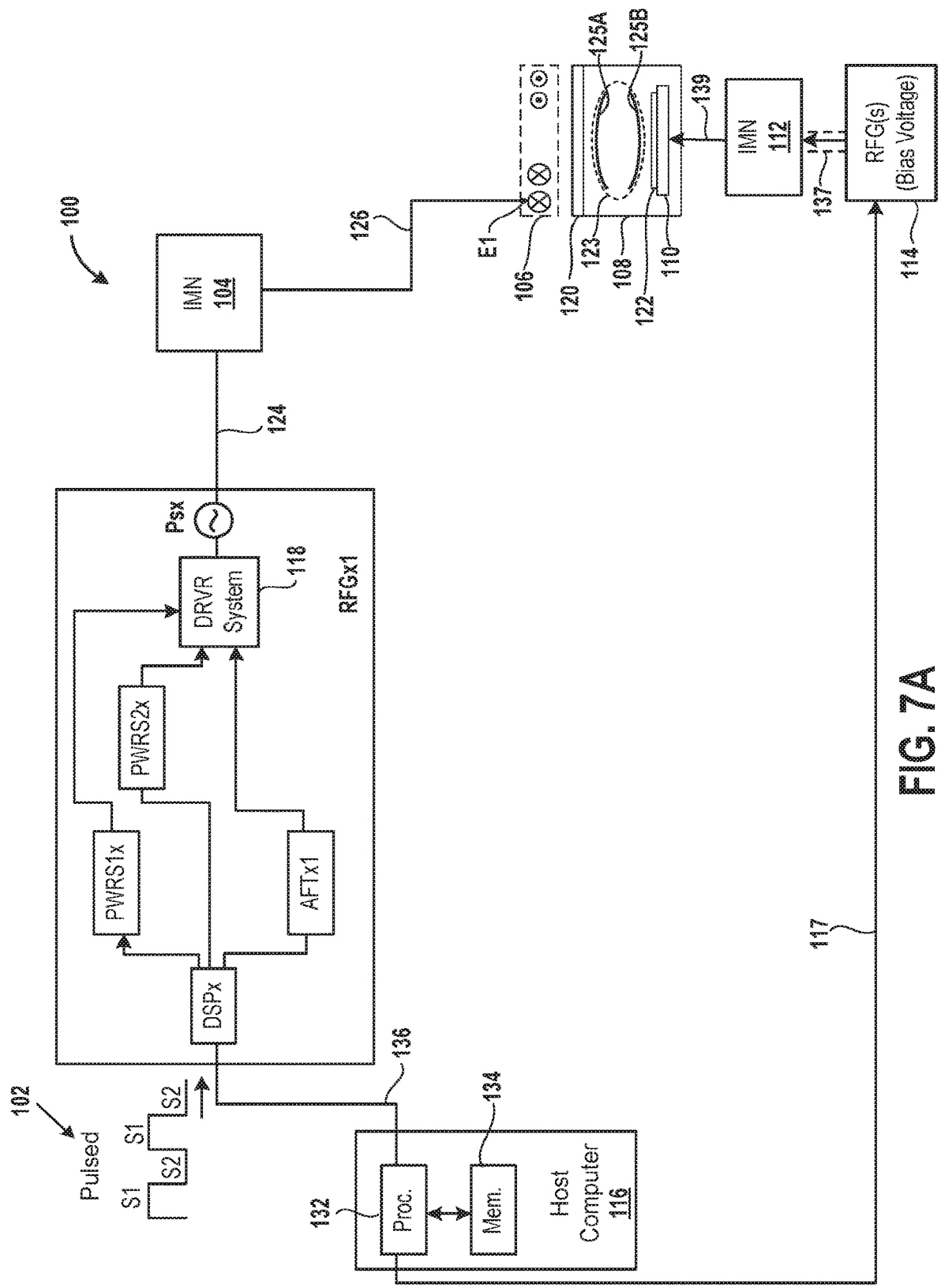
FIG. 7A is a block diagram of an embodiment of a plasma tool to illustrate power parameter level pulsing for achieving peak ion energy enhancement with a low angular spread.

FIG. 7A is a block diagram of an embodiment of a plasma tool 700 for achieving peak ion energy enhancement with a low angular spread. The plasma tool 700 includes an RF generator RFGx1, the host computer 116, the IMN 104, the plasma chamber 108, the IMN 112, and the bias RF generator system 114. Examples of the RF generator RFGx1 include a low frequency RF generator, such as a 400 kHz RF generator, or a 2 MHz RF generator, or a 13.56 MHz RF generator. Other examples of the RF generator RFGx1 include a high frequency generator, such as a 13.56 MHz RF generator, or a 27 MHz RF generator, or a 60 MHz RF generator.

The RF generator RFGx1 includes the digital signal processor DSPx, the power parameter controller PWRS1x, another power parameter controller PWRS2x, an auto frequency tuner AFTx1, the RF power supply Psx, and the driver system 118.

The DSPx is coupled to the power parameter controllers PWRS1x and PWRS2x, and to the auto-frequency tuner AFTx1. Moreover, the power parameter controllers PWRS1x and PWRS2x and the AFTx1 are coupled to the driver system 118. The RF power supply Psx is coupled via an output of the RF generator RFGx1 to the RF cable 124.

The processor 132 accesses a recipe from the memory device 134. Examples of the recipe include a power parameter set point to be applied to the RF generator RFGx1 for the state S1, a power parameter set point to be applied to the RF generator RFGx1 for the state S2, a frequency set point to be applied to the RF generator RFGx1 for the states S1 and S2, a chemistry of the one or more process gases, or a combination thereof.

The processor 132 sends an instruction with the pulsed signal 102 to the DSPx of the RF generator RFGx1 via the cable 136. The instruction sent to the DSPx of the RF generator RFGx1 via the cable 136 has information regarding the pulsed signal 102, the power parameter set point to be applied to the RF generator RFGx1 for the state S1, the power parameter set point to be applied to the RF generator RFGx1 for the state S2, and the frequency set point to be applied to the RF generator RFGx1 for the states S1 and S2. The information regarding the pulsed signal 102 indicates to the DSPx of the RF generator RFGx1 that the RF signal to be generated by the RF generator RFGx1 is to transition from the state S1 to the state S2 at the transition time tst1 of the pulsed signal 102 and that the RF signal is to transition from the state S2 to the state S1 at the transition time tst2 of the pulsed signal 102. The DSPx of the RF generator RFGx1 determines from the instruction that the power parameter set point for the state S1 is to be applied during the state S1 of the pulsed signal 102, the power parameter set point for the state S2 is to be applied during the state S2 of the pulsed signal 102, and the frequency set point for the states S1 and S2 is to be applied during the states S1 and S2 of the pulsed signal 102. Moreover, the DSPx of the RF generator RFGx1 determines from the instruction and the pulsed signal 102, that the RF signal to be generated by the RF generator RFGx1 is to transition from the state S1 to the state S2 at the transition time tst1 of the pulsed signal 102 and that the RF signal is to transition from the state S2 to the state S1 at the transition time tst2 of the pulsed signal 102.

At the transition time tst2 of the cycle of the pulsed signal 102, the DSPx of the RF generator RFGx1 sends the power parameter set point for the state S1 to the power parameter controller PWRS1x. Similarly, at the transition time tst1 of the cycle of the pulsed signal 102, the DSPx sends the power parameter set point for the state S2 to the power parameter controller PWRS2x. Moreover, at the transition time tst2 or tst1 of the cycle of the pulsed signal 102, the DSPx sends the frequency set point for the states S1 and S2 to the auto-frequency tuner AFTx1.

Upon receiving the power parameter set point for the state S1, the power parameter controller PWRS1x of the RF generator RFGx1 determines an amount of current corresponding to the power parameter set point for the state S1. Based on the amount of current that is to be generated by the driver system 118 of the RF generator RFGx1 during the state S1, the power parameter controller PWRS1x of the RF generator RFGx1 generates a command signal and sends the command signal to the driver system 118. For the state S1, in response to receiving the command signal, the driver system 118 of the RF generator RFGx1 generates and sends a current signal having the amount of current to the RF power supply Psx. The RF power supply Psx of the RF generator RFGx1, upon receiving the current signal generates the RF signal having the power parameter set point for the state S1 and supplies the RF signal via the output of the RF generator RFGx1 and the RF cable 124 to the input of the IMN 104. The power parameter set point for the state S1 is maintained during the state S1 by the RF power supply Psx of the RF generator RFGx1.

Similarly, upon receiving the power parameter set point for the state S2, the power parameter controller PWRS2x of the RF generator RFGx1 determines an amount of current corresponding to the power parameter set point for the state S2. Based on the amount of current that is to be generated by the driver system 118 of the RF generator RFGx1 during the state S2, the power parameter controller PWRS2x of the RF generator RFGx1 generates a command signal and sends the command signal to the driver system 118. For the state S2, in response to receiving the command signal, the driver system 118 of the RF generator RFGx1 generates and sends a current signal having the amount of current to the RF power supply Psx. The RF power supply Psx of the RF generator RFGx1, upon receiving the current signal generates the RF signal having the power parameter set point for the state S2 and supplies the RF signal via the output of the RF generator RFGx1 and the RF cable 124 to the input of the IMN 104. The power parameter set point for the state S2 is maintained during the state S2 by the RF power supply Psx of the RF generator RFGx1.

Moreover, upon receiving the frequency set point for the states S1 and S2, the auto-frequency tuner AFTx1 of the RF generator RFGx1 determines an amount of current corresponding to the frequency set point for the state S1. Based on the amount of current that is to be generated by the driver system 118 during the states S1 and S2, the auto-frequency tuner AFTx1 generates a command signal and sends the command signal to the driver system 118 of the RF generator RFGx1. For the states S1 and S2, in response to receiving the command signal, the driver system 118 of the RF generator RFGx1 generates and sends a current signal having the amount of current to the RF power supply Psx of the RF generator RFGx1. The RF power supply Psx of the RF generator RFGx1, upon receiving the current signal generates the RF signal having the frequency set point for the state S1 and supplies the RF signal via the output of the RF generator RFGx1 and the RF cable 124 to the input of the IMN 104. The frequency set point for the states S1 and S2 is maintained during the states S1 and S2 by the RF power supply Psx of the RF generator RFGx1. The RF signal having the power parameter set point for the state S1 and the frequency set point for the state S1 is the RF signal generated by the RF generator RFGx1 during the state S1. Similarly, the RF signal having the power parameter set point for the state S2 and the frequency set point for the state S2 is the RF signal generated by the RF generator RFGx1 during the state S2.

The input of the IMN 104 receives the RF signal generated by the RF power supply Psx of the RF generator RFGx1 via the RF cable 124 from the output of the RF generator RFGx1, and matches an impedance of the load coupled to the output of the IMN 104 with an impedance of a source coupled to the input of the IMN 104 to generate a modified RF signal at the output of the IMN 104. An example of the source coupled to the input of the IMN 104 includes the RF cable 124 and the RF generator RFGx1. The modified RF signal is sent via the RF transmission cable 126 to the upper electrode 106, such as to the end E1 of the TCP coil.

When the one or more process gases are supplied between the upper electrode 106 and the chuck 110, the modified RF signal is supplied to the upper electrode 106, and the output RF signal is supplied to the chuck 110, the one or more process gases are ignited to generate or maintain plasma within the plasma chamber 108.

In various embodiments, the power parameter controllers PWRS1x and PWRS2x, and the auto-frequency tuner AFTx1 are modules, e.g., portions, etc., of a computer program that is executed by the DSPx of the RF generator RFGx1.

In several embodiments, the power parameter controllers PWRS1x and PWRS2x, and the auto-frequency tuner AFTx1 are separate integrated circuits that are coupled to an integrated circuit of the DSPx of the RF generator RFGx1. For example, the power parameter controller PWRS1x is a first integrated circuit of the RF generator RFGx1, the power parameter controller PWRS2x is a second integrated circuit of the RF generator RFGx1, the auto-frequency tuner AFTx1 is a third integrated circuit of the RF generator RFGx1, and the DSPx is a fourth integrated circuit of the RF generator RFGx1. Each of the first through third integrated circuit of the RF generator RFGx1 is coupled to the fourth integrated circuit of the RF generator RFGx1.

In various embodiments, two RF generators are coupled to the IMN 104. For example, the RF generator RFGy is coupled to the IMN 104 via the RF cable 130 to the other input of the IMN 104. The IMN 104 combines the RF signals received from the RF generator RFGx1 and the RF generator RFGy, and matches an impedance of the load coupled to the output of the IMN 104 with that of the source, e.g., the RF generator RFGx1, the RF generator RFGy, the RF cable 124, and the RF cable 130, etc., to generate the modified RF signal at the output of the IMN 104.

Figure 7B:
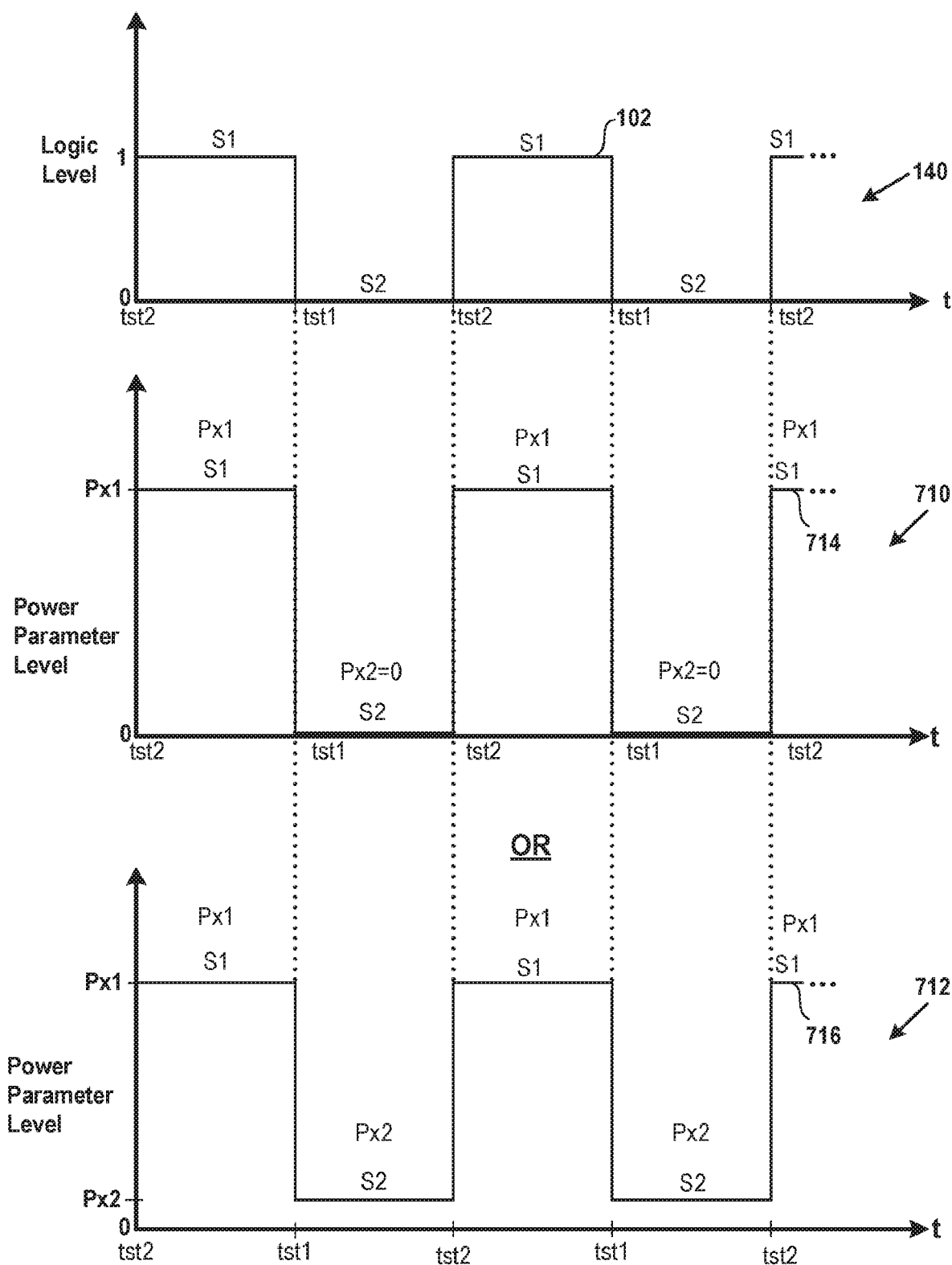
FIG. 7B is a diagram of embodiments of graphs to illustrate pulsing of a power parameter of an RF signal generated by an RF generator of the plasma tool of FIG. 7A.

FIG. 7B is a diagram of embodiments of the graph 140, a graph 710, and a graph 712 to illustrate pulsing of a power parameter of the RF signal generated by the RF generator RFGx1 of FIG. 7A. The graph 710 plots a power parameter level of the RF signal, such as an RF signal 714, that is generated by the RF generator RFGx1 versus the time t. Similarly, the graph 712 plots a power parameter level of the RF signal, such as an RF signal 716, that is generated by the RF generator RFGx1 versus the time t.

With reference to graphs 140 and 710, during the state S1, the RF signal 714 has a power parameter level of Px1 and a frequency level of fx1. Furthermore, at the transition time tst1, the RF signal 714 transitions from the state S1 to the state S2. During the state S2, the RF signal 714 has a power parameter level of zero and a frequency level of zero. At the transition time tst2, the RF signal 714 transitions from the state S2 back to the state S1.

It should be noted that a duty cycle of the state S1 of the RF signal 714 is the same as a duty cycle of the state S2 of the RF signal 714. For example, the duty cycle of the state S1 is 50% and the duty cycle of the state S2 is 50%. The state S1 of the RF signal 714 occupies 50% of the cycle of the pulsed signal 102 and the state S2 of the RF signal 714 occupies the remaining 50% of the cycle of the pulsed signal 102.

In various embodiments, a duty cycle of the state S1 of the RF signal 714 is different from a duty cycle of the state S2 of the RF signal 714. For example, the duty cycle of the state S1 is 25% and the duty cycle of the state S2 is 75%. The state S1 of the RF signal 714 occupies 25% of the cycle of the pulsed signal 102 and the state S2 of the RF signal 714 occupies the remaining 75% of the cycle of the pulsed signal 102. As another example, the duty cycle of the state S1 is a % and the duty cycle of the state S2 is (100–a) %. The state S1 of the RF signal 714 occupies a % of the cycle of the pulsed signal 102 and the state S2 of the RF signal 714 occupies the remaining (100–a) % of the cycle of the pulsed signal 102.

It should be noted that the power parameter level Px1 and the frequency level fx1 are non-zero as illustrated in the graph 710.

The graph 712 is similar to the graph 710 except that the RF signals 714 and 716 have difference power parameter levels during the state S2. For example, the RF signal 714 has the power parameter level of zero during the state S2 and the RF signal 716 has a power parameter level of Px2 during the state S2. Moreover, the RF signal 716 has a frequency level of fx2 during the state S2 and the frequency level fx2 during the state S2 is the same as the frequency level fx1 of the RF signal 716 during the state S1. The RF signal 716 has the power parameter level Px1 during the state S1.

With reference to graphs 140 and 712, the state S1 of the RF signal 716 is the same as the state S1 of the RF signal 714. For example, the power parameter level Px1 of the RF signal 716 is the same as that of the power parameter level Px1 of the RF signal 714 during the state S1. Also, the frequency level fx1 of the RF signal 716 is the same as that of the frequency level fx1 of the RF signal 714 during the state S1.

Furthermore, at the transition time tst1, the RF signal 716 transitions from the state S1 to the state S2. During the state S2, the power parameter level Px2 of the RF signal 716 is greater than the power parameter level Px1 of zero of the RF signal 714 during the state S1 but lower than the power parameter level Px1 of the RF signal 716 during the state S1. At the transition time tst2, the RF signal 716 transitions from the state S2 back to the state S1.

It should be noted that the power parameters level Px1 and Px2 and the frequency levels fx1 and fx2 are non-zero as illustrated in the graph 712.

It should be noted that a duty cycle of the state S1 of the RF signal 716 is the same as a duty cycle of the state S2 of the RF signal 716. For example, the duty cycle of the state S1 of the RF signal 716 is 50% and the duty cycle of the state S2 of the RF signal 716 is 50%. The state S1 of the RF signal 716 occupies 50% of the cycle of the pulsed signal 102 and the state S2 of the RF signal 716 occupies the remaining 50% of the cycle of the pulsed signal 102.

In various embodiments, a duty cycle of the state S1 of the RF signal 716 is different from a duty cycle of the state S2 of the RF signal 716. For example, the duty cycle of the state S1 of the RF signal 716 is 25% and the duty cycle of the state S2 of the RF signal 716 is 75%. The state S1 of the RF signal 716 occupies 25% of the cycle of the pulsed signal 102 and the state S2 of the RF signal 716 occupies the remaining 75% of the cycle of the pulsed signal 102. As another example, the duty cycle of the state S1 of the RF signal 716 is a % and the duty cycle of the state S2 of the RF signal 716 is (100–a) %. The state S1 of the RF signal 716 occupies a % of the cycle of the pulsed signal 102 and the state S2 of the RF signal 716 occupies the remaining (100–a) % of the cycle of the pulsed signal 102.

It should be noted that the RF generator RFGx1 is controlled to operate at the power parameter level Px2 during the state S2. The power parameter of the RF signal generated by the RF generator RFGx1 during the state S2 is added to the power parameter of the RF signal generated by the RF generator RFGx1 during the state S1. The plasma sheath 123 of plasma formed within the plasma chamber 108 acts as the capacitor, which charges during the state S2 from the power parameter level Px2 associated with the frequency level fx2 and discharges during the state S1. The addition of the power parameters and the discharging of the capacitor increases ion energy of ions of plasma within the plasma chamber 108 during the state S1 and decreases an angular spread of the ion energy during the state S1. For example, a vertical directionality of plasma within the plasma chamber 108 increases during the state S1 with the addition of the power parameters during the state S1.

Figure 8:
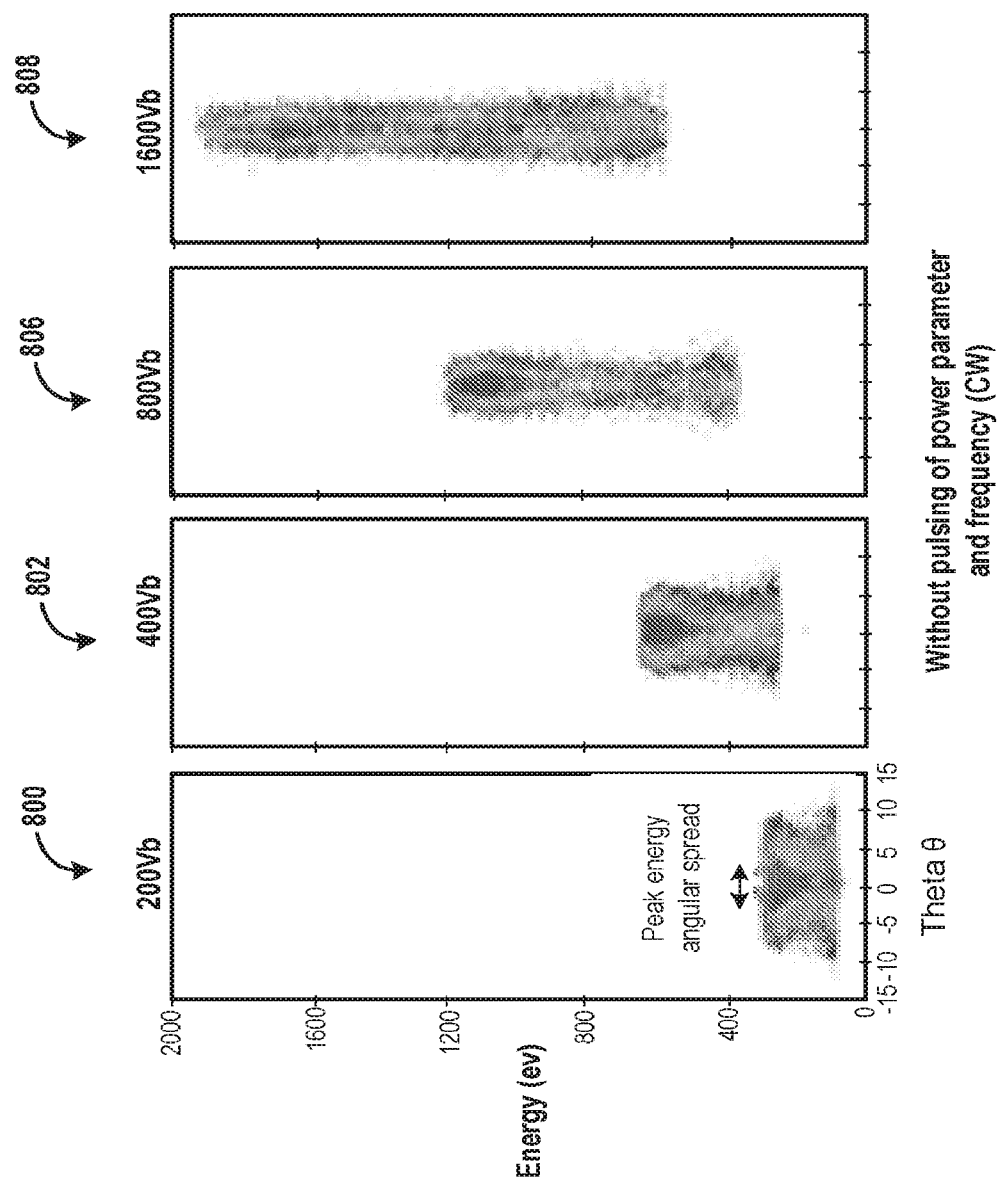
FIG. 8 is a diagram of embodiments of multiple graphs to illustrate that with an increase in the bias voltage, there is an increase in vertical directionality of plasma ions.

FIG. 8 is a diagram of embodiments of multiple graphs 800, 802, 804, and 806 to illustrate that with an increase in the bias voltage, there is an increase in vertical directionality of plasma ions. Each graph 800, 802, 804, and 806 plots an energy of plasma ions versus an angle measured across the channel formed within the substrate 122. As shown, with an increase in the bias voltage that is supplied by the bias RF generator system 114, there is an increase in peak ion energy of plasma within the plasma chamber 108. With the increase in the peak ion energy, there is a decrease in the angular spread of plasma ions across the channel and increase in the vertical directionality of the plasma ions.

Figure 9:
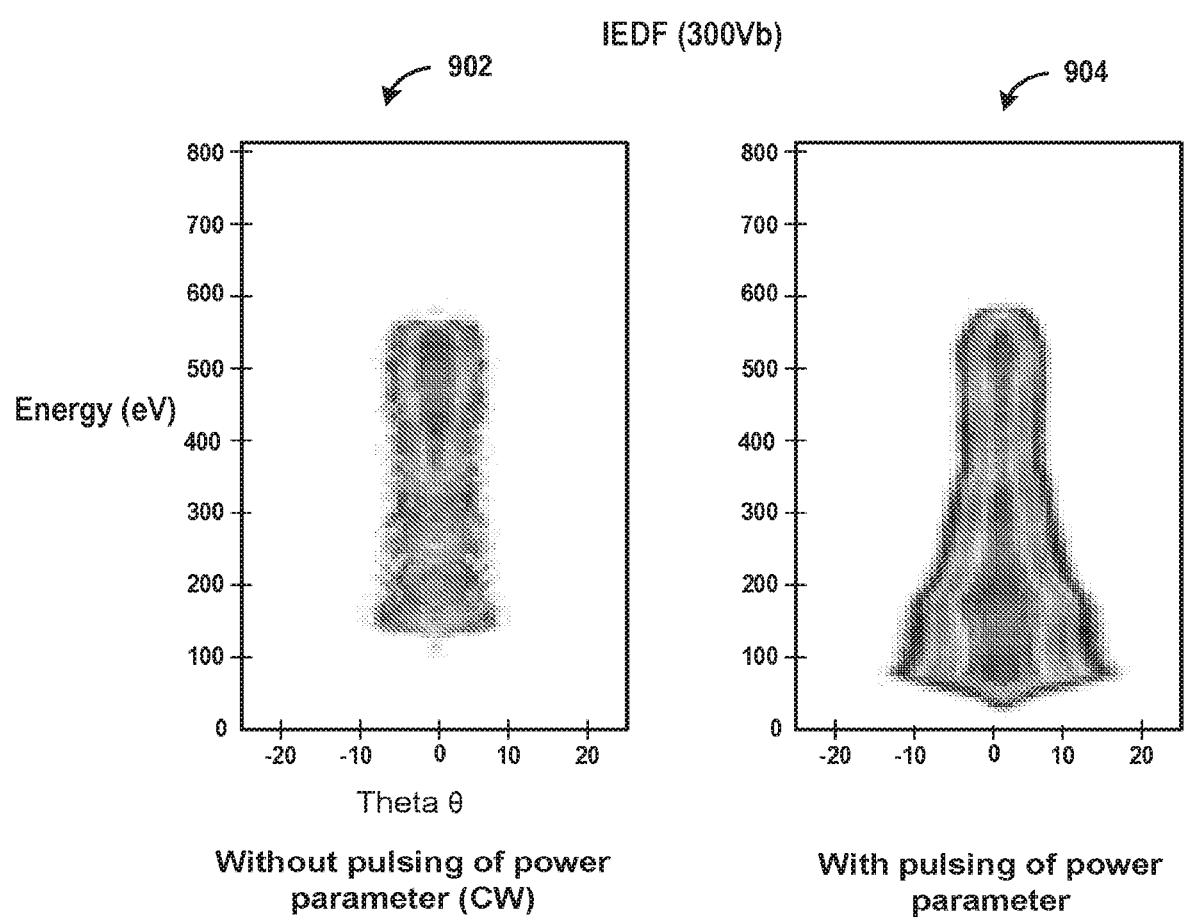
FIG. 9 is a diagram of embodiments of multiple graphs to illustrate that with pulsing of a power parameter level of an RF signal generated by an RF generator, there is an increase in peak energy of plasma ions that are incident on a surface of the substrate.

FIG. 9 is a diagram of embodiments of multiple graphs 902 and 904 to illustrate that with pulsing of a power parameter level of an RF signal generated by a power parameter pulsed RF generator, such as the RF generator RFGx or RFGy or RFGa or RFGb or RFGx1, there is an increase in peak energy of plasma ions that are incident on the surface of the substrate 122. Each graph 902 and 904 plots an ion energy distribution function (IEDF), which is a plot of an energy of plasma ions versus an angle measured across a channel formed within the substrate 122. The graph 902 plots the energy when a power parameter level of an RF generator is not pulsed, e.g., operates in the CW mode. The graph 904 plots the energy when the power parameter pulsed RF generator is used to pulse a power parameter level between multiple states. It should be noted that when a power parameter level of the power parameter pulsed RF generator is pulsed between multiple states, there is an increase in peak ion energy of plasma ions of plasma within the plasma chamber 108 compared to peak ion energy of the plasma ions when the CW mode RF generator is used. Moreover, when a power parameter level of the power parameter pulsed RF generator is pulsed between multiple states, there is a decrease in angular distribution of the plasma ions across the channel compared to an angular distribution of the plasma ions when the CW mode RF generator is used. It should further be noted that an amount of bias voltage that is supplied by the bias RF generator system 114 is the same, such as 300 volts, independent of whether the power parameter pulsed RF generator or the CW mode RF generator is used. The increase in the peak ion energy and the decrease in the angular distribution increases an etch rate of etching the substrate 122 and the bias voltage need not be increased to increase the etch rate. For example, the bias voltage of the one or more RF signals that are generated and supplied by the bias RF generator system 114 is constant when a power parameter level of the power parameter pulsed RF generator is pulsed.

Figure 10:
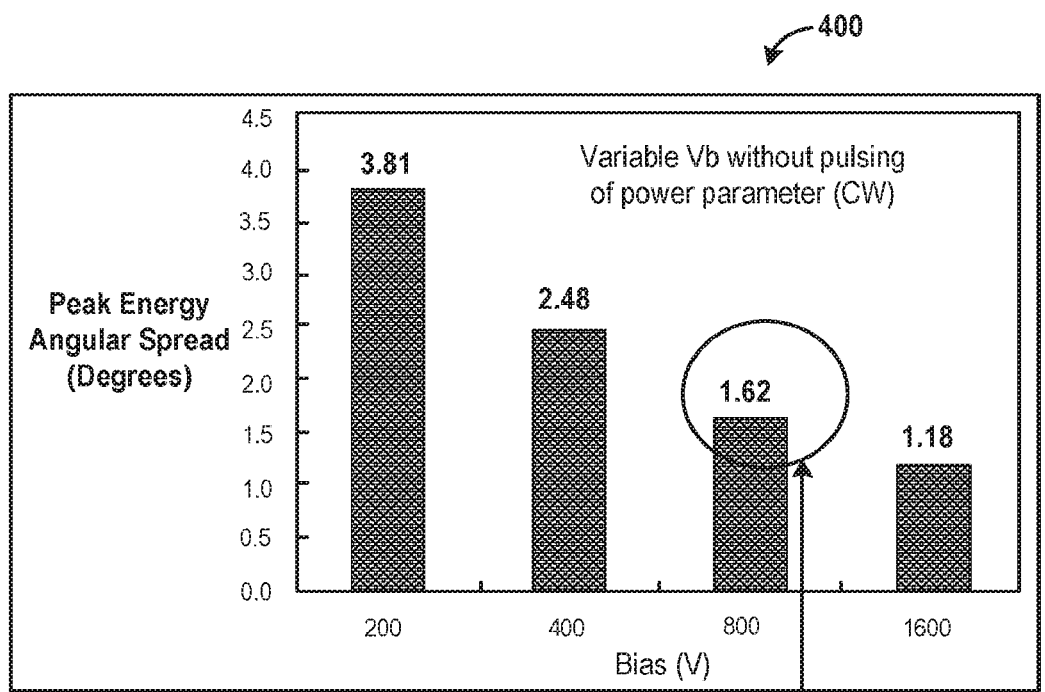
FIG. 10 is a diagram of an embodiment of the graph of FIG. 4.

FIG. 10 is a diagram of an embodiment of the graph 400.

Figure 11:
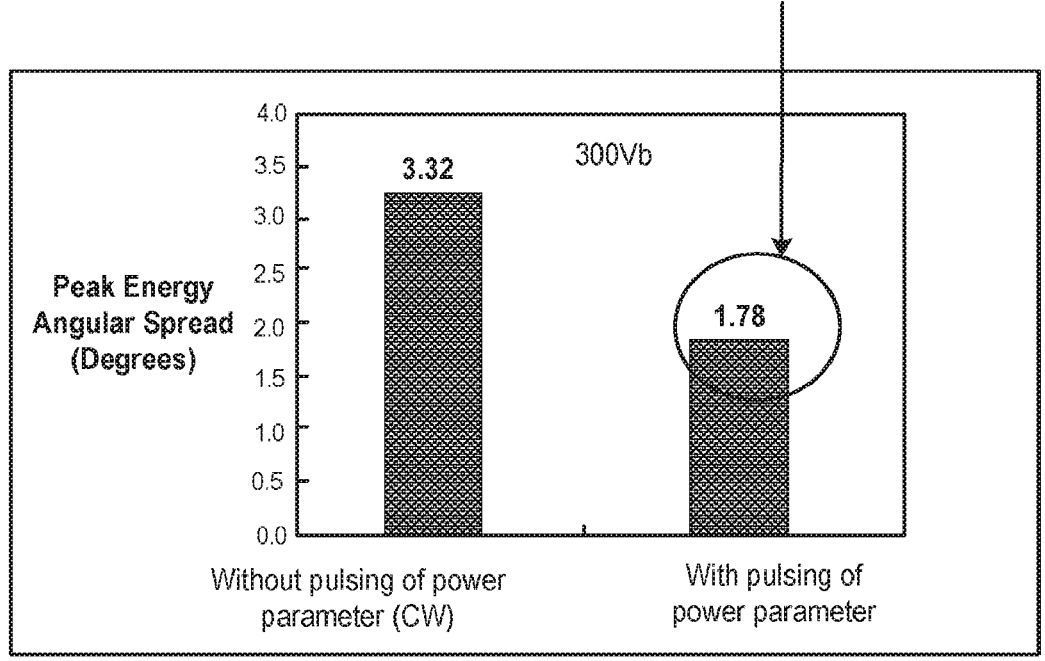
FIG. 11 is a diagram of an embodiment of a graph to illustrate that an angular spread that is comparable to that achieved with the increase in the bias voltage is achieved by pulsing a power parameter level of an RF generator.

FIG. 11 is a diagram of an embodiment of a graph 1100 to illustrate that an angular spread that is comparable to that achieved with the increase in the bias voltage is achieved by pulsing a power parameter level of the power parameter pulsed RF generator. For the same bias voltage, when a power parameter level of an RF generator coupled to the upper electrode 106 is operated in the CW mode, e.g., is not pulsed, the angular spread is higher. The angular spread is higher compared to that achieved using the power parameter pulsed RF generator. There is no need to increase the bias voltage when a power parameter level of the power parameter pulsed RF generator is pulsed to achieve the lower angular spread to increase the etch rate.

Figure 12:
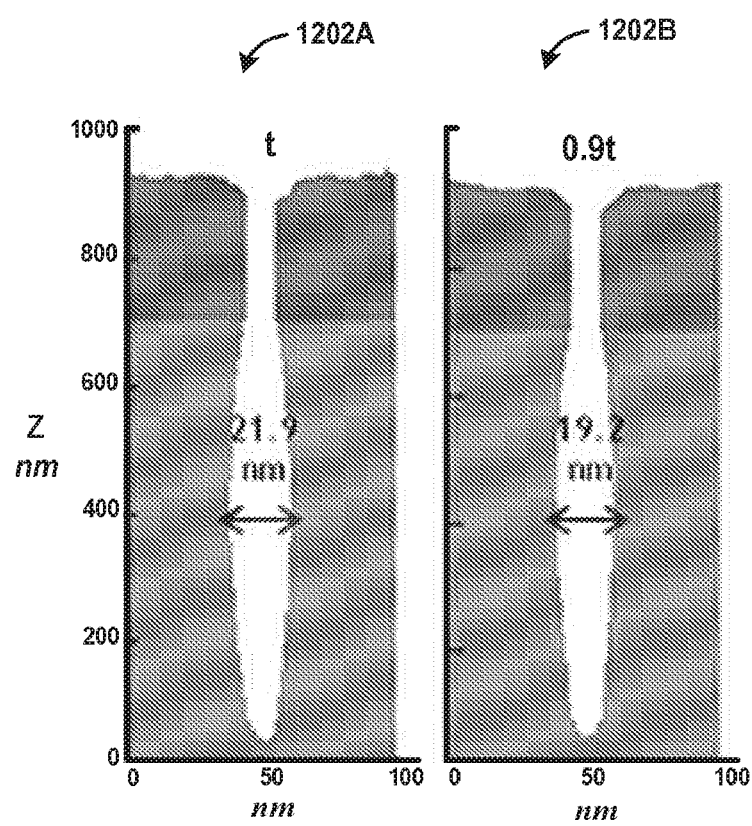
FIG. 12 is a diagram of embodiments of graphs to illustrate a difference in the critical dimension achieved between pulsing the power parameter level and applying a continuous wave mode.

FIG. 12 is a diagram of embodiments of a graph 1202A and a graph 1202B to illustrate a difference in a critical dimension of the channel formed within the substrate 122. The graph 1202A plots a height of a channel in nanometers compared to a width of the channel in nanometers. The critical dimension of the channel is shown as 21.9 nm in the graph 1202A. The critical dimension of the graph 1202A is achieved when the CW mode RF generator is used instead of the power parameter pulsed RF generator. The graph 1202B plots a height of the channel of the substrate 122 in nanometers compared to a width of the channel of the substrate 122 in nanometers. The critical dimension is shown as 19.2 nm in the graph 1202B. The lower critical dimension in the graph 1202B compared to that in the graph 1202A is achieved when a power parameter level of the power parameter pulsed RF generator is pulsed. The low critical dimension is achieved when a vertical directionality of the plasma ions of plasma within the plasma chamber 108 is increased due to a decrease in the angular spread of the plasma ions of plasma within the plasma chamber 108.

Figure 13A:
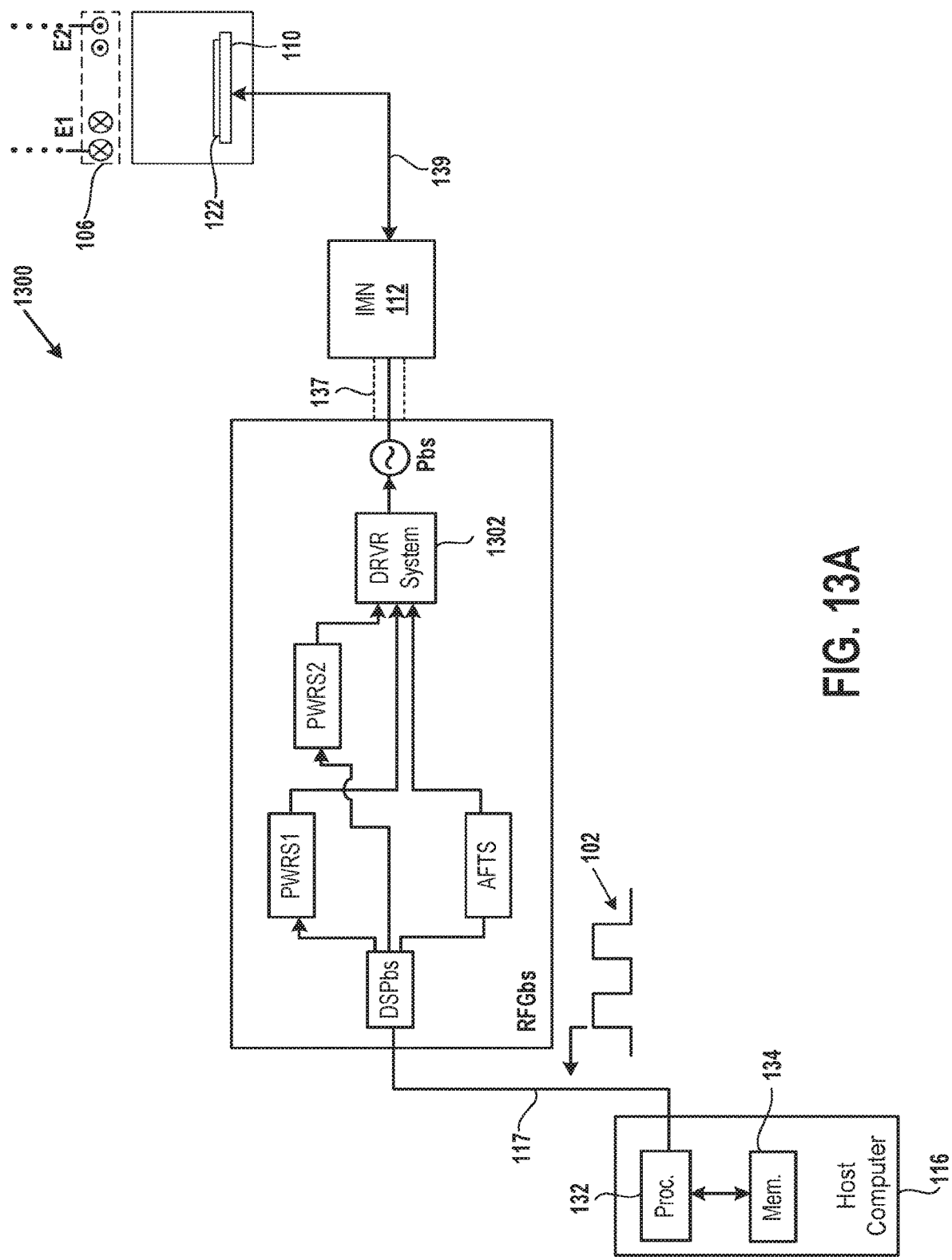
FIG. 13A is a block diagram of an embodiment of a plasma tool to illustrate power parameter level pulsing of a bias RF generator for achieving peak ion energy enhancement with a low angular spread.

FIG. 13A is a block diagram of an embodiment of a plasma tool 1300 for achieving peak ion energy enhancement with a low angular spread. The plasma tool 1300 is the same as the plasma tool 100 of FIG. 1A except that in the plasma tool 1300, a bias RF generator RFGbs is used instead of the bias RF generator system 114. The bias RF generator RFGbs is a multi-state RF generator compared to the bias RF generator system 114, which is a continuous wave mode RF generator. The plasma tool 1300 further includes the host computer 116, the IMN 112, the plasma chamber 108, the RF generator RFGx (shown in FIG. 1A), the RF generator RFGy (shown in FIG. 1A), and the IMN 104 (shown in FIG. 1A).

The RF generator RFGbs includes a digital signal processor DSPbs, a power parameter controller PWRS1, another power parameter controller PWRS2, an auto frequency tuner AFTS, an RF power supply Pbs, and a driver system 1302. The digital signal processor DSPbs is coupled to the power parameter controllers PWRS1 and PWRS2, and to the auto-frequency tuner AFTS. Moreover, the power parameter controllers PWRS1 and PWRS2 and the auto-frequency tuner AFTS are coupled to the driver system 1302. The driver system 1302 is coupled to the RF power supply Pbs. The RF power supply Pbs is coupled via an output of the RF generator RFGbs to the RF cable system 137, such as to an RF cable of the RF cable system 137.

The processor 132 accesses a recipe from the memory device 134. Examples of the recipe include a power parameter set point to be applied to the RF generator RFGbs for the state S1, a power parameter set point to be applied to the RF generator RFGbs for the state S2, a frequency set point to be applied to the RF generator RFGx for the states S1 and S2, or a combination thereof.

The processor 132 sends an instruction with the pulsed signal 102 to the DSPbs via the cable 117. The instruction sent to the DSPbs via the cable 117 has information regarding the pulsed signal 102, the power parameter set point to be applied to the RF generator RFGbs for the state S1, the power parameter set point to be applied to the RF generator RFGbs for the state S2, and the frequency set point to be applied to the RF generator RFGbs for the states S1 and S2. The information regarding the pulsed signal 102 indicates to the DSPbs that the RF signal to be generated by the RF generator RFGbs is to transition from the state S1 to the state S2 at the transition time tst1 of the pulsed signal 102 and that the RF signal is to transition from the state S2 to the state S1 at the transition time tst2 of the pulsed signal 102. The DSPbs determines from the instruction that the power parameter set point for the state S1 is to be applied during the state S1 of the pulsed signal 102, the power parameter set point for the state S2 is to be applied during the state S2 of the pulsed signal 102, and the frequency set point for the states S1 and S2 is to be applied during the states S1 and S2 of the pulsed signal 102. Moreover, the DSPbs determines from the instruction and the pulsed signal 102, that the RF signal to be generated by the RF generator RFGbs is to transition from the state S1 to the state S2 at the transition time tst1 of the pulsed signal 102 and that the RF signal is to transition from the state S2 to the state S1 at the transition time tst2 of the pulsed signal 102. The transition times tst1 and tst2 repeat for each cycle of the pulsed signal 102.

At the transition time tst2 of the cycle of the pulsed signal 102, the DSPbs sends the power parameter set point for the state S1 to the power parameter controller PWRS1. Similarly, at the transition time tst1 of the cycle of the pulsed signal 102, the DSPbs sends the power parameter set point for the state S2 to the power parameter controller PWRS2. Moreover, at the transition time tst2 or tst1 of the cycle of the pulsed signal 102, the DSPbs sends the frequency set point for the states S1 and S2 to the auto-frequency tuner AFTS.

Upon receiving the power parameter set point for the state S1, the power parameter controller PWRS1 determines an amount of current corresponding to the power parameter set point for the state S1. Based on the amount of current that is to be generated by the driver system 1302 during the state S1, the power parameter controller PWRS1 generates a command signal and sends the command signal to the driver system 1302. For the state S1, in response to receiving the command signal, the driver system 1302 generates and sends a current signal having the amount of current to the RF power supply Pbs. The RF power supply Pbs, upon receiving the current signal generates the RF signal having the power parameter set point for the state S1 and supplies the RF signal via the output of the RF generator RFGbs and the RF cable of the RF cable system 137 to the input of the IMN 112. The power parameter set point for the state S1 is maintained during the state S1 by the RF power supply Pbs of the RF generator RFGbs.

Similarly, upon receiving the power parameter set point for the state S2, the power parameter controller PWRS2 determines an amount of current corresponding to the power parameter set point for the state S2. Based on the amount of current that is to be generated by the driver system 1302 during the state S2, the power parameter controller PWRS2 generates a command signal and sends the command signal to the driver system 1302. For the state S2, in response to receiving the command signal, the driver system 1302 generates and sends a current signal having the amount of current to the RF power supply Psbs. The RF power supply Pbs, upon receiving the current signal generates the RF signal having the power parameter set point for the state S2 and supplies the RF signal via the output of the RF generator RFGbs and the RF cable of the RF cable system 137 to the input of the IMN 112. The power parameter set point for the state S2 is maintained during the state S2 by the RF power supply Pbs of the RF generator RFGbs.

Moreover, upon receiving the frequency set point for the states S1 and S2, the auto-frequency tuner AFTS determines an amount of current corresponding to the frequency set point for the states S1 and S2. Based on the amount of current that is to be generated by the driver system 1302 during the states S1 and S2, the auto-frequency tuner AFTS generates a command signal and sends the command signal to the driver system 1302. For the states S1 and S2, in response to receiving the command signal, the driver system 1302 generates and sends a current signal having the amount of current to the RF power supply Pbs. The RF power supply Pbs, upon receiving the current signal generates the RF signal having the frequency set point for the states S1 and S2 and supplies the RF signal via the output of the RF generator RFGbs and the RF cable of the RF cable system 137 to the input of the IMN 112. The frequency set point for the states S1 and S2 is maintained during the states S1 and S2 by the RF power supply Pbs. The RF signal having the power parameter set point for the state S1 and the frequency set point for the states S1 and S2 is the RF signal generated by the RF generator RFGbs during the state S1. Similarly, the RF signal having the power parameter set point for the state S2 and the frequency set point for the states S1 and S2 is the RF signal generated by the RF generator RFGbs during the state Ss.

The input of the IMN 112 receives the RF signal generated by the RF power supply Pbs via the RF cable of the RF cable system 137 from the output of the RF generator RFGbs, and matches an impedance of the load coupled to the output of the IMN 112 with an impedance of a source coupled to the input of the IMN 112 to generate an output RF signal at the output of the IMN 112. An example of the source coupled to the input of the IMN 112 includes the RF cable system 137 and the RF generator RFGbs. The output RF signal is sent via the RF transmission line 139 to the chuck 110, such as to the lower electrode of the chuck 110.

When the one or more process gases are supplied between the upper electrode 106 and the chuck 110, the modified RF signal is supplied to the upper electrode 106, and the output RF signal is supplied to the chuck 110, the one or more process gases are ignited to generate or maintain plasma within the plasma chamber 108.

In various embodiments, the power parameter controllers PWRS1 and PWRS2, and the auto-frequency tuner AFTS are modules, e.g., portions, etc., of a computer program that is executed by the DSPbs.

In several embodiments, the power parameter controllers PWRS1 and PWRS2, and the auto-frequency tuner AFTS are separate integrated circuits that are coupled to an integrated circuit of the DSPbs. For example, the power parameter controller PWRS1 is a first integrated circuit of the RF generator RFGbs, the power parameter controller PWRS2 is a second integrated circuit of the RF generator RFGbs, the auto-frequency tuner AFTS is a third integrated circuit of the RF generator RFGbs, and the DSPbs is a fourth integrated circuit of the RF generator RFGbs. Each of the first through third integrated circuit of the RF generator RFGbs is coupled to the fourth integrated circuit of the RF generator RFGbs.

Figure 13B:
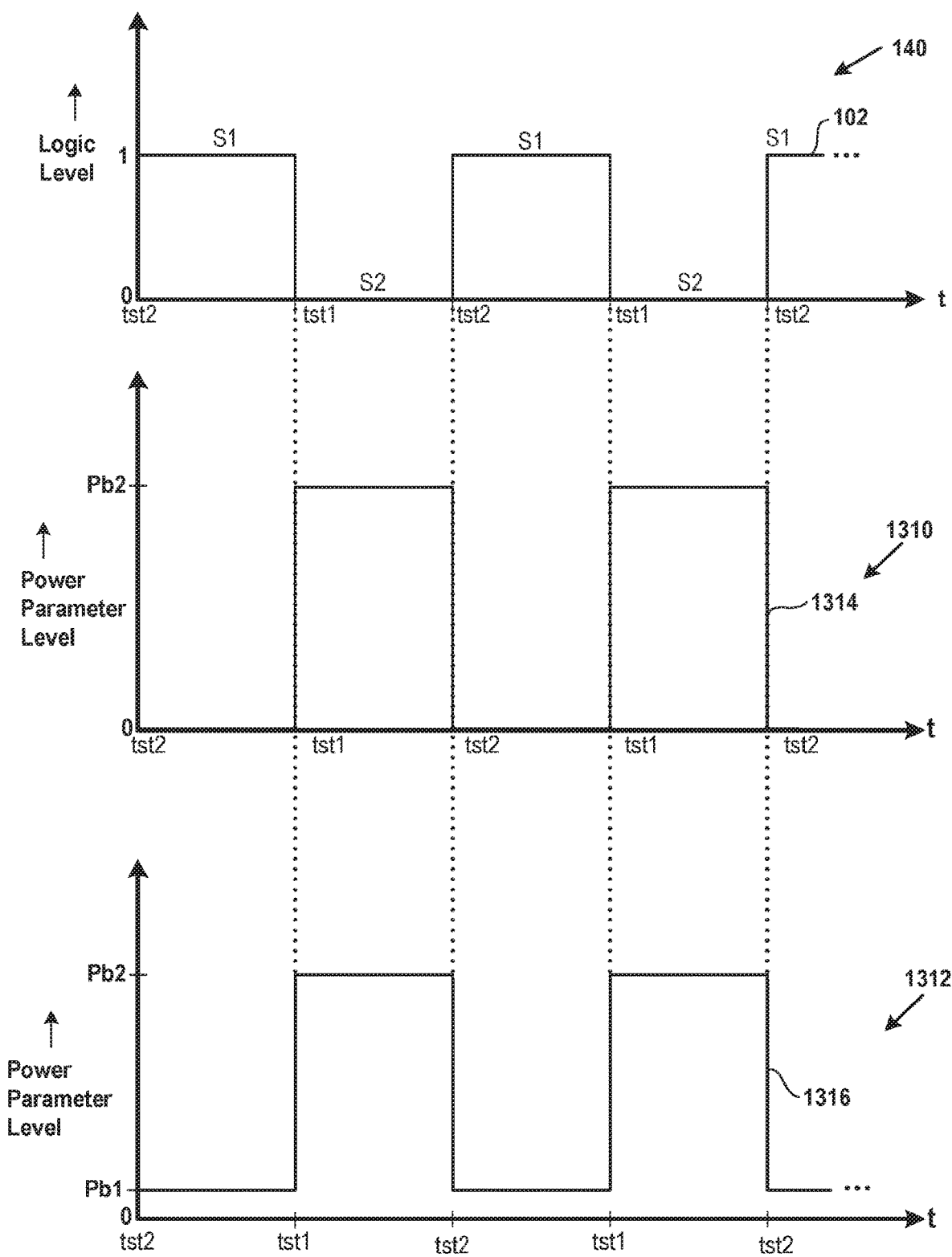
FIG. 13B is a diagram of embodiments of graphs to illustrate pulsing of a power parameter of an RF signal generated by the bias RF generator of FIG. 13A.

FIG. 13B is a diagram of embodiments of the graph 140, a graph 1310, and a graph 1312 to illustrate pulsing of a power parameter of the RF signal generated by the RF generator RFGbs of FIG. 13A. The graph 1310 plots a power parameter level of the RF signal, such as an RF signal 1314, that is generated by the RF generator RFGbs versus the time t. Similarly, the graph 1312 plots a power parameter level of the RF signal, such as an RF signal 1316, that is generated by the RF generator RFGbs versus the time t.

With reference to graphs 140 and 1310, during the state S1, the RF signal 1314 has a power parameter level of zero and a frequency level of zero. Furthermore, at the transition time tst1, the RF signal 1314 transitions from the state S1 to the state S2. During the state S2, the RF signal 1314 has a power parameter level of Pb2 and a frequency level of fb2. At the transition time tst2, the RF signal 1314 transitions from the state S2 back to the state S1. The zero power parameter level of the RF signal 1314 avoids plasma ions generated during the state S1 from being directed towards the chuck 110. As such, the plasma ions are preserved for application during the state S2 to increase vertical directionality of the plasma ions to further increase the etch rate.

It should be noted that a duty cycle of the state S1 of the RF signal 1314 is the same as a duty cycle of the state S2 of the RF signal 1314. For example, the duty cycle of the state S1 is 50% and the duty cycle of the state S2 is 50%. The state S1 of the RF signal 1314 occupies 50% of the cycle of the pulsed signal 102 and the state S2 of the RF signal 1314 occupies the remaining 50% of the cycle of the pulsed signal 102.

In various embodiments, a duty cycle of the state S1 of the RF signal 1314 is different from a duty cycle of the state S2 of the RF signal 1314. For example, the duty cycle of the state S1 is 25% and the duty cycle of the state S2 is 75%. The state S1 of the RF signal 1314 occupies 25% of the cycle of the pulsed signal 102 and the state S2 of the RF signal 1314 occupies the remaining 75% of the cycle of the pulsed signal 102. As another example, the duty cycle of the state S1 is a % and the duty cycle of the state S2 is (100−a) %. The state S1 of the RF signal 1314 occupies a % of the cycle of the pulsed signal 102 and the state S2 of the RF signal 1314 occupies the remaining (100−a) % of the cycle of the pulsed signal 102.

It should be noted that the power parameter level Pb2 and the frequency level fb2 are non-zero as illustrated in the graph 1310.

The graph 1312 is similar to the graph 1310 except that the RF signals 1314 and 1316 have difference power parameter levels during the state S1. For example, the RF signal 1314 has the power parameter level of zero during the state S1 and the RF signal 1316 has a power parameter level of Pb1 during the state S1. Moreover, the RF signal 1316 has a frequency level of fb1 during the state S1 and the frequency level fb1 during the state S1 is the same as the frequency level fb2 of the RF signal 1316 during the state S2. The RF signal 1316 has the power parameter level Pb2 during the state S2. The lower power parameter level of the RF signal 1316 during the state S1 compared to that during the state S2 avoids plasma ions generated during the state S1 from being directed towards the chuck 110 during the state S1. As such, the plasma ions are preserved for application during the state S2 to increase vertical directionality of the plasma ions to further increase the etch rate.

With reference to graphs 140 and 1312, the state S2 of the RF signal 1316 is the same as the state S2 of the RF signal 1314. For example, during the state S2, the RF signal 1316 has the power parameter level of Pb2, which is the same as that of the power parameter level Pb2 of the RF signal 1314 during the state S2. Also, during the state S2, the RF signal 1316 has the frequency level of fb2, which is the same as that of the frequency level of the RF signal 1314 during the state S2.

Furthermore, at the transition time tst1, the RF signal 1316 transitions from the state S1 to the state S2. The power parameter level of Pb1 is greater than the power parameter level of zero of the RF signal 1314 during the state S1 but lower than the power parameter level Pb2 of the RF signal 1316 during the state S2. At the transition time tst2, the RF signal 1316 transitions from the state S2 back to the state S1.

It should be noted that the power parameters level Pb1 and Pb2 and the frequency levels fb1 and fb2 are non-zero as illustrated in the graph 1312.

It should be noted that a duty cycle of the state S1 of the RF signal 1316 is the same as a duty cycle of the state S2 of the RF signal 1316. For example, the duty cycle of the state S1 of the RF signal 1316 is 50% and the duty cycle of the state S2 of the RF signal 1316 is 50%. The state S1 of the RF signal 1316 occupies 50% of the cycle of the pulsed signal 102 and the state S2 of the RF signal 1316 occupies the remaining 50% of the cycle of the pulsed signal 102.

In various embodiments, a duty cycle of the state S1 of the RF signal 1316 is different from a duty cycle of the state S2 of the RF signal 1316. For example, the duty cycle of the state S1 of the RF signal 1316 is 25% and the duty cycle of the state S2 of the RF signal 1316 is 75%. The state S1 of the RF signal 1316 occupies 25% of the cycle of the pulsed signal 102 and the state S2 of the RF signal 1316 occupies the remaining 75% of the cycle of the pulsed signal 102. As another example, the duty cycle of the state S1 of the RF signal 1316 is a % and the duty cycle of the state S2 of the RF signal 1316 is (100–a) %. The state S1 of the RF signal 1316 occupies a % of the cycle of the pulsed signal 102 and the state S2 of the RF signal 1316 occupies the remaining (100–a) % of the cycle of the pulsed signal 102.

In some embodiments, the frequency level fb1 is different from, such as lower than or higher than, the frequency level fb2.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A method for pulsing a primary radio frequency (RF) signal and a secondary RF signal, comprising:
    pulsing a frequency of the primary RF signal between a first primary frequency level during a first state and a second primary frequency level during a second state, wherein the first primary frequency level is greater than zero, wherein the second primary frequency level is different from the first primary frequency level and is greater than zero; and
    pulsing a frequency of the secondary RF signal between a first secondary frequency level during the first state and a second secondary frequency level during the second state, wherein the first secondary frequency level is greater than zero, wherein the second secondary frequency level is different from the first secondary frequency level and is greater than zero, wherein the frequency of the primary RF signal is less than the frequency of the secondary RF signal; and
    supplying the primary and secondary RF signals to a first impedance matching network that is coupled to an upper electrode of a plasma chamber.

2. The method of claim 1, further comprising:
    supplying a bias RF signal to a second impedance matching network that is coupled to a lower electrode of the plasma chamber, wherein the bias RF signal is a continuous wave signal.

3. The method of claim 1, wherein said pulsing the frequency of the primary RF signal includes modifying the first primary frequency level of the primary RF signal at a first transition time to the second primary frequency level and modifying the secondary primary frequency level of the primary RF signal at a second transition time to the first primary frequency level, wherein said pulsing the frequency of the secondary RF signal includes modifying the first secondary frequency level of the secondary RF signal at the first transition time to the second secondary frequency level and modifying the second secondary frequency level of the secondary RF signal at the second transition time to the first secondary frequency level.

4. The method of claim 3, wherein said pulsing the frequency of the primary RF signal includes maintaining the first primary frequency level during the first state and maintaining the second primary frequency level during the second state, wherein said pulsing the frequency of the secondary RF signal includes maintaining the first secondary frequency level during the first state and maintaining the second secondary frequency level during the second state.

5. The method of claim 1, wherein the second secondary frequency level is greater than the first secondary frequency level.

6. The method of claim 1, wherein the second primary frequency level is greater than the first primary frequency level.

7. The method of claim 1, further comprising:
    pulsing power of the primary RF signal between a first primary power level associated with the first state and a second primary power level associated with the second state, wherein the second primary power level is different from the first primary power level; and
    pulsing power of the secondary RF signal between a first secondary power level associated with the first state and a second secondary power level associated with the second state, wherein the second secondary power level is different from the first secondary power level.

8. A system for pulsing a primary radio frequency (RF) signal and a secondary RF signal, comprising:
    a first RF generator configured to pulse a frequency of the primary RF signal between a first primary frequency level during a first state and a second primary frequency level during a second state, wherein the first primary frequency level is greater than zero, wherein the second primary frequency level is different from the first primary frequency level and is greater than zero; and a second RF generator configured to pulse a frequency of the secondary RF signal between a first secondary frequency level during the first state and a second secondary frequency level during the second state, wherein the first secondary frequency level is greater than zero, wherein the second secondary frequency level is different from the first secondary frequency level and is greater than zero, wherein the frequency of the primary RF signal is less than the frequency of the secondary RF signal, wherein the first and second RF generators are configured to be coupled to a first impedance matching network coupled to an upper electrode of a plasma chamber to supply the primary and secondary RF signals to the first impedance matching network.

9. The system of claim 8,
wherein the first RF generator includes a first RF power supply that is configured to supply the primary RF signal to the first impedance matching network, and
wherein the second RF generator includes a second RF power supply that is configured to supply the secondary RF signal.

10. The system of claim 9, further comprising:
a third radio frequency generator having a third RF power supply that is configured to supply a bias RF signal to a second impedance matching network, wherein the second impedance matching is configured to be coupled to a lower electrode of the plasma chamber, wherein the bias RF signal is a continuous wave signal.

11. The system of claim 8, wherein to pulse the frequency of the primary RF signal, the primary RF generator is configured to modify the first primary frequency level of the primary RF signal at a first transition time to the second primary frequency level and modify the secondary primary frequency level of the primary RF signal at a second transition time to the first primary frequency level, wherein to pulse the frequency of the secondary RF signal, the secondary RF generator is configured to modify the first secondary frequency level of the secondary RF signal at the first transition time to the second secondary frequency level and modify the second secondary frequency level of the secondary RF signal at the second transition time to the first secondary frequency level.

12. The system of claim 11, wherein to pulse the frequency of the primary RF signal, the primary RF generator is configured to maintain the first primary frequency level during the first state and maintain the second primary frequency level during the second state, wherein to pulse the frequency of the secondary RF signal, the secondary RF generator is configured to maintain the first secondary frequency level during the first state and maintaining the second secondary frequency level during the second state.

13. The system of claim 8, wherein the second secondary frequency level is greater than the first secondary frequency level.

14. The system of claim 8, wherein the second primary frequency level is greater than the first primary frequency level.

15. The system of claim 8,
wherein the first RF generator is configured to pulse power of the primary RF signal between a first primary power level associated with the first state and a second primary power level associated with the second state, wherein the second primary power level is different from the first primary power level, and
wherein the second RF generator is configured to pulse power of the secondary RF signal between a first secondary power level associated with the first state and a second secondary power level associated with the second state, wherein the second secondary power level is different from the first secondary power level.

16. A system for pulsing a primary radio frequency (RF) signal and a secondary RF signal, comprising:
one or more primary controllers configured to control a primary RF power supply to generate a frequency of the primary RF signal, wherein the frequency of the primary RF signal pulses between a first primary frequency level during a first state and a second primary frequency level during a second state, wherein the second primary frequency level is different from the first primary frequency level and is greater than zero, wherein the primary RF signal is to be supplied to a first impedance matching network that is coupled to an upper electrode of a plasma chamber; and one or more secondary controllers configured to control a secondary RF power supply to generate a frequency of the secondary RF signal, wherein the frequency of the secondary RF signal pulses between a first secondary frequency level during the first state and a second secondary frequency level during the second state, wherein the first secondary frequency level is greater than zero, wherein the second secondary frequency level is different from the first secondary frequency level and is greater than zero, wherein the frequency of the primary RF signal is less than the frequency of the secondary RF signal, wherein the secondary RF signal is to be supplied to the first impedance matching network.

17. The system of claim 16, further comprising:
one or more bias controllers configured to control a bias RF power supply to generate a bias RF signal, wherein the bias RF signal is a continuous wave signal.

18. The system of claim 16, wherein to pulse the frequency of the primary RF signal, the one or more primary RF controllers are configured to modify the first primary frequency level of the primary RF signal at a first transition time to the second primary frequency level and modify the secondary primary frequency level of the primary RF signal at a second transition time to the first primary frequency level, wherein to pulse the frequency of the secondary RF signal, the one or more secondary RF controllers are configured to modify the first secondary frequency level of the secondary RF signal at the first transition time to the second secondary frequency level and modify the second secondary frequency level of the secondary RF signal at the second transition time to the first secondary frequency level.

* * * * *